United States Patent [19]
Nishi et al.

[11] Patent Number: 6,027,854
[45] Date of Patent: Feb. 22, 2000

[54] POLYMERS CHEMICALLY AMPLIFIED POSITIVE RESIST COMPOSITIONS, AND PATTERNING METHOD

[75] Inventors: Tsunehiro Nishi; Osamu Watanabe; Satoshi Watanabe; Shigehiro Nagura; Toshinobu Ishihara, all of Niigata-ken, Japan

[73] Assignee: Shin-Etsu Chemical Co., Ltd.

[21] Appl. No.: 09/031,560

[22] Filed: Feb. 27, 1998

[30] Foreign Application Priority Data

Feb. 28, 1997 [JP] Japan .................................. 9-062387

[51] Int. Cl.$^7$ .................................................. G03F 7/004
[52] U.S. Cl. ...................... 430/270.1; 430/905; 430/325; 430/326; 430/330; 526/313
[58] Field of Search ................................ 430/270.1, 905, 430/325; 526/313

[56] References Cited

U.S. PATENT DOCUMENTS

| 4,845,008 | 7/1989 | Nishioka et al. | 430/193 |
| 5,712,078 | 1/1998 | Huang et al. | 430/270.1 |

FOREIGN PATENT DOCUMENTS

| A 115440 | 5/1987 | Japan . |
| A 27829 | 2/1988 | Japan . |
| A 223858 | 11/1991 | Japan . |
| A 2112558 | 8/1992 | Japan . |
| A 100488 | 4/1994 | Japan . |
| B 27660 | 1/1997 | Japan . |

OTHER PUBLICATIONS

JP 6100488—English abstract.
JP 9027660—English abstract.
JP 63027829—English abstract.
JP 62115440—English abstract.
JP 3223858—English abstract.
JP 4211258—English abstract.

*Primary Examiner*—John S. Chu
*Attorney, Agent, or Firm*—Millen, White, Zelano & Branigan, P.C.

[57] ABSTRACT

A polymer comprising recurring units of formula (1) is provided wherein some hydrogen atoms of phenolic hydroxyl groups and/or alcoholic hydroxyl groups and/or carboxyl groups are replaced by acid labile groups. The polymer is crosslinked with a crosslinking group having a C—O—C linkage resulting from reaction of some of the remaining alcoholic hydroxyl groups and/or carboxyl groups with an alkenyl ether compound or halogenated alkyl ether compound. The amount of the acid labile group and the crosslinking group combined is on the average from more than 0 mol % to 80 mol % of the entirety of the phenolic hydroxyl group, alcoholic hydroxyl group and carboxyl group. The polymer has Mw of 1,000–500,000.

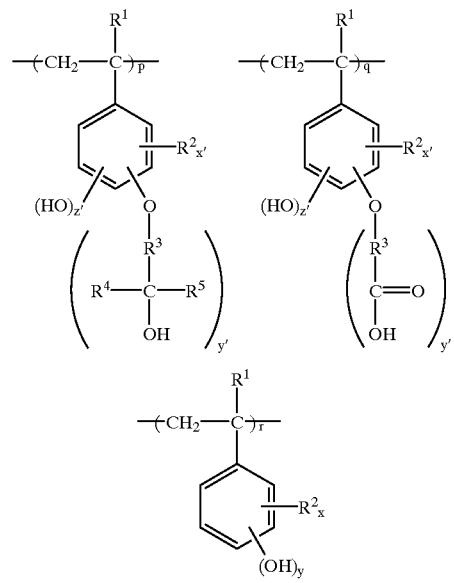

(1)

$R^1$ is H or methyl, $R^2$ is $C_1$–$C_8$ alkyl, $R^3$ is a divalent $C_1$–$C_{18}$ hydrocarbon group which may have a hetero atom, $R^4$ and $R^5$ are H or monovalent $C_1$–$C_{18}$ hydrocarbon groups which may have a hetero atom, x and y are integers satisfying $x+y \leq 5$, x', y' and z' are integers satisfying $x'+y'+z' \leq 5$, p, q and r are numbers satisfying $0 \leq p \leq 0.4$, $0 \leq q \leq 0.4$, $0.01 \leq p+q \leq 0.8$, and $p+q+r=1$. A chemically amplified positive resist composition comprising the polymer as a base resin has high sensitivity, high resolution, a wide latitude of exposure, and process adaptability and forms resist patterns having plasma etching resistance and heat resistance.

13 Claims, No Drawings

POLYMERS CHEMICALLY AMPLIFIED POSITIVE RESIST COMPOSITIONS, AND PATTERNING METHOD

BACKGROUND OF THE INVENTION

1. Field of the Invention

This invention relates to a polymer having acid labile groups of at least one type and crosslinked with a crosslinking group having a C—O—C linkage within a molecule and/or between molecules. It also relates to a chemically amplified positive resist composition comprising the polymer as a base resin which has a high alkali dissolution contrast before and after exposure, high sensitivity and high resolution and is thus suitable as a fine pattern forming material for use in the manufacture of ultra-LSIs. It further relates to a method for forming a resist pattern using the composition.

2. Prior Art

As the LSI technology tends toward higher integration and higher speed, further refinement of pattern rules is required. Under such circumstances, deep-ultraviolet lithography is regarded promising as the next generation of fine patterning technology. The deep-UV lithography is capable of working on the order of 0.5 μm or less and makes it possible to form a resist pattern having a side wall nearly perpendicular to the substrate if a less light absorbing resist material is used.

A number of chemically amplified positive working resist materials using acid catalysts were recently developed as disclosed in JP-B 27660/1990, JP-A 27829/1988, U.S. Pat. Nos. 4,491,628 and 5,310,619. They utilize a high illuminance KrF excimer laser as a deep-UV source. Since these materials have high sensitivity, resolution and dry etching resistance, they are promising as resist materials especially suited for deep-UV lithography.

The chemically amplified, positive resist materials being known include those of the two-component system comprising a base resin and a photoacid generator and those of the three-component system comprising a base resin, a photoacid generator, and a dissolution inhibitor having an acid labile group.

JP-A 115440/1987 discloses a resist composition comprising poly-4-tert-butoxystyrene and a photoacid generator. Similarly, JP-A 223858/1991 discloses a two-component system resist composition comprising a resin having a tert-butoxy group in its molecule and a photoacid generator and JP-A 211258/1992 discloses a two-component system resist composition comprising a polyhydroxystyrene containing a methyl, isopropyl, tert-butyl, tetrahydropyranyl or trimethylsilyl group in its molecule and a photoacid generator.

Furthermore, JP-A 100488/1994 proposes a resist composition comprising a polydihydroxystyrene derivative such as poly[3,4-bis(2-tetrahydropyranyloxy)styrene], poly[3,4-bis(tert-butoxycarbonyloxy)styrene], and poly[3,5-bis(2-tetrahydropyranyloxy)styrene] and a photoacid generator.

The base resins used in these resist compositions have an acid labile group in a side chain. If the acid labile group is a strong acid-decomposable one such as a tert-butyl and tert-butoxycarbonyl group, the acid labile group is deactivated through reaction with air-borne basic compounds and becomes unlikely to decompose. Such a resist composition tends to form a pattern having a T-top profile. On the other hand, if the acid labile group is an alkoxyalkyl group such as ethoxyethyl which is decomposable with weak acid, the resist composition is little affected by air-borne basic compounds, but forms a pattern which will become extremely thin with the lapse of time from exposure to heat treatment. The inclusion of a bulky group in a side chain can detract from heat resistance. The composition is less satisfactory in sensitivity and resolution. None of the resist compositions thus far proposed are practically satisfactory. There is a desire to overcome these problems.

SUMMARY OF THE INVENTION

Therefore, an object of the invention is to provide a novel and improved polymer suitable as a base resin of a chemically amplified positive resist composition. Another object of the invention is to provide a chemically amplified positive resist composition comprising the polymer as a base resin which has superior sensitivity, resolution, exposure latitude, process adaptability, and plasma etching resistance to conventional resist compositions and forms a resist pattern having heat resistance.

We have found that a novel polymer bearing acid labile groups of at least one type, crosslinked within a molecule and/or between molecules with crosslinking groups having a C—O—C linkage, and having a weight average molecular weight of 1,000 to 500,000 can be produced by a method to be described later and is useful as a base resin. By blending this novel polymer as a base resin with a photoacid generator and optionally, a dissolution regulator and a basic compound, there is obtained a chemically amplified positive resist composition which is improved in that the dissolution contrast of a resist film is increased, especially a dissolution rate after exposure is increased. By further blending an aromatic compound having a group ≡C—COOH in a molecule, there is obtained a chemically amplified positive resist composition which is improved in that the resist is improved in PED stability and edge roughness on a nitride film substrate is improved. Since the resist composition is improved in resolution, latitude of exposure, and process adaptability, it is well suited for practical use and advantageously used in precise fine patterning, especially in ultra-LSI manufacture.

In a first aspect, the present invention provides a polymer comprising recurring units of the following general formula (1):

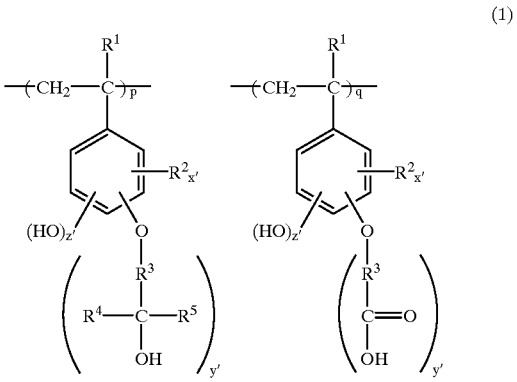

-continued

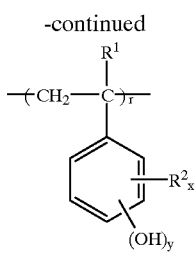

wherein $R^1$ is hydrogen or methyl, $R^2$ is a normal, branched or cyclic alkyl group of 1 to 8 carbon atoms, $R^3$ is a divalent hydrocarbon group of 1 to 18 carbon atoms which may have a hetero atom, each of $R^4$ and $R^5$ is hydrogen or a monovalent hydrocarbon group of 1 to 18 carbon atoms which may have a hetero atom, letter x is 0 or a positive integer, y is a positive integer, the sum of x+y is up to 5, each of x' and z' is 0 or a positive integer, y' is a positive integer, the sum of x'+y'+z' is up to 5, each of p and q is 0 or a positive number, r is a positive number, p and q are not equal to 0 at the same time, satisfying $0 \leq p \leq 0.4$, $0 \leq q \leq 0.4$, $0.01 \leq p+q \leq 0.8$, and p+q+r=1. The hydrogen atoms of some of phenolic hydroxyl groups and/or alcoholic hydroxyl groups and/or carboxyl groups are replaced by acid labile groups; the polymer is crosslinked within a molecule and/or between molecules with a crosslinking group having a C—O—C linkage resulting from reaction of some of the remaining alcoholic hydroxyl groups and/or carboxyl groups with an alkenyl ether compound or halogenated alkyl ether compound; the amount of the acid labile group and the crosslinking group combined is on the average from more than 0 mol % to 80 mol % of the entirety of the phenolic hydroxyl group, alcoholic hydroxyl group and carboxyl group in formula (1). The polymer has a weight average molecular weight of 1,000 to 500,000, In one preferred embodiment, the polymer is comprised of recurring units of the following general formula (2):

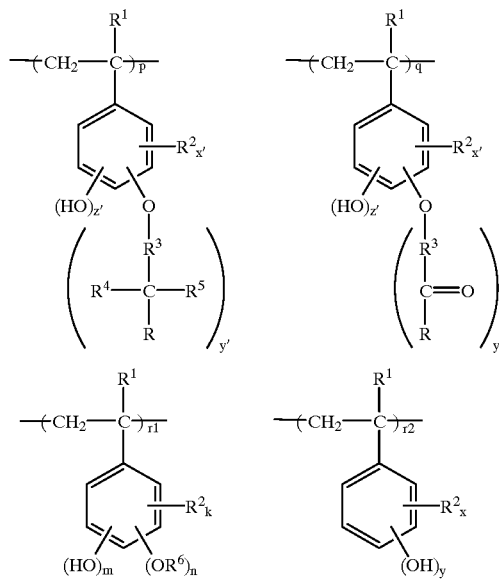

(2)

wherein R is a hydroxyl group or $OR^6$, at least one of R groups is a hydroxyl group, $R^1$ is hydrogen or methyl, $R^2$ is a normal, branched or cyclic alkyl group of 1 to 8 carbon atoms, $R^3$ is a divalent hydrocarbon group of 1 to 18 carbon atoms which may have a hetero atom, each of $R^4$ and $R^5$ is hydrogen or a monovalent hydrocarbon group of 1 to 18 carbon atoms which may have a hetero atom, $R^6$ is an acid labile group, letter x is 0 or a positive integer, y is a positive integer, the sum of x+y is up to 5, each of x' and z' is 0 or a positive integer, y' is a positive integer, the sum of x'+y'+z' is up to 5, each of k and m is 0 or a positive integer, n is a positive integer, the sum of k+m+n is up to 5, each of p and q is 0 or a positive number, r1 and r2 are positive numbers, p and q are not equal to 0 at the same time, satisfying $0 \leq p \leq 0.4$, $0 \leq q \leq 0.4$, $0.01 \leq p+q \leq 0.8$, $0 \leq r1/(r1+r2) \leq 0.8$, and p+q+r1+r2=1. The polymer is crosslinked within a molecule and/or between molecules with a crosslinking group having a C—O—C linkage resulting from reaction of some of the alcoholic hydroxyl groups and/or carboxyl groups represented by R with an alkenyl ether compound or halogenated alkyl ether compound; the amount of the acid labile group and the crosslinking group combined is on the average from more than 0 mol % to 80 mol % of the entirety of the phenolic hydroxyl group, alcoholic hydroxyl group and carboxyl group in formula (1); and the polymer has a weight average molecular weight of 1,000 to 500,000.

In a further preferred embodiment, the polymer is comprised of recurring units of the following general formula (3):

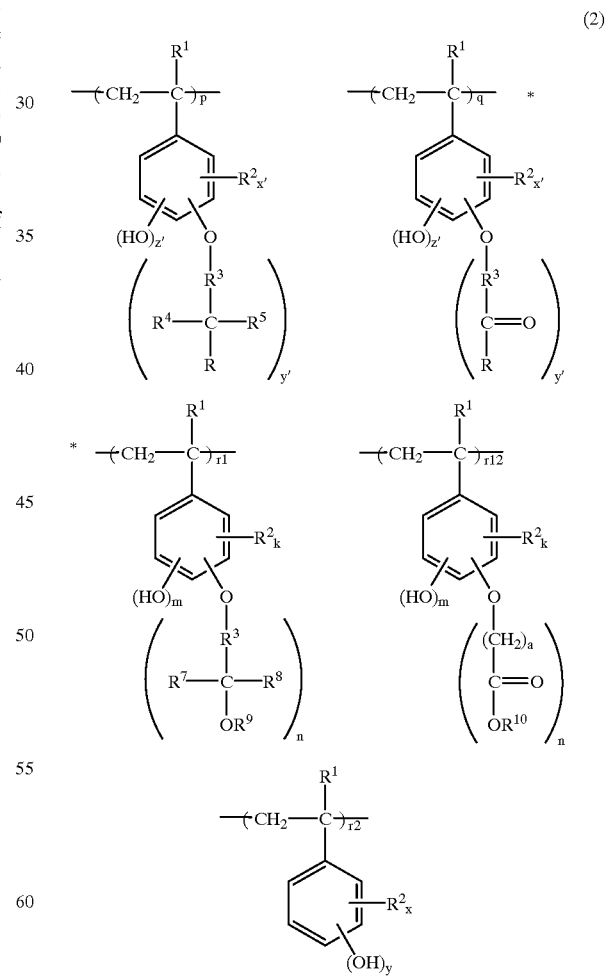

(2)

wherein R is a hydroxyl group or $OR^6$, at least one of R groups is a hydroxyl group, $R^1$ is hydrogen or methyl, $R^2$ is a normal, branched or cyclic alkyl group of 1 to 8 carbon atoms, $R^3$ is a divalent hydrocarbon group of 1 to 18 carbon atoms which may have a hetero atom, each of $R^4$ and $R^5$ is hydrogen or a monovalent hydrocarbon group of 1 to 18 carbon atoms which may have a hetero atom, $R^6$ is an acid labile group, each of $R^7$ and $R^8$ is hydrogen or a normal, branched or cyclic alkyl group of 1 to 8 carbon atoms, $R^9$ is a monovalent hydrocarbon group of 1 to 18 carbon atoms which may have a hetero atom, or $R^7$ and R8, $R^7$ and $R^9$, or $R^8$ and $R^9$, taken together, may form a ring, with the proviso that each of $R^7$, $R^8$ and $R^9$ is a normal or branched alkylene group of 1 to 18 carbon atoms when they form a ring, $R^{10}$ is a tertiary alkyl group of 4 to 20 carbon atoms, a trialkylsilyl group whose alkyl groups each have 1 to 6 carbon atoms, an oxoalkyl group of 4 to 20 carbon atoms, or a group —$CR^7R^8OR^9$, letters p, q, r11 and r12 are 0 or positive numbers, r2 is a positive number, p and q are not equal to 0 at the same time, r11 and r12 are not equal to 0 at the same time, satisfying $0 \leq p \leq 0.4$, $0 \leq q \leq 0.4$, $0.01 \leq p+q \leq 0.8$, $0 \leq (r11+r12)/(r11+r12+r2) \leq 0.8$, and $p+q+r11+r12+r2=1$, a is 0 or an integer of 1 to 6, x, y, x', y', z', k, m and n are as defined above,

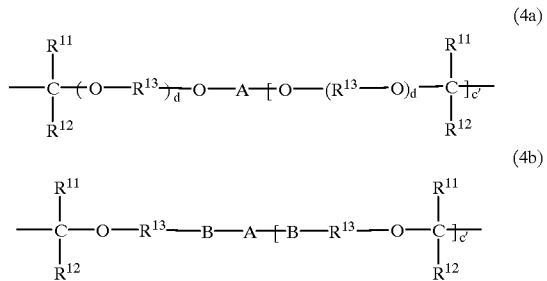

wherein each of $R^{11}$ and $R^{12}$ is hydrogen or a normal, branched or cyclic alkyl group of 1 to 8 carbon atoms, or $R^{11}$ and $R^{12}$, taken together, may form a ring, with the proviso that each of $R^{11}$ and $R^{12}$ is a normal or branched alkylene group of 1 to 8 carbon atoms when they form a ring, $R^{13}$ is a normal, branched or cyclic alkylene group of 1 to 10 carbon atoms, letter d is 0 or an integer of 1 to 10, A is a c-valent aliphatic or alicyclic saturated hydrocarbon group, aromatic hydrocarbon group or heterocyclic group of 1 to 50 carbon atoms, which may have an intervening hetero atom and in which the hydrogen atom attached to a carbon atom may be partially replaced by a hydroxyl group, carboxyl group, acyl group or fluorine atom, B is —CO—O—, —NHCO—O— or —NHCONH—, letter c is an integer of 2 to 8, and c' is an integer of 1 to 7. Some hydrogen atoms being eliminated from alcoholic hydroxyl groups and/or carboxyl groups represented by R to leave oxygen atoms which are crosslinked with a crosslinking group having a C—O—C linkage of the following general formula (4a) or (4b) within a molecule and/or between molecules; the amount of the acid labile group and the crosslinking group combined is on the average from more than 0 mol % to 80 mol % of the entirety of the phenolic hydroxyl group, alcoholic hydroxyl group and carboxyl group in formula (1); and the polymer has a weight average molecular weight of 1,000 to 500,000.

Further preferably, the crosslinking group having a C—O—C linkage represented by the general formula (4a) or (4b) is represented by the following general formula (4a') or (4b'):

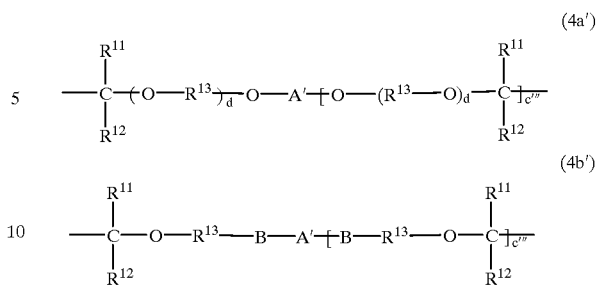

wherein each of $R^{11}$ and $R^{12}$ is hydrogen or a normal, branched or cyclic alkyl group of 1 to 8 carbon atoms, or $R^{11}$ and $R^{12}$, taken together, may form a ring, with the proviso that each of $R^{11}$ and $R^{12}$ is a normal or branched alkylene group of 1 to 8 carbon atoms when they form a ring, $R^{13}$ is a normal, branched or cyclic alkylene group of 1 to 10 carbon atoms, letter d is 0 or an integer of 1 to 5, A' is a c"-valent normal, branched or cyclic alkylene, alkyltriyl or alkyltetrayl group of 1 to 20 carbon atoms or an arylene group of 6 to 30 carbon atoms, which may have an intervening hetero atom and in which the hydrogen atom attached to a carbon atom may be partially replaced by a hydroxyl group, carboxyl group, acyl group or fluorine atom, B is —CO—O—, —NHCO—O— or —NHCONH—, letter c" is an integer of 2 to 4, and c'" is an integer of 1 to 3.

In a second aspect, the present invention provides a chemically amplified positive resist composition comprising (A) an organic solvent, (B) a base resin in the form of the polymer of any one of claims 1 to 4, and (C) a photoacid generator.

The resist composition may further contain (D) another base resin in the form of a polymer comprising recurring units of the following general formula (1'), the hydrogen atoms of some of phenolic hydroxyl groups and/or alcoholic hydroxyl groups and/or carboxyl groups being replaced by acid labile groups in an average proportion of 0 mol % to 80 mol % of the entirety, said polymer having a weight average molecular weight of 3,000 to 300,000,

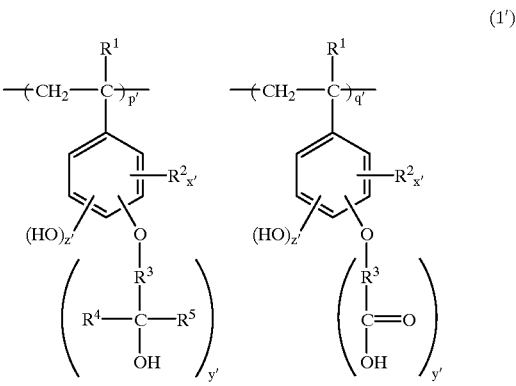

-continued

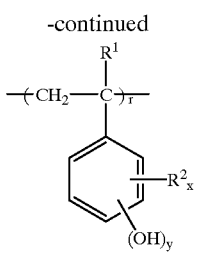

wherein $R^1$, $R^2$, $R^3$, $R^4$, $R^5$, x, y, x', y' and z' are as defined above, p' and q' are 0 or positive numbers, r is a positive number, p' and q' may be equal to 0 at the same time, satisfying $0 \leq p \leq 0.4$, $0 \leq q' \leq 0.4$, $0 \leq p'+q' \leq 0.8$, and $p'+q'+r=1$.

The resist composition may further contain (E) a dissolution regulator, (F) a basic compound, (G) an aromatic compound having a group: $\equiv$C—COOH in a molecule, (H) a UV absorber, and/or (I) an acetylene alcohol derivative.

Also contemplated herein is method for forming a resist pattern comprising the steps of:
(i) applying a chemically amplified positive resist composition according to any one of claims 5 to 11 onto a substrate,
(ii) heat treating the coated film and then exposing it to actinic radiation having a wavelength of up to 300 nm or electron beams through a photomask, and
(iii) optionally heat treating the exposed film and developing it with a developer.

When the polymer defined above is blended in a resist composition as a base resin, advantages of a significant dissolution inhibitory effect and a greater dissolution contrast after exposure are obtained especially by virtue of the crosslinking through crosslinking groups having a C—O—C linkage.

In the case of a polymer having an alkoxyalkyl group attached simply to a side chain, formation of a T-top profile is avoided because deblocking reaction takes place with weak acid. However, since that polymer is sensitive to acid, the pattern configuration is significantly thinned with the lapse of time from exposure to heat treatment. Since the alkali dissolution inhibitory effect is low, a high substitution product must be used to insure dissolution contrast at the sacrifice of heat resistance. On the other hand, a polymer wherein a phenolic hydroxyl group on a side chain is protected with a tert-butoxycarbonyl group, when blended in a resist material, has the advantages that the, alkali dissolution inhibitory effect is improved, a high dissolution contrast is obtained with a low degree of substitution, and heat resistance is good. In order to eliminate the protective group to render the polymer alkali soluble, a photoacid generator capable of generating a strong acid such as trifluoromethanesulfonic acid is necessary. The use of such acid leads to the undesirable tendency to form a T-top profile.

In contrast to these polymers, a polymer crosslinked within a molecule and/or between molecules with a crosslinking group having a C—O—C linkage as obtained by reacting some alcoholic hydroxyl groups and/or carboxyl groups with an alkenyl ether compound or halogenated alkyl ether compound is advantageous in that a resist composition having the crosslinked polymer blended therein overcomes the drawback of low heat resistance of a polymer having a side chain protected with an acetal group and the drawback of T-top profile forming tendency of a polymer protected with a tert-butoxycarbonyl group.

The polymer used in the chemically amplified positive resist composition according to the invention has further advantages. Since the inventive polymer is crosslinked with a crosslinking group having an acid labile C—O—C linkage and protected with an acid labile group, unexposed areas of a resist film remain unchanged with respect to weight average molecular weight and solubility in alkaline developer whereas the weight average molecular weight of exposed areas is restored, through decomposition by the generated acid and further through elimination of the acid labile group, to the weight average molecular weight of alkali soluble base resin prior to the protection with the crosslinking and acid labile groups. Then the rate of alkali dissolution in the exposed areas is significantly increased as compared with the unexposed areas, resulting in an increased dissolution contrast. As a consequence, high resolution is achieved.

The polymer of the invention in which partially introduced alcoholic hydroxyl groups and/or carboxyl groups are selectively crosslinked has the advantage that by changing the number of alcoholic hydroxyl groups and/or carboxyl groups per molecule, the proportion of intramolecular crosslinking and intermolecular crosslinking can be properly adjusted so as to impart optimum rates of dissolution to exposed and unexposed areas.

More specifically, a chemically amplified positive resist composition using the inventive polymer as a base resin minimizes the problems of T-top profile forming tendency, pattern configuration thinning and low heat resistance found in the prior art and increases the dissolution contrast of a resist film. As a consequence, the chemically amplified positive resist composition has high sensitivity, high resolution, allows the size and configuration of a pattern to be controlled in terms of composition, and offers improved process adaptability.

DETAILED DESCRIPTION OF THE INVENTION

Polymer

The novel polymer of the present invention is a high molecular weight compound which has at least one type of acid labile group, is crosslinked within a molecule and/or between molecules with a crosslinking group having a C—O—C linkage, and has a weight average molecular weight of 1,000 to 500,000.

Specifically, the inventive polymer is a polymer comprising recurring units of the following general formula (1), wherein the hydrogen atoms of some groups of at least one type selected from among phenolic hydroxyl groups, alcoholic hydroxyl groups and carboxyl groups are partially replaced by acid labile groups. The polymer is crosslinked within a molecule and/or between molecules with crosslinking groups having a C—O—C linkage resulting from reaction of some of the remaining alcoholic hydroxyl groups and/or carboxyl groups with an alkenyl ether compound or halogenated alkyl ether compound.

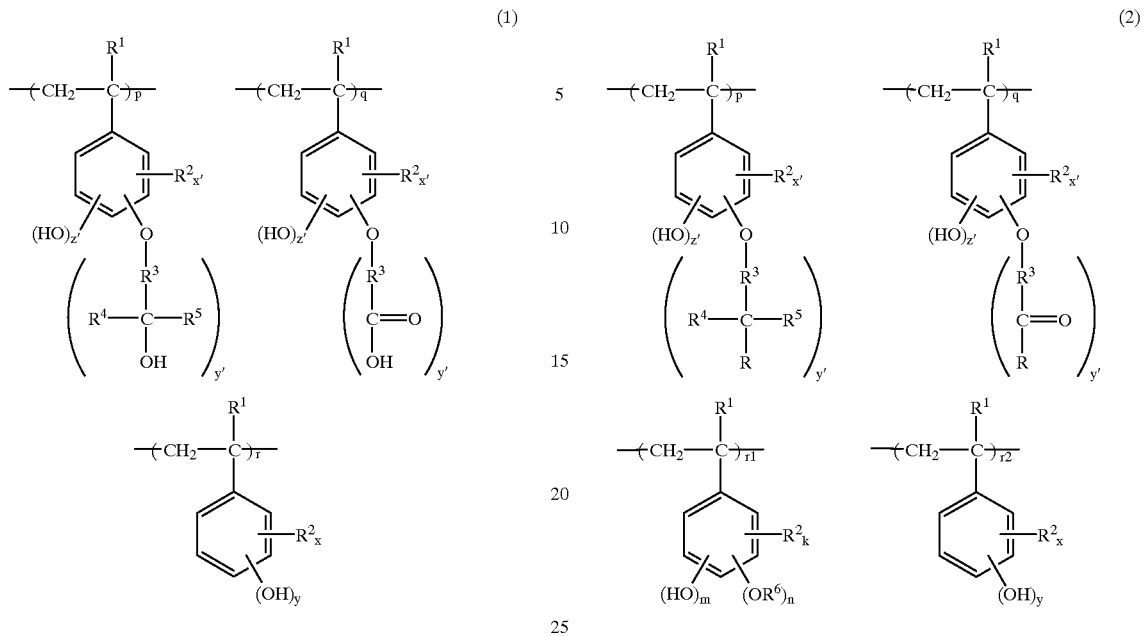

In formula (1), $R^1$ is a hydrogen atom or a methyl group. $R^2$ is a normal, branched or cyclic alkyl group of 1 to 8 carbon atoms, preferably 1 to 5 carbon atom, more preferably 1 to 3 carbon atoms. Examples of the normal, branched or cyclic alkyl group include methyl, ethyl, propyl, isopropyl, n-butyl, isobutyl, tert-butyl, cyclohexyl and cyclopentyl. $R^3$ is a divalent hydrocarbon group of 1 to 18 carbon atoms, preferably 1 to 12 carbon atom, more preferably 1 to 8 carbon atoms, which may have a hetero atom. Examples include normal, branched or cyclic alkylene, arylene, arylene-bearing alkylene, and alkylene-bearing arylene groups, while they may be oxygen atom-containing groups such as alkoxyalkylene groups. Each of $R^4$ and $R^5$ is a hydrogen atom or a monovalent hydrocarbon group of 1 to 18 carbon atoms, preferably 1 to 12 carbon atom, more preferably 1 to 8 carbon atoms, which may have a hetero atom. Examples include normal, branched or cyclic alkyl, aryl, aryl-bearing alkyl, and alkyl-bearing aryl groups, while they may be oxygen atom-containing groups such as alkoxyalkyl groups. Letter x is 0 or a positive integer, y is a positive integer, the sum of x+y is up to 5, and preferably y is 1 to 3, especially 1 to 2. Letters x' and z' are 0 or positive integers, y' is a positive integer, the sum of x'+y'+z' is up to 5, and preferably y' is 1 to 3, especially 1 to 2. Letters p and q are 0 or positive numbers, r is a positive number, p and q are not equal to 0 at the same time, and they satisfy $0 \leq p \leq 0.4$, $0 \leq q \leq 0.4$, $0.01 \leq p+q \leq 0.8$, and $p+q+r=1$.

More particularly, the inventive polymer is a polymer comprising recurring units of the following general formula (2), which is crosslinked within a molecule and/or between molecules with a crosslinking group having a C—O—C linkage resulting from reaction of some of the alcoholic hydroxyl groups and/or carboxyl groups represented by R with an alkenyl ether compound or halogenated alkyl ether compound.

In formula (2), R is a hydroxyl group or $OR^6$, and at least one of R groups is a hydroxyl group. $R^1$ is a hydrogen atom or a methyl group. $R^2$ is a normal, branched or cyclic alkyl group of 1 to 8 carbon atoms. $R^3$ is a divalent hydrocarbon group of 1 to 18 carbon atoms which may have a hetero atom. Each of $R^4$ and $R^5$ is a hydrogen atom or a monovalent hydrocarbon group of 1 to 18 carbon atoms which may have a hetero atom. $R^6$ is an acid labile group. Letter x is 0 or a positive integer, y is a positive integer, and the sum of x+y is up to 5. Each of x' and z' is 0 or a positive integer, y' is a positive integer, and the sum of x'+y'+z' is up to 5. Each of k and m is 0 or a positive integer, n is a positive integer, and the sum of k+m+n is up to 5. Each of p and q is 0 or a positive number, r1 and r2 are positive numbers, p and q are not equal to 0 at the same time, satisfying $0 \leq p \leq 0.4$, $0 \leq q \leq 0.4$, $0.01 \leq p+q \leq 0.8$, $0 \leq r1/(r1+r2) \leq 0.8$, and $p+q+r1+r2=1$. It is noted that $r1+r2=r$ wherein r is as defined above.

Illustrative examples of $R^1$, $R^2$, $R^3$, $R^4$, and $R^5$ and the preferred ranges of y and y' are as described above in connection with formula (1). Preferably, n is equal to 1, 2 or 3 and m is equal to 0 or 1.

The acid labile group which substitutes for the hydrogen atom of a phenolic hydroxyl group, alcoholic hydroxyl group or carboxyl group or which is represented by $R^6$ may be selected from a variety of acid labile groups, preferably from groups of the following formulae (5) and (6), tert-alkyl groups of 4 to 20 carbon atoms, trialkyl-silyl groups whose alkyl groups each have 1 to 6 carbon atoms, and oxoalkyl groups of 4 to 20 carbon atoms.

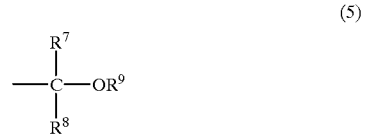

(5)

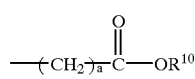

(6)

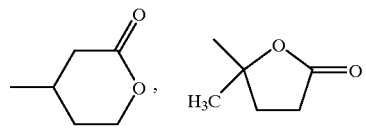

In formulae (5) and (6), $R^7$ and $R^8$ each are a hydrogen atom or normal, branched or cyclic alkyl group having 1 to 8 carbon atoms, preferably 1 to 6 carbon atoms, more preferably 1 to 5 carbon atoms. $R^9$ is a monovalent hydrocarbon group of 1 to 18 carbon atoms, preferably 1 to 12 carbon atoms, more preferably 1 to 8 carbon atoms, which may have a hetero atom. Alternatively, $R^7$ and $R^8$, $R^7$ and $R^9$, or $R^8$ and $R^9$, taken together, may form a ring, with the proviso that $R^7$, $R^8$ and $R^9$ each are a normal or branched alkylene group having 1 to 18 carbon atoms, preferably 1 to 12 carbon atoms, more preferably 1 to 8 carbon atoms, when they form a ring. $R^{10}$ is a tertiary alkyl group having 4 to 20 carbon atoms, preferably 4 to 15 carbon atoms, more preferably 4 to 10 carbon atoms, a trialkylsilyl group whose alkyl groups each have 1 to 6 carbon atoms, an oxoalkyl group of 4 to 20 carbon atoms, preferably 4 to 15 carbon atoms, more preferably 4 to 10 carbon atoms, or a group of formula (5). Letter a is an integer of 0 to 6.

Examples of the normal, branched or cyclic alkyl group of 1 to 8 carbon atoms represented by $R^7$ and $R^8$ are as described for $R^2$.

Examples of the monovalent hydrocarbon groups of 1 to 18 carbon atoms, which may have a hetero atom, represented by $R^4$, $R^5$ and $R^9$ include normal, branched or cyclic alkyl groups, substituted or unsubstituted aryl groups such as phenyl, p-methylphenyl, p-ethylphenyl, and alkoxyphenyl groups (e.g., p-methoxyphenyl), and aralkyl groups such as benzyl and phenethyl, as well as modified ones of these groups, for example, alkyl groups in which an oxygen atom intervenes, the hydrogen atom attached to a carbon atom is replaced by a hydroxyl group, or two hydrogen atoms are replaced by an oxygen atom to form a carbonyl group, as shown below.

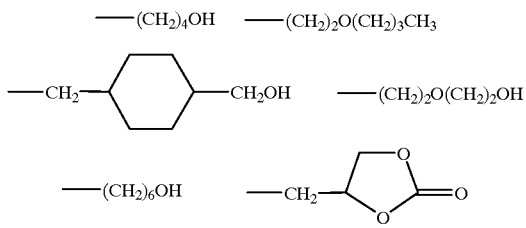

Examples of the divalent hydrocarbon groups of 1 to 18 carbon atoms, which may have a hetero atom, represented by $R^3$ include those obtained by eliminating one hydrogen atom from the above-mentioned monovalent hydrocarbon groups of 1 to 18 carbon atoms.

Examples of the tertiary alkyl group of 4 to 20 carbon atoms represented by $R^{10}$ include tert-butyl, 1-methylcyclohexyl, 2-(2-methyl)adamantyl and tert-amyl groups.

Examples of the trialkylsilyl group whose alkyl groups each have 1 to 6 carbon atoms, represented by $R^{10}$, include trimethylsilyl, triethylsilyl and dimethyl-tert-butyl groups. Examples of the oxoalkyl group of 4 to 20 carbon atoms, represented by $R^{10}$, include 3-oxocyclohexyl and groups of the following formulae.

Examples of the acid labile group of formula (5) include linear or branched acetal groups such as 1-methoxyethyl, 1-ethoxyethyl, 1-n-propoxyethyl, 1-isopropoxyethyl, 1-n-butoxyethyl, 1-isobutoxyethyl, 1-sec-butoxyethyl, 1-tert-butoxyethyl, 1-tert-amyloxyethyl, 1-cyclohexyloxyethyl, 1-methoxypropyl, 1-ethoxypropyl, 1-methoxy-1-methylethyl, and 1-ethoxy-1-methylethyl; and cyclic acetal groups such as 2-tetrahydrofuranyl and 2-tetrahydropyranyl, with the 1-ethoxyethyl, 1-n-butoxyethyl and 1-ethoxypropyl groups being preferred. Examples of the acid labile group of formula (6) include tert-butoxycarbonyl, tert-butoxycarbonylmethyl, tert-amyloxycarbonyl, tert-amyloxycarbonylmethyl, 1-ethoxyethoxycarbonylmethyl, 2-tetrahydropyranyloxycarbonylmethyl, and 2-tetrahydrofuranyloxycarbonylmethyl groups. Of the acid labile groups, the tertiary alkyl groups of 4 to 20 carbon atoms, trialkylsilyl groups whose alkyl groups each have 1 to 6 carbon atoms, and oxoalkyl groups of 4 to 20 carbon atoms are as described for $R^{10}$.

The crosslinking group having a C—O—C linkage is exemplified by groups of the following general formulae (4a) and (4b).

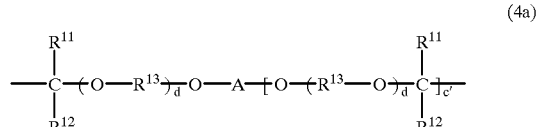

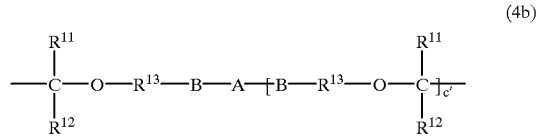

In these formulae, each of $R^{11}$ and $R^{12}$ is a hydrogen atom or a normal, branched or cyclic alkyl group of 1 to 8 carbon atoms. Alternatively, $R^{11}$ and $R^{12}$, taken together, may form a ring, with the proviso that each of $R^{11}$ and $R^{12}$ is a normal or branched alkylene group of 1 to 8 carbon atoms when they form a ring. $R^{13}$ is a normal, branched or cyclic alkylene group of 1 to 10 carbon atoms. Letter d is 0 or an integer of 1 to 10. A is a c-valent aliphatic or alicyclic saturated hydrocarbon group, aromatic hydrocarbon group or heterocyclic group of 1 to 50 carbon atoms, which may have an intervening hetero atom and in which the hydrogen atom attached to a carbon atom may be partially replaced by a hydroxyl group, carboxyl group, acyl group or fluorine atom. B is —CO—O—, —NHCO—O— or —NHCONH—. Letter c is an integer of 2 to 8, and c' is an integer of 1 to 7.

The normal, branched or cyclic alkyl groups of 1 to 8 carbon atoms are as exemplified above. Examples of the group represented by A are described later. These crosslinking groups of formulae (4a) and (4b) originate from alkenyl ether compounds and halogenated alkyl ether compounds to be described later. Examples of the normal, branched or cyclic alkylene group of 1 to 10 carbon atoms represented by $R^{13}$ include methylene group, ethylene group, propylene group, isopropylene group, n-butylene group, isobutylene group, cyclohexylene group and cyclopentylene group.

As understood from the value of c' in formula (4a) or (4b), the crosslinking group is not limited to a divalent one and trivalent to octavalent groups are acceptable. For example, the divalent crosslinking group is exemplified by groups of the following formulae (4a") and (4b") and the trivalent crosslinking group is exemplified by groups of the following formulae (4a'") and (4b'").

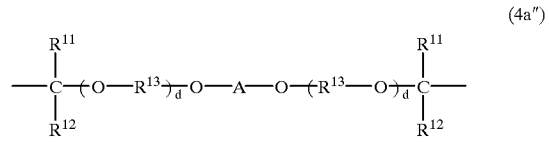
(4a")

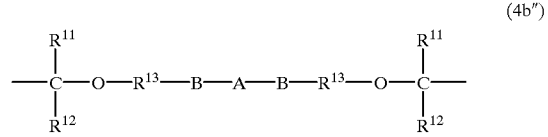
(4b")

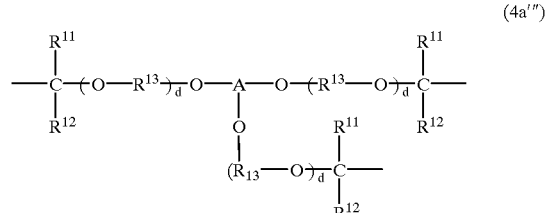
(4a'")

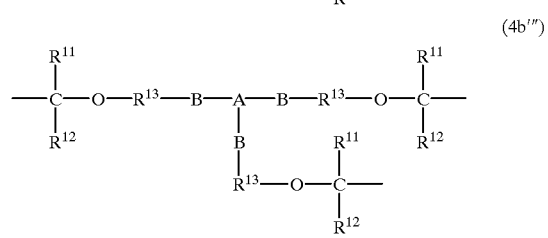
(4b'")

Preferred crosslinking groups are of the following formulae (4a') and (4b').

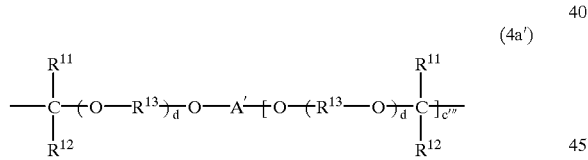
(4a')

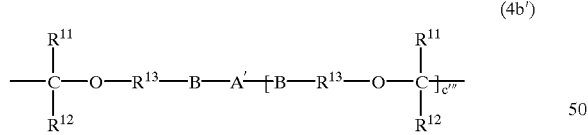
(4b')

In these formulae, $R^{11}$ and $R^{12}$ each are a hydrogen atom or a normal, branched or cyclic alkyl group of 1 to 8 carbon atoms, or $R^{11}$ and $R^{12}$, taken together, may form a ring, with the proviso that each of $R^{11}$ and $R^{12}$ is a normal or branched alkyl-one group of 1 to 8 carbon atoms when they form a ring. $R^{13}$ is a normal, branched or cyclic alkylene group of 1 to 10 carbon atoms. Letter d is 0 or an integer of 1 to 5. A' is a c"-valent normal or branched alkylene, alkyltriyl or alkyltetrayl group of 1 to 20 carbon atoms or an arylene group of 6 to 30 carbon atoms, which may have an intervening hetero atom and in which the hydrogen atom attached to a carbon atom may be partially replaced by a hydroxyl group, carboxyl group, acyl group or fluorine atom. B is —CO—O—, —NHCO—O— or —NHCONH—. Letter c" is an integer of 2 to 4, and c'" is an integer of 1 to 3.

More specifically, the inventive polymer is a polymer comprising recurring units of the following general formula (3), wherein some hydrogen atoms are eliminated from alcoholic hydroxyl groups and/or carboxyl groups represented by R to leave oxygen atoms which are crosslinked with a crosslinking group having a C—O—C linkage of the above formula (4a) or (4b) within a molecule and/or between molecules.

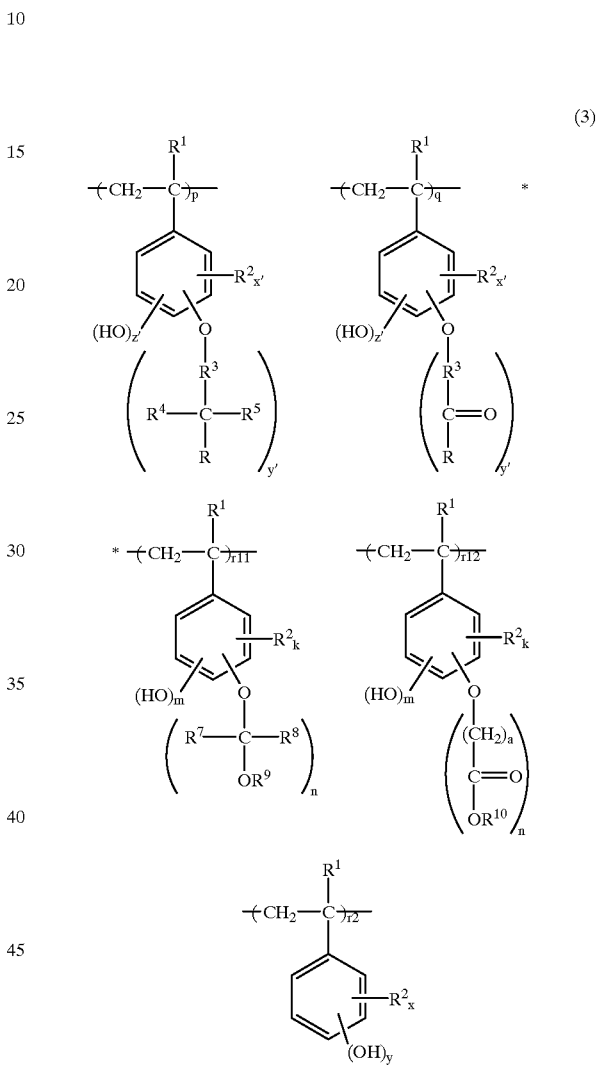
(3)

In formula (3), R is a hydroxyl group or $OR^6$, and at least one of R groups is a hydroxyl group. $R^1$ is a hydrogen atom or a methyl group. $R^2$ is a normal, branched or cyclic alkyl group of 1 to 8 carbon atoms. $R^3$ is a divalent hydrocarbon group of 1 to 18 carbon atoms which may have a hetero atom. Each of $R^4$ and $R^5$ is hydrogen or a monovalent hydrocarbon group of 1 to 18 carbon atoms which may have a hetero atom. $R^6$ is an acid labile group. Each of $R^7$ and $R^8$ is hydrogen or a normal, branched or cyclic alkyl group of 1 to 8 carbon atoms. $R^9$ is a monovalent hydrocarbon group of 1 to 18 carbon atoms which may have a hetero atom.

Alternatively, $R^7$ and $R^8$, $R^7$ and $R^9$, or $R^8$ and $R^9$, taken together, may form a ring, with the proviso that each of $R^7$, $R^8$ and $R^9$ is a normal or branched alkylene group of 1 to 18 carbon atoms when they form a ring. $R^{10}$ is a tertiary alkyl group of 4 to 20 carbon atoms, a trialkylsilyl group whose alkyl groups each have 1 to 6 carbon atoms, an oxoalkyl group of 4 to 20 carbon atoms, or a group —$CR^7R^8OR^9$. Letters p, q, r11 and r12 are 0 or positive numbers, r2 is a positive number, p and q are not equal to 0 at the same time, r11 and r12 are not equal to 0 at the same time, and they satisfy $0 \leq p \leq 0.4$, $0 \leq q \leq 0.4$, $0.01 \leq p+q \leq 0.8$, $0 \leq (r11+r12)/(r11+r12+r2) \leq 0.8$, and $p+q+r11+r12+r2=1$. Letter a is 0 or an integer of 1 to 6. Letters x, y, x', y', z', k, m and n are as defined above. It is noted that $r11+r12=r1$ wherein r1 is as defined above.

R, $R^1$ to $R^5$, $R^7$ to $R^{10}$, x, y, x', y', z', k, m, n, a, and b are as defined above. Letters p, q, r11, r12 and r2 are numbers as defined above, and preferably fall in the following ranges.

| Preferred range | More preferred range |
| --- | --- |
| $0 \leq p \leq 0.2$ | $0 \leq p \leq 0.1$ |
| $0 \leq q \leq 0.2$ | $0 \leq q \leq 0.1$ |
| $0 \leq r11 \leq 0.6$ | $0.05 \leq r11 \leq 0.5$ |
| $0 \leq r12 \leq 0.6$ | $0.05 \leq r12 \leq 0.5$ |
| $0 < r2 \leq 0.9$ | $0.4 \leq r2 \leq 0.8$ |
| $0.01 \leq p + q \leq 0.4$ | $0.01 \leq p + q \leq 0.2$ |
| $0 < r11 + r12 \leq 0.6$ | $0.1 \leq r11 + r12 \leq 0.5$ |

Illustrative, non-limiting examples of the inventive polymer are represented by the following formulae (3'-1) to (3'-6).

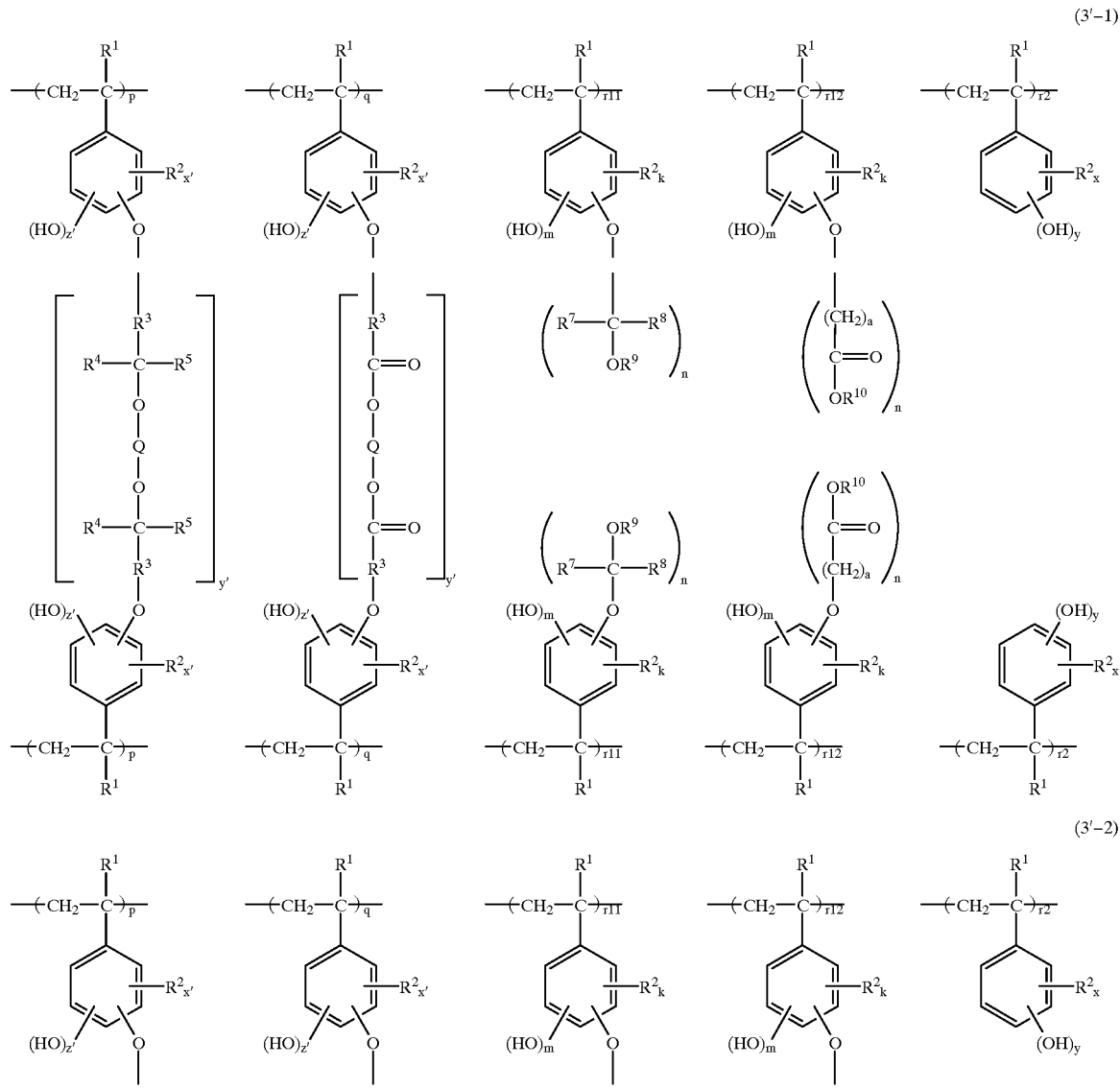

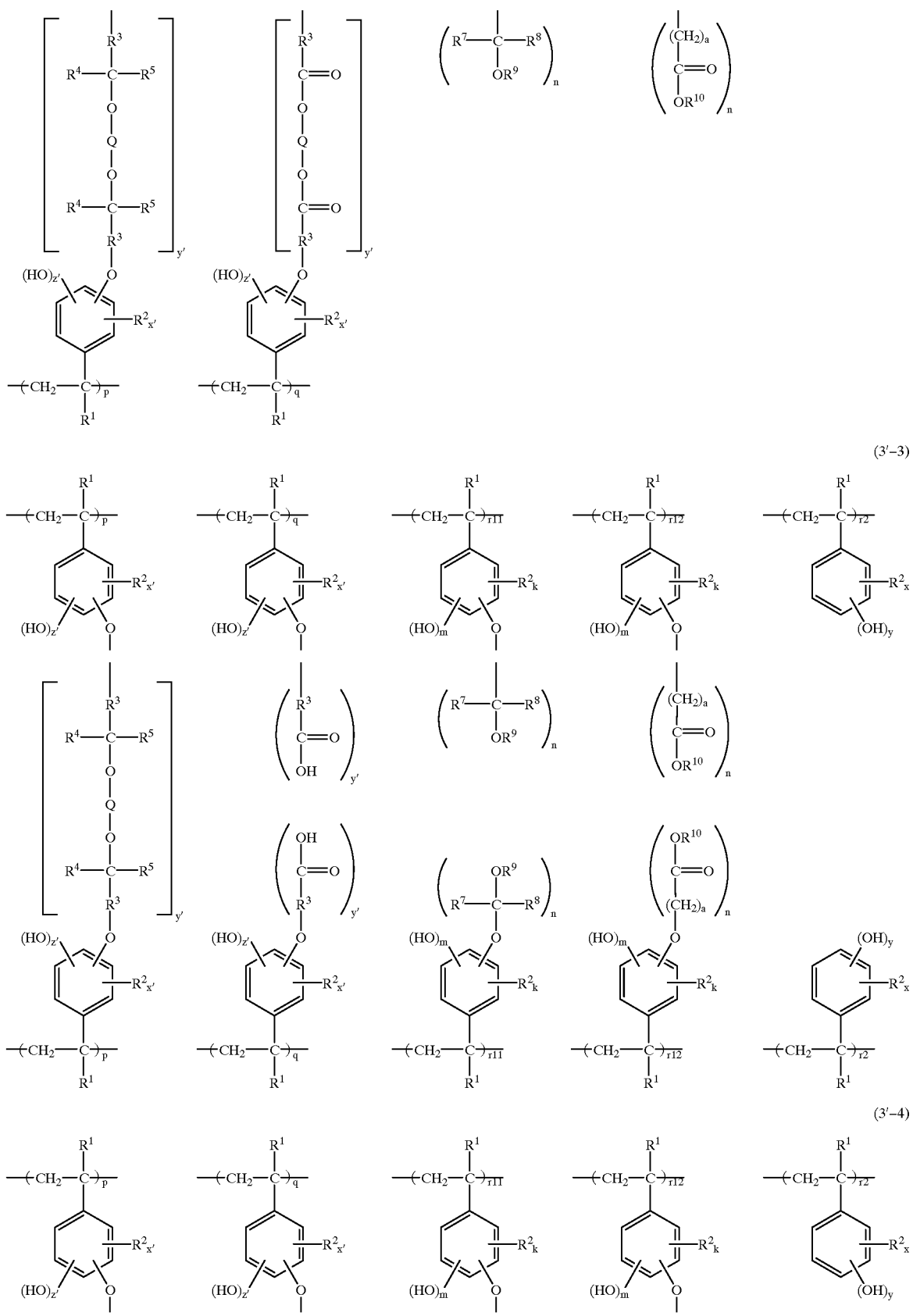

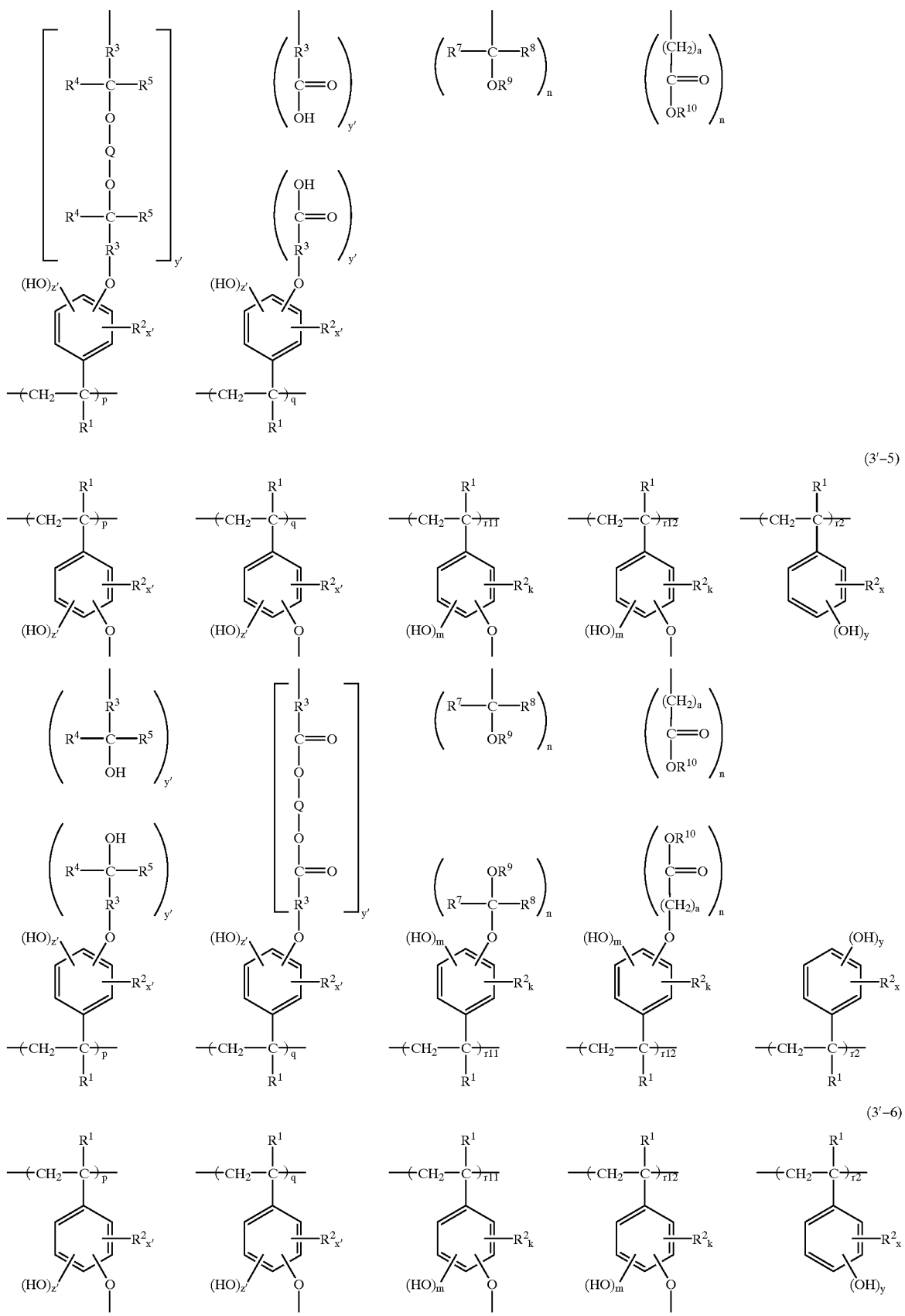

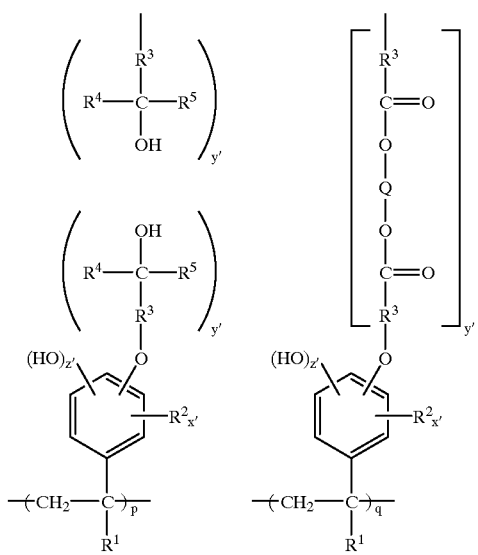
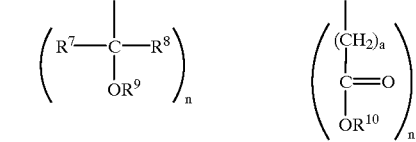

It is noted that formulae (3'-1), (3'-3) and (3'-5) show intermolecular linkages and formulae (3'-2), (3'-4) and (3'-6) show intramolecular linkages. They may be present alone or in admixture.

In the above formulae, R, $R^1$ to $R^5$, $R^7$ to $R^{10}$, x, y, x', y', z', k, m, n, a, p, q, r11, r12 and r2 are as defined above.

Q is a crosslinking group having a C—O—C linkage, typically a crosslinking group of formula (4a) or (4b), more preferably formula (4a''), (4b''), (4a''') or (4b'''), most preferably formula (4a') or (4b'). Where the crosslinking group is trivalent or more, Q is attached to at least three units of the following formulae in formula (3).

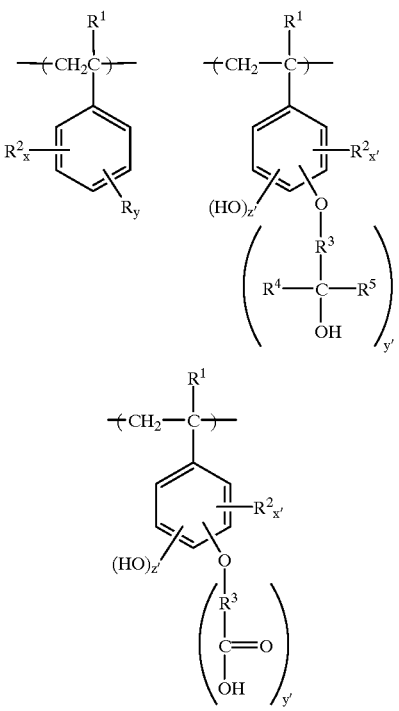

In the formula, $R^1$ to $R^5$, x, y, x', y' and z' are as defined above.

In the polymer of the present invention, the hydrogen atoms of some phenolic hydroxyl groups and/or alcoholic hydroxyl groups and/or carboxyl groups are replaced by acid labile groups, and the hydrogen atoms of some of the remaining alcoholic hydroxyl groups and/or carboxyl groups are replaced by crosslinking groups having a C—O—C linkage. It is essential that the amount of the acid labile group and the crosslinking group combined be on the average from more than 0 mol % to 80 mol %, especially from 2 to 50 mol % of the entirety of the phenolic hydroxyl groups, alcoholic hydroxyl groups and carboxyl groups in formula (1).

In this regard, the average proportion of the crosslinking group having a C—O—C linkage is from more than 0 mol % to 80 mol %, especially from 0.2 to 50 mol % of the entirety of the phenolic hydroxyl groups, alcoholic hydroxyl groups and carboxyl groups in formula (1). With 0 mol %, no benefits of the acid labile crosslinking group are obtained, resulting in a reduced contrast of alkali dissolution rate and low resolution. With more than 80 mol %, a too much crosslinked polymer will gel, become insoluble in alkali, induce a film thickness change, internal stresses or bubbles upon alkali development, and lose adhesion to the substrate due to less hydrophilic groups.

The average proportion of the acid labile group is from more than 0 mol % to 80 mol %, especially from 5 to 50 mol % of the entirety of the phenolic hydroxyl groups, alcoholic hydroxyl groups and carboxyl groups in formula (1). With 0 mol %, no benefits of the acid labile group are obtained, resulting in a reduced contrast of alkali dissolution rate and low resolution. With more than 80 mol %, alkali solubility will be lost and the affinity to an alkaline developer becomes low, resulting in low resolution.

By properly selecting the amounts of the crosslinking group and the acid labile group within the above-defined ranges, the size and configuration of a resist pattern can be controlled as desired. In the polymer according to the invention, the contents of the crosslinking group having a C—O—C linkage and the acid labile group have substantial influence on the dissolution rate contrast of a resist film and govern the properties of a resist composition relating to the size and configuration of a resist pattern.

The polymer of the invention should have a weight average molecular weight of 1,000 to 500,000, preferably 3,000 to 30,000. With a weight average molecular weight of less than 1,000, resists would be less resistant to heat. With a weight average molecular weight of more than 500,000, alkali solubility and resolution lowers.

It is understood that prior to crosslinking, a polymer having a wide molecular weight dispersity (Mw/Mn) contains more polymers of low molecular weight and high molecular weight. Such a wide dispersity obstructs the design of the number of crosslinks and it is rather difficult to produce resist materials having the same properties. The influence of a molecular weight and its dispersity becomes greater as the pattern rule becomes finer. In order that a resist material be advantageously used in patterning features to a finer size, the polymer should preferably be a monodisperse one having a molecular weight dispersity of 1.0 to 1.5, especially 1.0 to 1.3. However, the invention is not limited thereto, and it is, of course, acceptable to use a polymer having a dispersity of more than 1.5.

Preparation Method

The method for preparing the polymer according to the invention is now described. The method involves, for example, the following three steps: step (A) of forming a polymer comprising recurring units of formula (1), that is, introducing a side chain having an alcoholic hydroxyl group and/or carboxyl group into a resin of the following general formula (7); step (B) of reacting the alcoholic hydroxyl group and/or carboxyl group with an alkenyl ether compound or halogenated alkenyl ether compound, thereby inducing crosslinks with crosslinking groups having a C—O—C linkage within a molecular and/or between molecules; and step (C) of partially substituting the acid labile groups for the hydrogen atoms of the phenolic hydroxyl groups. The order of these steps may be any of A→B→C (Method-1), A→C→B (Method-2), and C→A→B (Method-3). In any of these Method-1, 2 and 3, isolation may or may not be carried out between the steps.

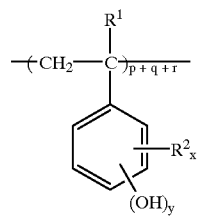

(7)

In formula (7), $R^1$ is hydrogen or methyl, $R^2$ is a normal, branched or cyclic alkyl group of 1 to 8 carbon atoms; letter x is 0 or a positive integer, y is a positive integer, satisfying $x+y \leq 5$; letters p and q are 0 or positive numbers, r is a positive number, satisfying $p+q+r=1$.

Step (A) of introducing a side chain having an alcoholic hydroxyl group and/or carboxyl group into a resin of formula (7) may be carried out by reacting a halide having a protected alcoholic hydroxyl group and/or carboxyl group with a phenolic hydroxyl group under basic conditions, followed by deblocking in a conventional manner.

With respect to the protective group used herein, the group which can be deblocked under neutral or basic conditions must be selected when Method-3 is employed, but any groups which can be deblocked under neutral or basic or acidic conditions are acceptable when Method-1 or Method-2 is employed. With respect to the protective groups for alcoholic hydroxyl groups, exemplary protective groups which can be deblocked under basic conditions include ester protective groups such as acetyl and pivaloyl; exemplary protective groups which can be deblocked under acidic conditions include acetal protective groups such as 1-ethoxyethyl and 2-tetrahydropyranyl, tertiary alkyl ether and tertiary alkyl carbonate protective groups such as tert-butyl and tert-butoxycarbonyl, and ortho-ester protective groups such as dimethoxymethyl; and exemplary protective groups which can be deblocked under either acidic or basic conditions include trialkylsilyl ether protective groups such as trimethylsilyl and tert-butyldimethylsilyl, although the protective groups are not limited thereto. With respect to the protective groups for carboxyl groups, exemplary protective groups which can be deblocked under basic conditions include alkyl ester protective groups such as methyl, ethyl, and 2,2,2-trichloroethyl; exemplary protective groups which can be deblocked under acidic conditions include alkoxyalkyl ester protective groups such as methoxymethyl and 2-tetrahydropyranyl, and tertiary alkyl ester protective groups such as tert-butyl; and exemplary protective groups which can be deblocked under either acidic or basic conditions include trialkylsilyl ester protective groups such as trimethylsilyl and tert-butyldimethylsilyl.

The halides having an alcoholic hydroxyl group include 2-halo-1-ethanols, 3-halo-1-propanols, 4-halo-1-butanols, 1-halo-2-methyl-2-propanols, and 2-halocyclohexanols, though not limited thereto. The halides having a carboxyl group include haloacetic acids, 3-halopropionic acids, 6-halohexanoic acid, and 8-halooctanoic acid, though not limited thereto. These halides are modified with the above protective groups in a conventional manner before they are subjected to reaction with the resin of formula (7).

The reaction solvent used herein is preferably selected from aprotic polar solvents such as N,N-dimethylformamide, N,N-dimethylacetamide, dimethylsulfoxide, acetonitrile, acetone, and tetrahydrofuran and mixtures thereof.

The base is preferably selected from triethylamine, pyridine, diisopropylamine, imidazole, and anhydrous potassium carbonate. The amount of base used is preferably 110 to 300 mol % based on the hydrogen atoms of phenolic hydroxyl groups to be replaced.

The reaction temperature usually ranges from −50° C. to 100° C., preferably from 0° C. to 80° C. The reaction time is usually from about ½ to 100 hours, preferably about 1 to 20 hours.

Deblocking reaction is carried out by hydrolysis, typically under basic or acidic conditions. In one common procedure of deblocking under basic conditions following the completion of reaction between the halide and the phenolic resin, a sufficient amount of a 1N sodium hydroxide aqueous solution or similar basic solution is added to the reaction system. In the case of deblocking under acidic conditions, a sufficient amount of a 1N hydrochloric acid aqueous solution or similar acidic solution is added to the reaction system. In either case, deblocking is accomplished by continuing the reaction at a temperature of 0 to 80° C. for 1 to 10 hours.

Step (B) is to react the alcoholic hydroxyl group and/or carboxyl group with an alkenyl ether compound or halogenated alkenyl ether compound, thereby inducing crosslinks with crosslinking groups having a C—O—C linkage within a molecular and/or between molecules. This step is achieved by reaction with an alkenyl ether compound under acidic conditions and/or reaction with a halogenated alkenyl ether compound under basic conditions.

Where Method-1 is employed, either the reaction with an alkenyl ether compound under acidic conditions or the reaction with a halogenated alkenyl ether compound under basic conditions is possible. Where Method-2 and Method-3 are employed, the reaction with a halogenated alkenyl ether compound under basic conditions is preferable because the acid labile groups have already been introduced.

The alkenyl ether compounds used herein are, for example, vinyl ether compounds of the following general formula (I) or (II).

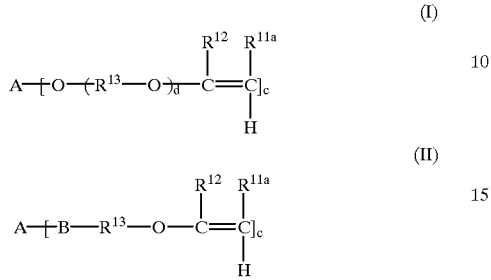

Herein, $R^{11a}$ is hydrogen or a normal or cyclic alkyl group having 1 to 7 carbon atoms, preferably 1 to 4 carbon atoms, more preferably 1 to 2 carbon atoms. $R^{12}$ is hydrogen or a normal, branched or cyclic alkyl group having 1 to 8 carbon atoms. Alternatively, $R^{11a}$ and $R^{12}$, taken together, may form a ring, with the proviso that $R^{11a}$ is a normal or branched alkylene group having 1 to 7 carbon atoms and $R^{12}$ is a normal or branched alkylene group having 1 to 8 carbon atoms when they form a ring. $R^{13}$ is as defined above.

In formula (I) or (II) representing the vinyl ether compound, A is a c-valent aliphatic saturated hydrocarbon, alicyclic saturated hydrocarbon, aromatic hydrocarbon or heterocyclic group having 1 to 50 carbon atoms, B is —CO—O—, —NHCOO— or —NHCONH—, and $R^{13}$ is a normal, branched or cyclic alkylene group of 1 to 10 carbon atoms. Letter c is an integer of 2 to 8, and d is 0 or an integer of 1 to 10.

The c-valent (divalent to octavalent) aliphatic or alicyclic saturated hydrocarbon and aromatic hydrocarbon groups represented by A include substituted or unsubstituted alkylene groups having 1 to 50 carbon atoms, especially 1 to 40 carbon atoms, substituted or unsubstituted arylene groups having 6 to 50 carbon atoms, especially 6 to 40 carbon atoms, combinations of an alkylene group and an arylene group, and c"-valent groups obtained by eliminating one hydrogen atom attached to a carbon atom from the foregoing groups wherein c" is an integer of 3 to 8; as well as c-valent heterocyclic groups, and combinations of a heterocyclic group with any one of the foregoing hydrocarbon groups. In the alkylene and arylene groups, a hetero atom such as O, NH, N(CH₃), S and SO₂ may intervene and where substituted, the substituent is a hydroxyl, carboxyl, acyl group or fluorine atom.

The organic groups represented by A are exemplified below.

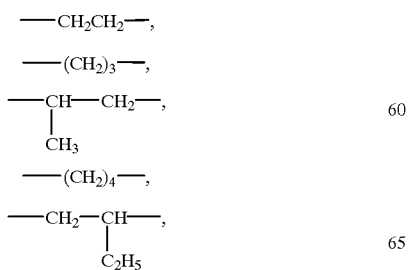

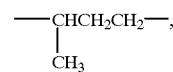
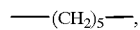
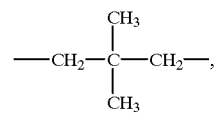
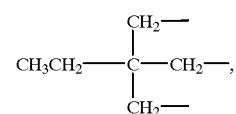
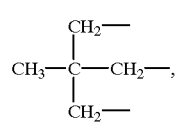
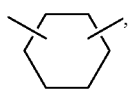
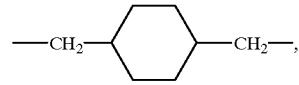
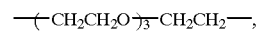
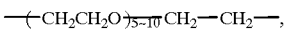
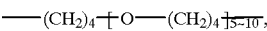
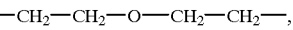
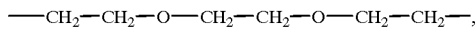
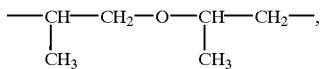
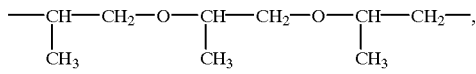
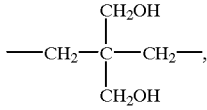
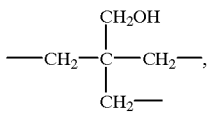
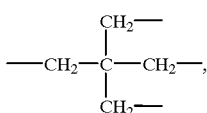
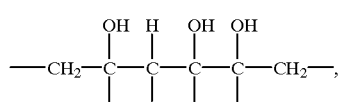
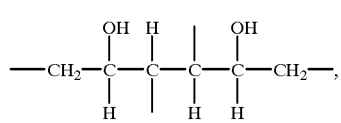

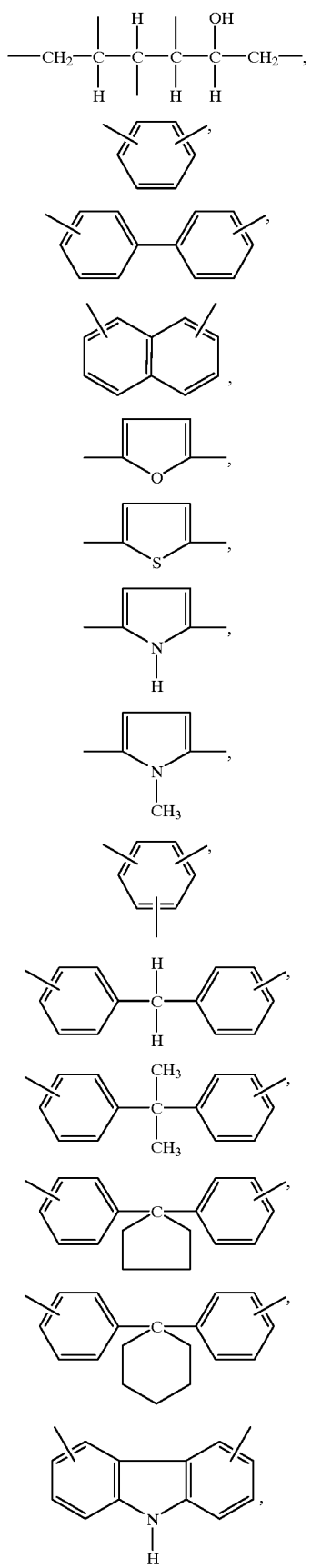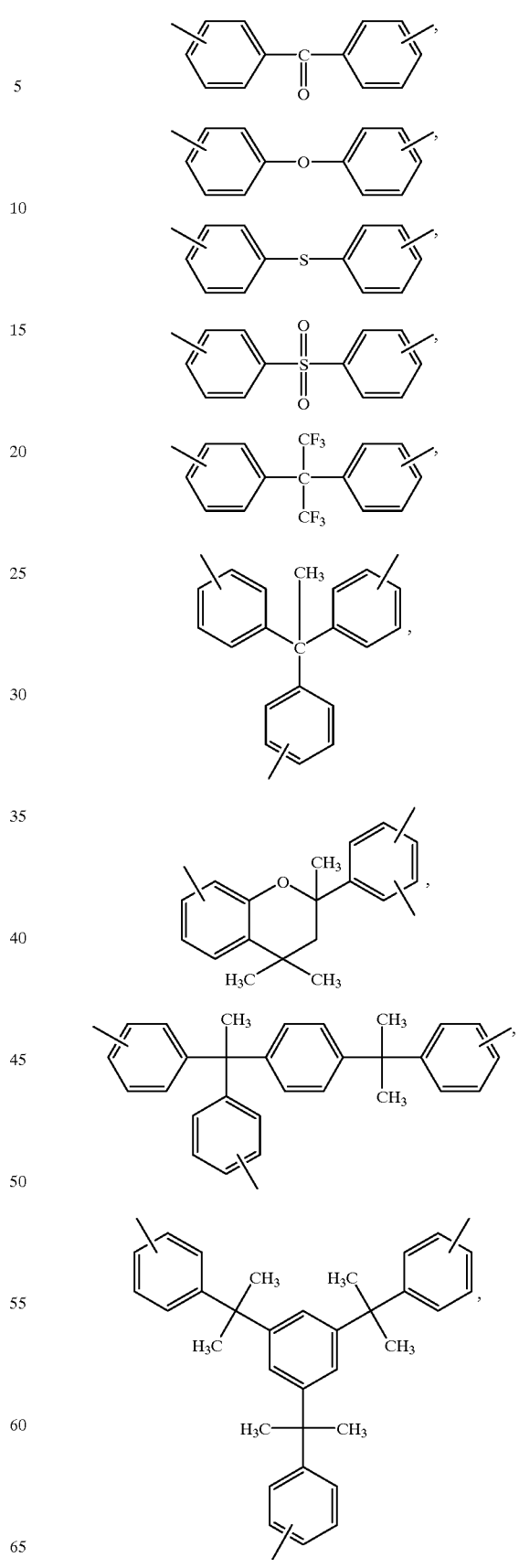

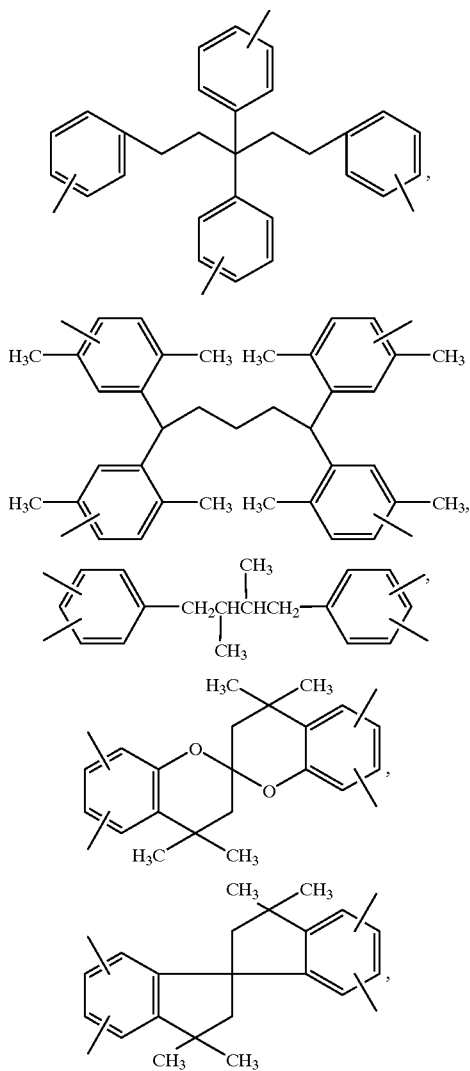

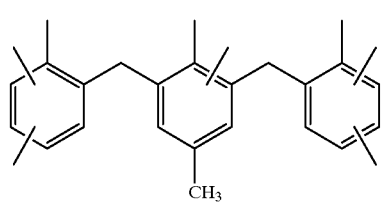

The compounds of formula (I) can be synthesized, for example, by the method described in Stephen C. Lapin, Polymers Paint Colour Journal, 179 (4237), 321 (1988), more specifically by reacting polyhydric alcohols or polyhydric phenols with acetylene or reacting polyhydric alcohols or polyhydric phenols with halogenated alkyl vinyl ethers.

Illustrative, non-limiting examples of the compound of formula (I) include ethylene glycol divinyl ether, triethylene glycol divinyl ether, 1,2-propane diol divinyl ether, 1,3-propane diol divinyl ether, 1,3-butane diol divinyl ether, 1,4-butane diol divinyl ether, tetramethylene glycol divinyl ether, neopentyl glycol divinyl ether, trimethylol propane trivinyl ether, trimethylol ethane trivinyl ether, hexane diol divinyl ether, 1,4-cyclohexane diol divinyl ether, tetraethylene glycol divinyl ether, pentaerythritol divinyl ether, pentaerythritol trivinyl ether, pentaerythritol tetravinyl ether, sorbitol tetravinyl ether, sorbitol pentavinyl ether, ethylene glycol diethylene vinyl ether, triethylene glycol diethylene vinyl ether, ethylene glycol dipropylene vinyl ether, triethylene glycol diethylene vinyl ether, trimethylol propane triethylene vinyl ether, trimethylol propane diethylene vinyl ether, pentaerythritol diethylene vinyl ether, pentaerythritol triethylene vinyl ether, pentaerythritol tetraethylene vinyl ether as well as the compounds of the following formulae (I-1) through (I-31).

(I-1)

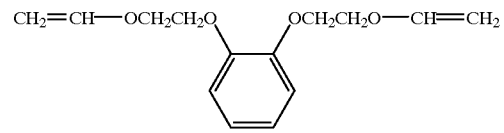
(I-2)

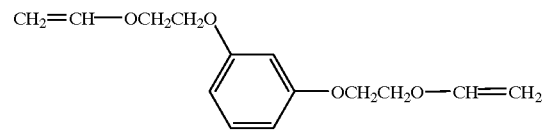
(I-3)

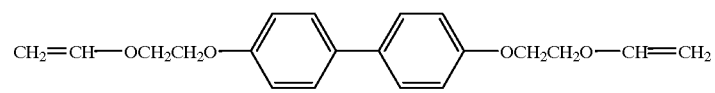
(I-4)

-continued
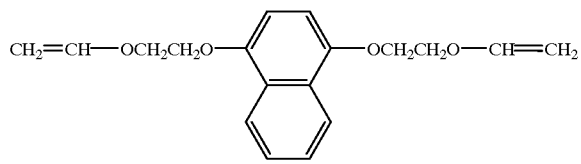
(I-5)
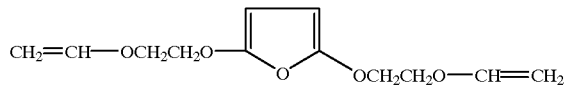
(I-6)
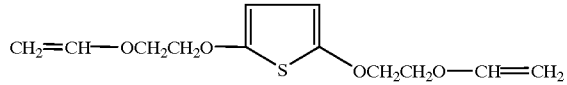
(I-7)
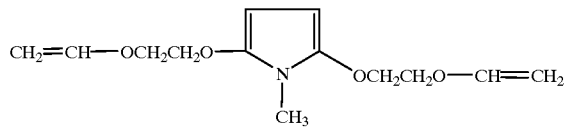
(I-8)
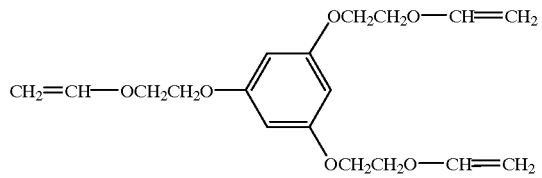
(I-9)
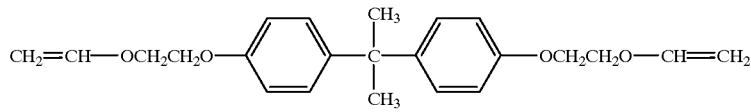
(I-10)
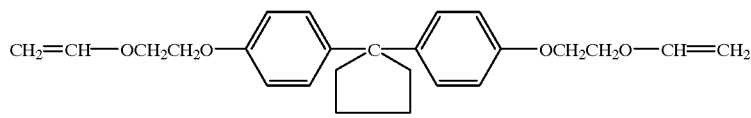
(I-11)
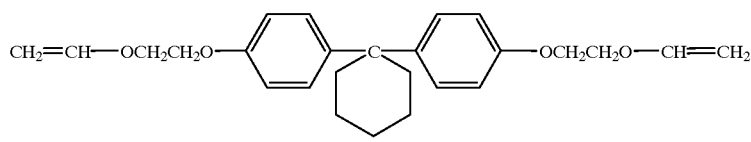
(I-12)
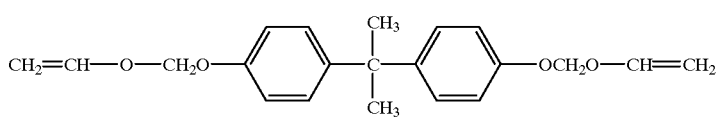
(I-13)
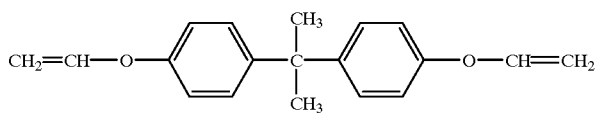
(I-14)
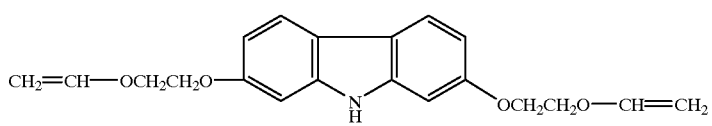
(I-15)

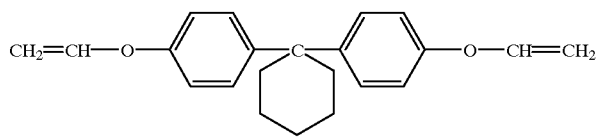
(I-16)
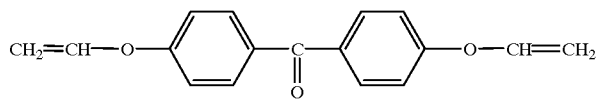
(I-17)
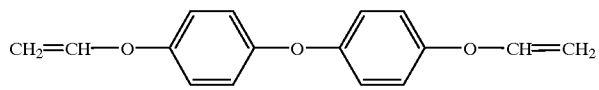
(I-18)
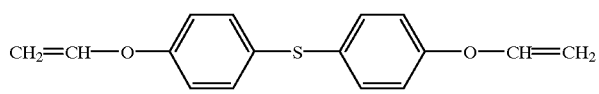
(I-19)
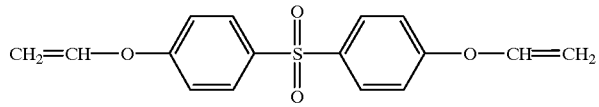
(I-20)
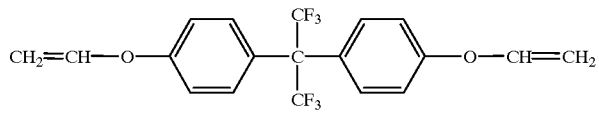
(I-21)
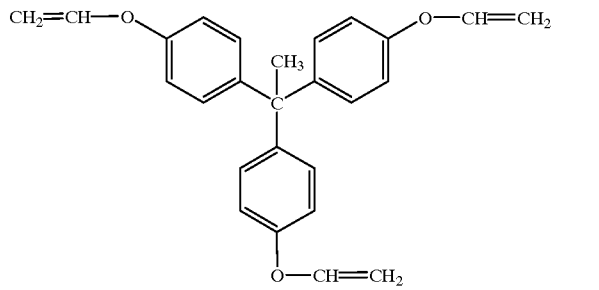
(I-22)
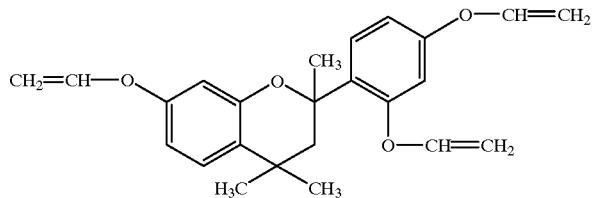
(I-23)
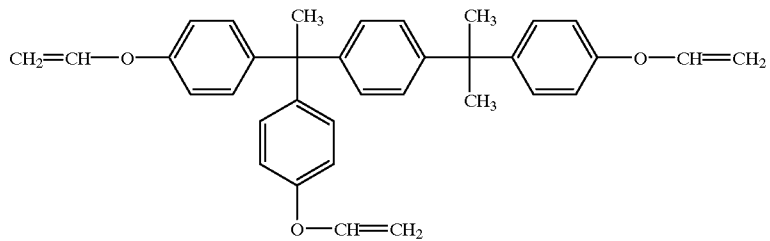
(I-24)

-continued
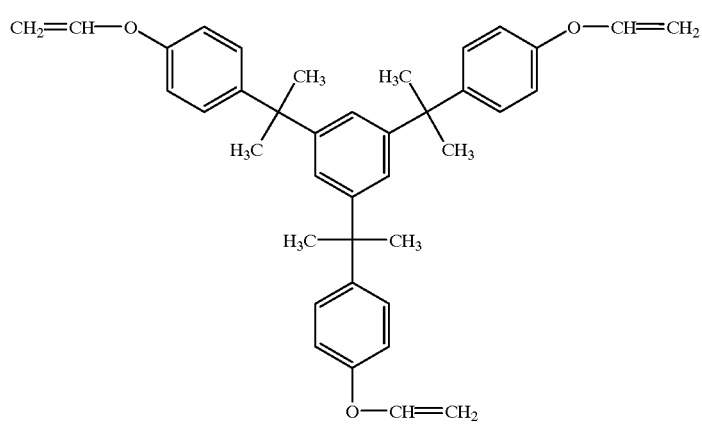
(I-25)
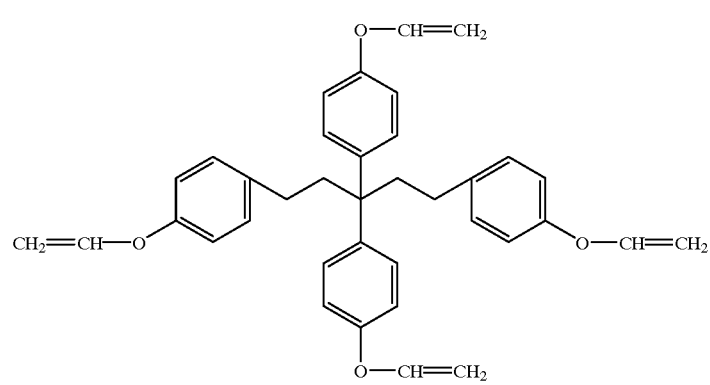
(I-26)
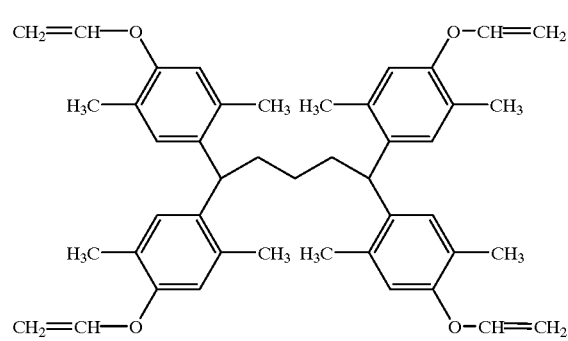
(I-27)
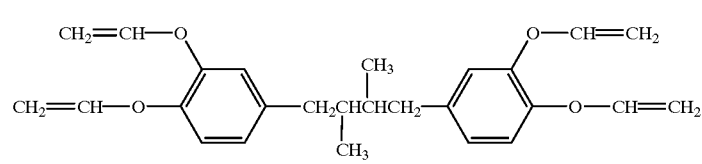
(I-28)
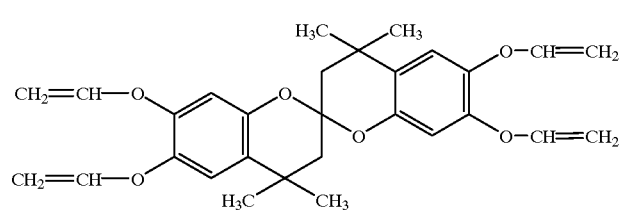
(I-29)

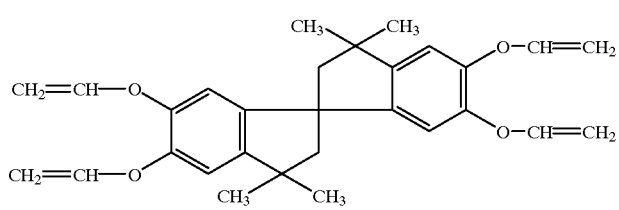
(I-30)

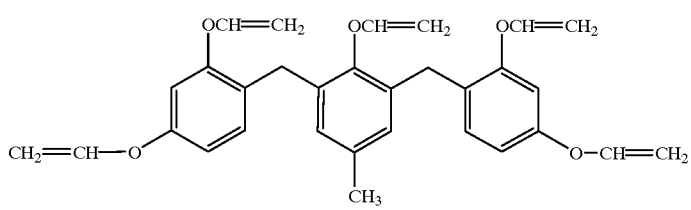
(I-31)

The compounds of formula (II) wherein B is —CO—O— can be synthesized by reacting polyfunctional carboxylic acids with halogenated alkyl vinyl ethers. Illustrative, non-limiting examples include terephthalic diethylene vinyl ether, phthalic diethylene vinyl ether, isophthalic diethylene vinyl ether, phthalic dipropylene vinyl ether, terephthalic dipropylene vinyl ether, isophthalic dipropylene vinyl ether, maleic diethylene vinyl ether, fumaric diethylene vinyl ether, and itaconic diethylene vinyl ether.

Other useful alkenyl ether group-containing compounds which can be used herein are alkenyl ether group-containing compounds which are synthesized by reacting alkenyl ether compounds having active hydrogen as represented by the following formulae (III), (IV), and (V) with compounds having an isocyanato group.

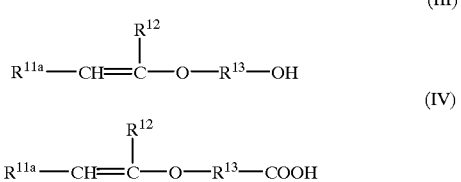
(III)

(IV)

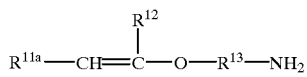
(V)

$R^{11a}$, $R^{12}$, and $R^{13}$ are as defined above.

Where B is —NHCO—O— or —NHCONH—, the compounds having an isocyanato group of formula (II) may be those compounds described in "Handbook of Crosslinking Agents," Taiseisha, 1981, for example. Exemplary are polyisocyanates such as triphenylmethane triisocyanate, diphenylmethane diisocyanate, tolylene diisocyanate, 2,4-tolylene diisocyanate dimer, naphthalene-1,5-diisocyanate, o-tolylene diisocyanate, polymethylene polyphenyl isocyanate, and hexamethylene diisocyanate; and polyisocyanate adducts such as an addition product of tolylene diisocyanate and trimethylolpropane, an addition product of hexamethylene diisocyanate and water, and an addition product of xylene diisocyanate and trimethylolpropane. By reacting isocyanato group-containing compounds with active hydrogen-containing vinyl ether compounds, there are obtained various compounds terminated with an alkenyl ether group. These compounds are exemplified by the following formulae (VI-1) through (VI-11), though not limited thereto.

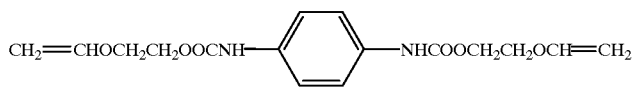
(VI-1)

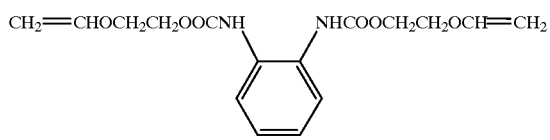
(VI-2)

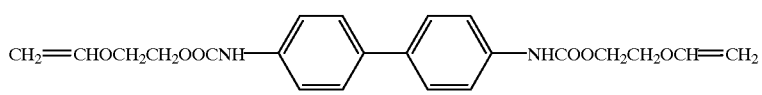
(VI-3)

-continued

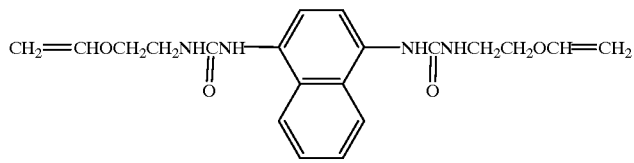
(VI-4)

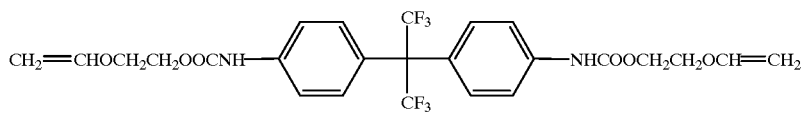
(VI-5)

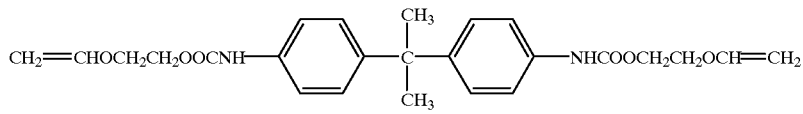
(VI-6)

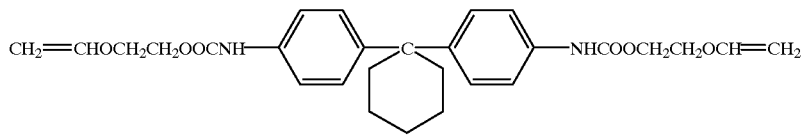
(VI-7)

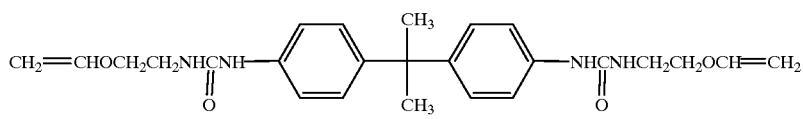
(VI-8)

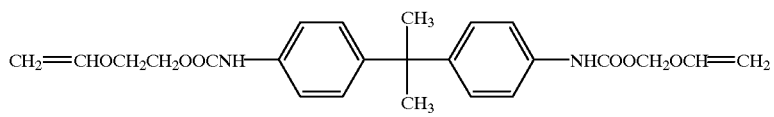
(VI-9)

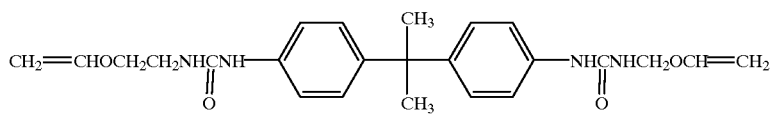
(VI-10)

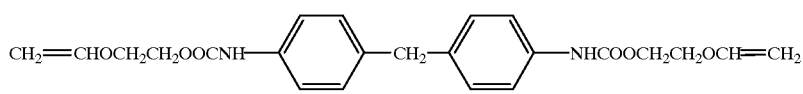
(VI-11)

For the reaction of the alcoholic hydroxyl groups and/or carboxyl groups with the alkenyl ether compound under acidic conditions, it is preferable to use a solvent and an acid. The reaction solvent used herein is preferably selected from among N,N-dimethylformamide, N,N-dimethylacetamide, tetrahydrofuran, and ethyl acetate, and mixtures thereof. The acid catalyst used herein is preferably selected from hydrochloric acid, sulfuric acid, trifluoromethanesulfonic acid, p-toluenesulfonic acid, methanesulfonic acid, and pyridinium p-toluenesulfonate. The amount of the acid catalyst used is preferably 0.1 to 10 mol % based on the moles of the alcoholic hydroxyl group and/or carboxyl group to be replaced. Reaction is preferably carried out at a temperature of −20° C. to 100° C., more preferably 0° C. to 60° C. The reaction time is generally about 10 minutes to 100 hours, preferably about ½ to 20 hours.

The halogenated alkenyl ether compounds used herein are, for example, compounds of the following general formulae (VII) and (VIII).

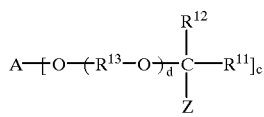
(VII)

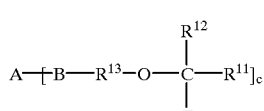
(VIII)

Herein $R^{11}$, $R^{12}$, $R^{13}$, A, B, c, and d are as defined above and Z is a halogen atom such as Cl, Br or I.

The compounds of formulae (VII) and (VIII) can be obtained by reacting the compounds of formulae (I) and (II) with hydrogen chloride, hydrogen bromide or hydrogen iodide.

For the reaction of the alcoholic hydroxyl groups and/or carboxyl groups with the halogenated alkenyl ether compound under basic condition, it is preferable to use a solvent and a base. The reaction solvent used herein is preferably selected from aprotic polar solvents such as N,N-dimethylformamide, N,N-dimethylacetamide, dimethylsulfoxide, acetonitrile, acetone, and tetrahydrofuran, and mixtures thereof. The base used herein is preferably selected from triethylamine, pyridine, diisopropylamine, imidazole, and anhydrous potassium carbonate. The amount of the base used is preferably 110 to 300 mol % based on the moles of the alcoholic hydroxyl group and/or carboxyl group to be replaced. Reaction is preferably carried out at a temperature of −50-0° C. to 100° C., more preferably 0° C. to 80° C. The reaction time is generally about ½ to 100 hours, preferably about 1 to 20 hours.

Step (C) is to partially substitute the acid labile groups for the phenolic hydroxyl groups. This step may be accomplished by reaction with an alkenyl ether compound under acidic conditions, reaction with a 1,1-dialkylalkene under acidic conditions, reaction with an α,β-unsaturated carbonyl compound under acidic conditions, reaction with a halogenated alkyl ether under basic conditions, reaction with an acid anhydride under basic conditions, reaction with a halogenated trialkylsilane under basic conditions, or reaction with a tertiary alkyl ester of a halogenated alkyl carboxylic acid under basic conditions, though step (C) is not limited to these reactions.

Where Method-3 is employed, the introduction of acid labile groups may be done under either acidic or basic conditions. Where Method-1 is employed, the introduction of acid labile groups is preferably done under basic conditions because the acid labile crosslinking groups have already been introduced. In Method-2, because it is necessary to introduce acid labile groups into only the phenolic hydroxyl groups while retaining alcoholic hydroxyl groups and/or carboxyl groups serving as crosslinking group-introducing sites, the introduction of acid labile groups is preferably done under basic conditions for retaining the alcoholic hydroxyl groups and under acidic conditions for retaining the carboxyl groups, with the difference in reactivity between alcoholic hydroxyl groups and carboxyl groups taken into account.

First, the reaction under acidic conditions may be carried out in reaction solvents in the presence of acids, using the following compounds.

As mentioned above, the compounds used are alkenyl ether compounds, 1,1-dialkylalkenes, and α,β-unsaturated carbonyl compounds. Exemplary alkenyl ether compounds are ethyl vinyl ether, n-propyl vinyl ether, isopropyl vinyl ether, n-butyl vinyl ether, isobutyl vinyl ether, sec-butyl vinyl ether, tert-butyl vinyl ether, tert-amyl vinyl ether, cyclohexyl vinyl ether, 1-methoxypropene, 1-ethoxypropene, 2-methoxypropene, 2-ethoxypropene, 3,4-dihydro−2H-pyran, and 2,3-dihydrofuran, though not limited thereto. Exemplary 1,1-dialkylalkenes are isobutene, 2-methyl−2-butene, and 2-methyl-1-butene, though not limited thereto. Exemplary α,β-unsaturated carbonyl compounds are 2-cyclohexen-1-one and 5,6-dihydro-2H-pyran-2-one, though not limited thereto.

The reaction solvent used herein is preferably selected from N,N-dimethylformamide, N,N-dimethylacetamide, tetrahydrofuran, and ethyl acetate, and mixtures thereof. The acid used herein is preferably selected from hydrochloric acid, sulfuric acid, trifluoromethanesulfonic acid, p-toluenesulfonic acid, methanesulfonic acid, and pyridinium p-toluenesulfonate. The amount of the acid used is preferably 0.1 to 10 mol % based on the phenolic hydroxyl groups to be replaced. Reaction is preferably carried out at a temperature of −20° C. to 100° C., more preferably 0° C. to 60° C. The reaction time is generally about 10 minutes to 100 hours, preferably about ½ to 20 hours.

Secondly, the reaction under basic conditions may be carried out in reaction solvents in the presence of bases, using the following compounds.

As mentioned above, the compounds used are halogenated alkyl ethers, acid anhydrides, halogenated trialkylsilanes, and tertiary alkyl esters of halogenated alkyl carboxylic acids. Exemplary halogenated alkyl ethers include chloromethyl methyl ether, 1-chloroethyl ethyl ether, 1-chloropropyl ethyl ether, 2-chlorotetrahydropyran, 2-chlorotetrahydrofuran, and 1-chloroethyl cyclohexyl ether, though not limited thereto. Exemplary acid anhydrides are di-tert-butyl dicarbonate and di-tert-amyl dicarbonate, though not limited thereto. Exemplary halogenated trialkylsilanes are chlorotrimethylsilane, chlorotriethylsilane, and chlorodimethyl-tert-butylsilane, though not limited thereto. Exemplary tertiary alkyl esters of halogenated alkyl carboxylic acids are tert-butyl chloroacetate, tert-amyl chloroacetate, tert-butyl bromoacetate, and tert-butyl chloropropionate, though not limited thereto.

The reaction solvent used herein is preferably selected from aprotic polar solvents such as N,N-dimethylformamide, N,N-dimethylacetamide, dimethylsulfoxide, acetonitrile, acetone, and tetrahydrofuran, and mixtures thereof. The base used herein is preferably selected from triethylamine, pyridine, diisopropylamine, imidazole, and anhydrous potassium carbonate. The amount of the base used is preferably 110 to 300 mol % based on the phenolic hydroxyl groups to be replaced. Reaction is preferably carried out at a temperature of −50° C. to 100° C., more preferably 0° C. to 80° C. The reaction time is generally about ½ to 100 hours, preferably about 1 to 20 hours.

In the polymer of the invention, the acid labile groups represented by $R^6$ are not limited to one type, and acid labile groups of two or more different types may be introduced. Polymers having acid labile groups of two different types may be obtained by introducing r11 mol of first acid labile groups per mol of the total of phenolic hydroxyl groups, alcoholic hydroxyl groups and carboxyl groups in the polymer of formula (1) by the above-mentioned procedure, and then introducing r12 mol of second different acid labile groups by a similar procedure. Even polymers having acid labile groups of more than two different types may be obtained by repeating such introduction appropriate times.

In the above-described methods, by reacting (p+q) mol of an alkenyl ether compound and/or halogenated alkyl ether compound of formula (I) to (VIII) per mol of the total of phenolic hydroxyl groups, alcoholic hydroxyl groups and carboxyl groups in a polymer of formula (1) having a weight average molecular weight of 1,000 to 500,000 and preferably a molecular weight dispersity of 1.0 to 1.5, and further introducing (r11+r12) mol of acid labile groups therein, polymers of the following general formula (3a',-1-1) to (3a'-6-2), for example, can be obtained.

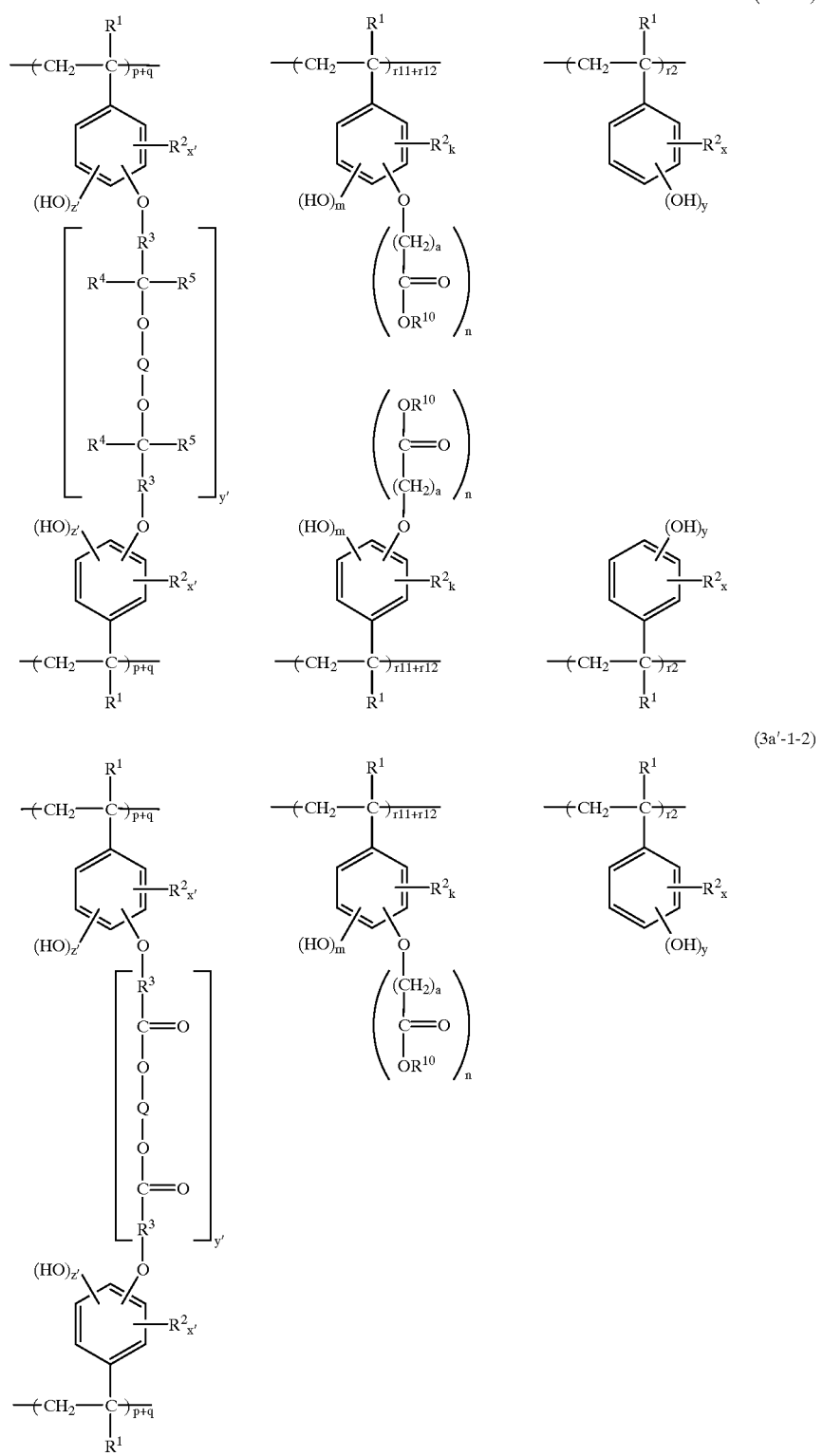

-continued
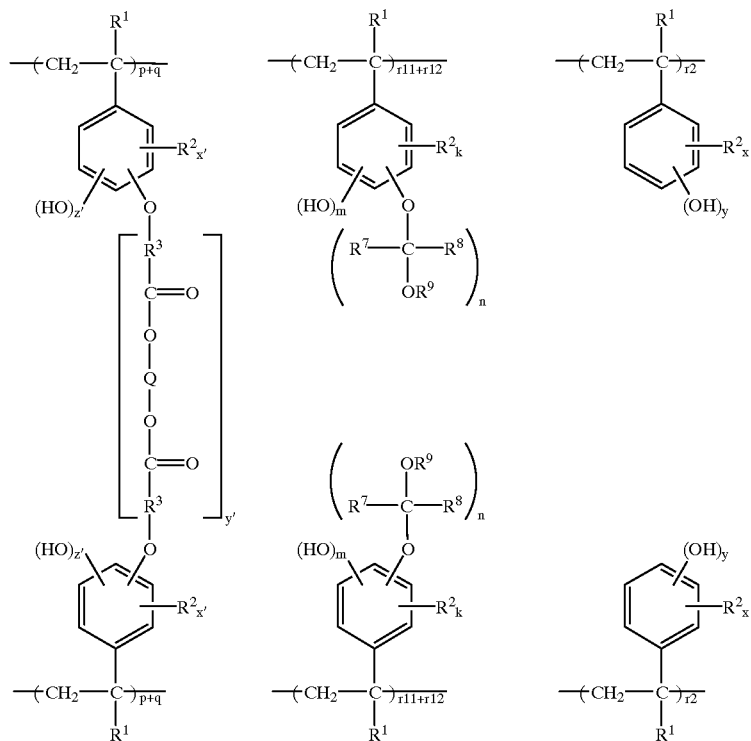
(3a'-2-1)
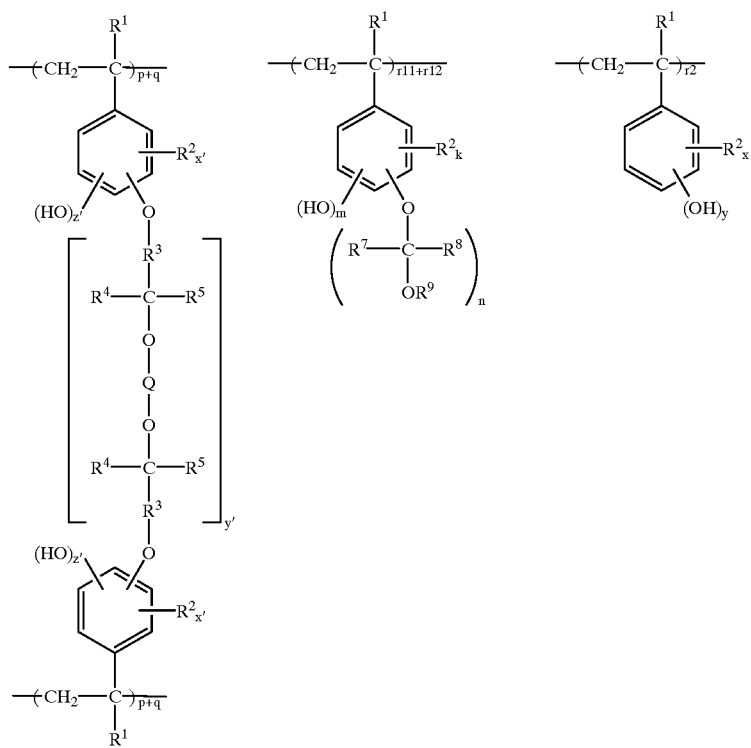
(3a'-2-2)

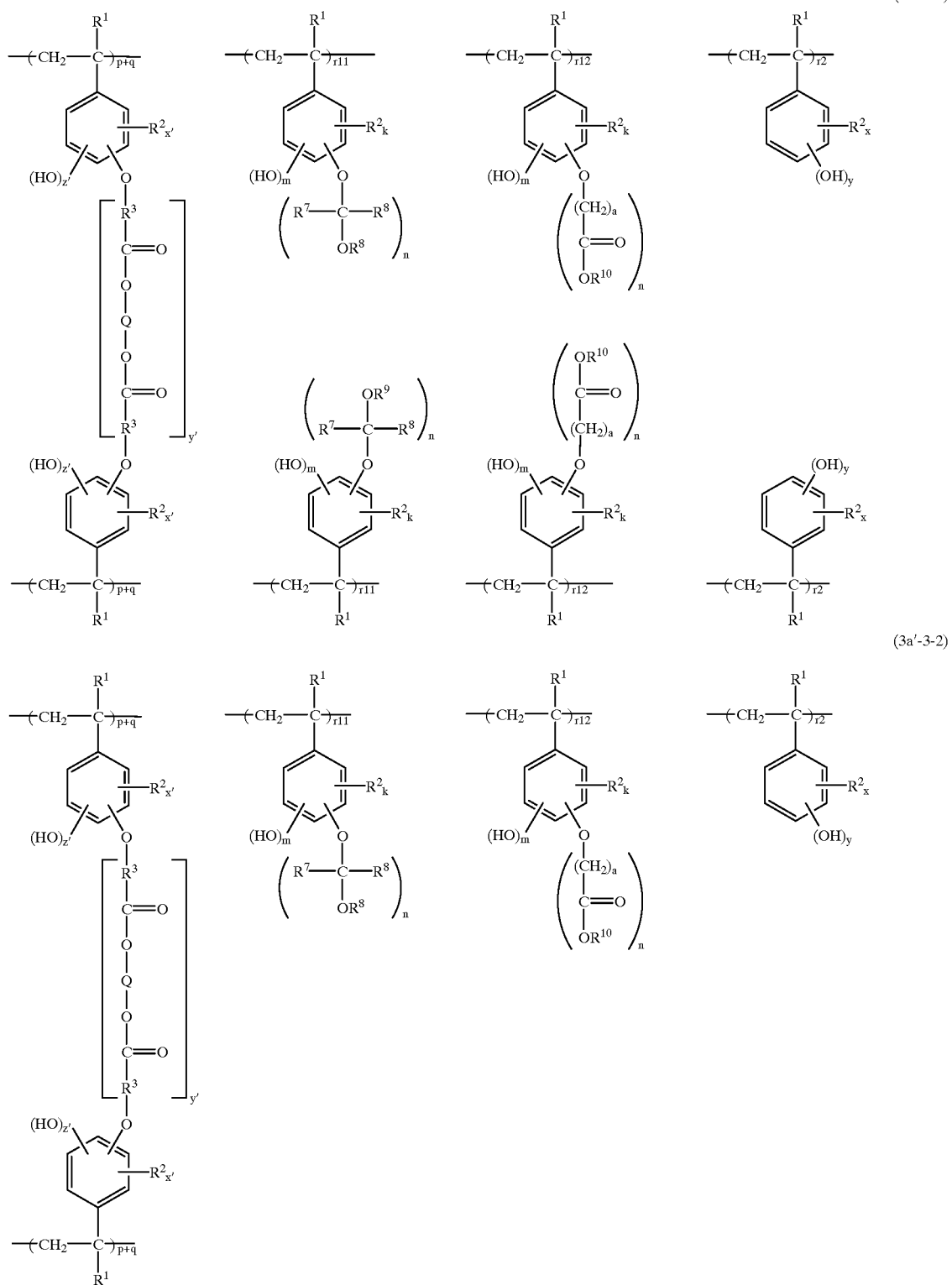

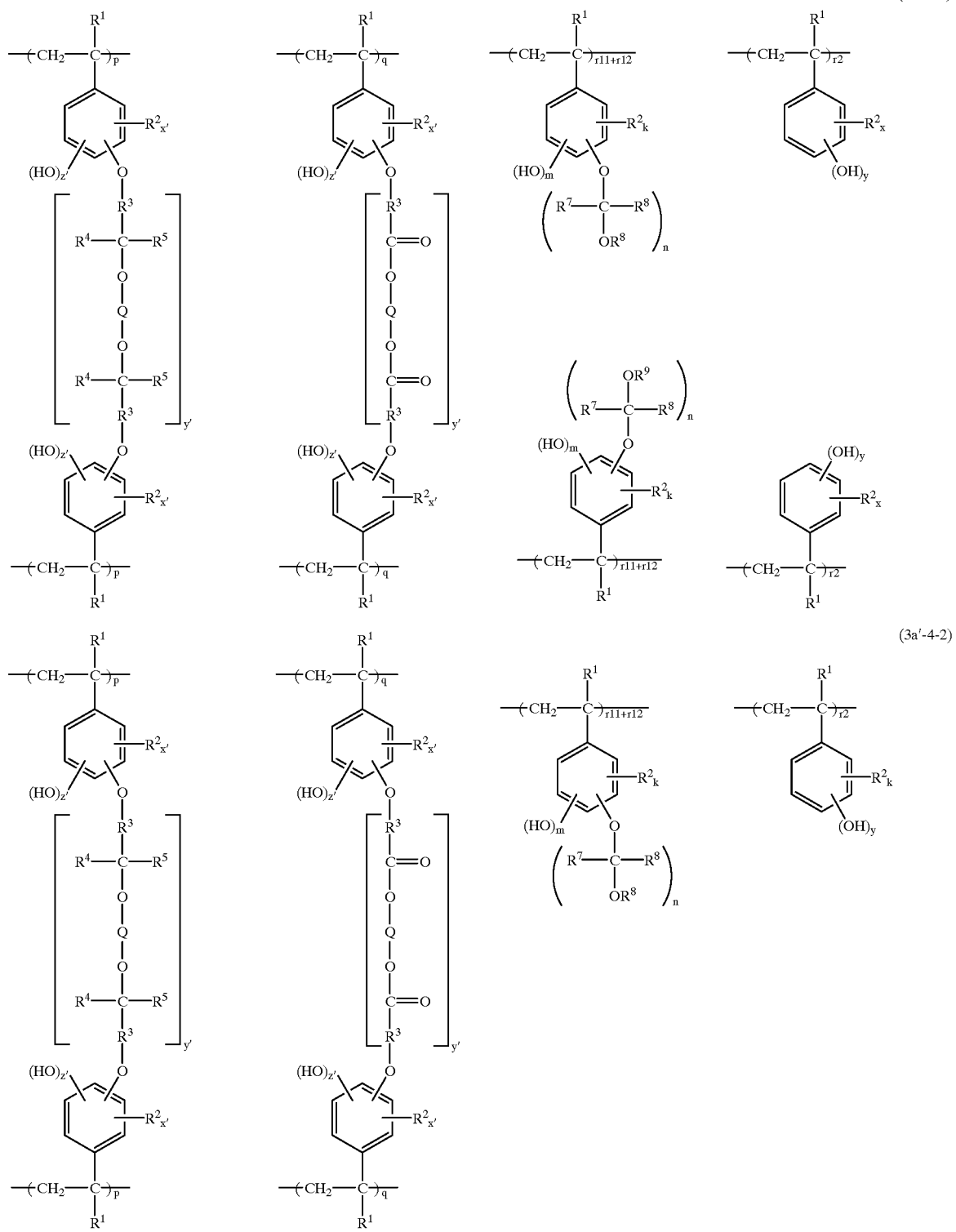

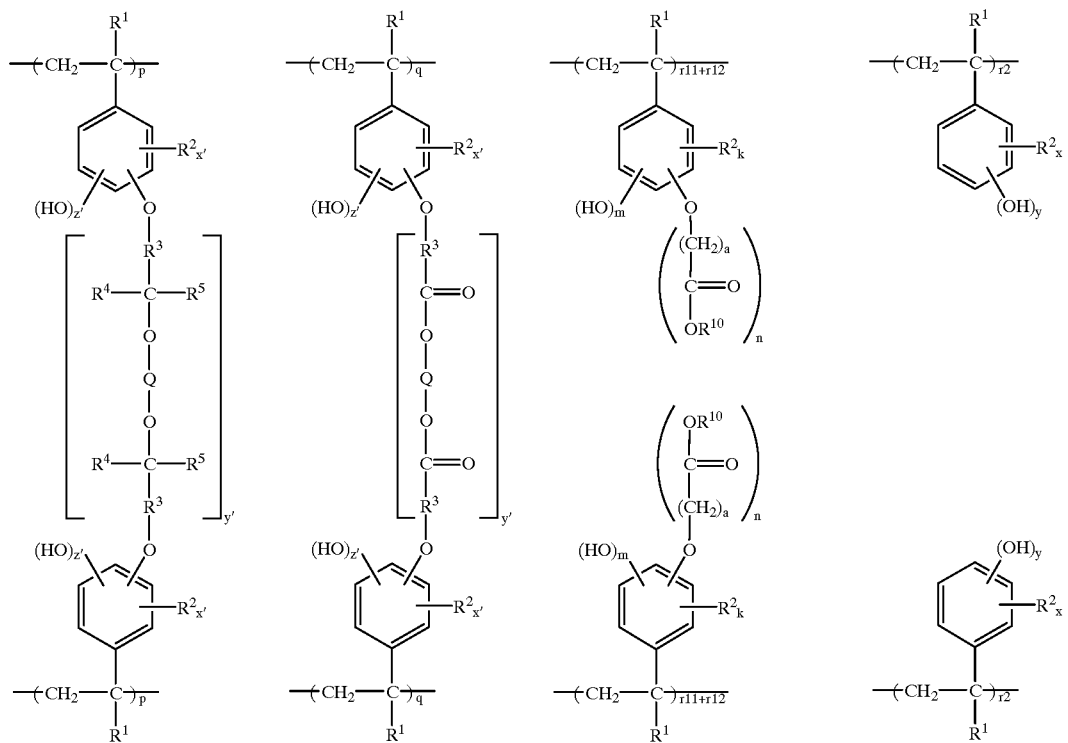
(3a'-5-1)
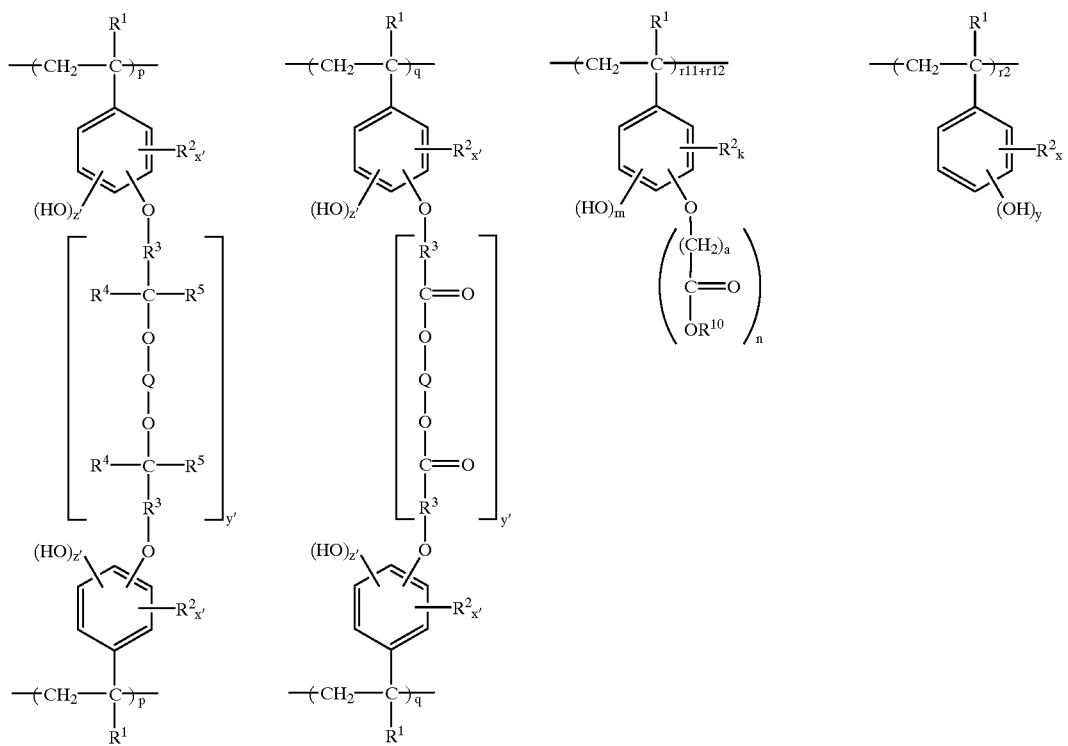
(3a'-5-2)

-continued
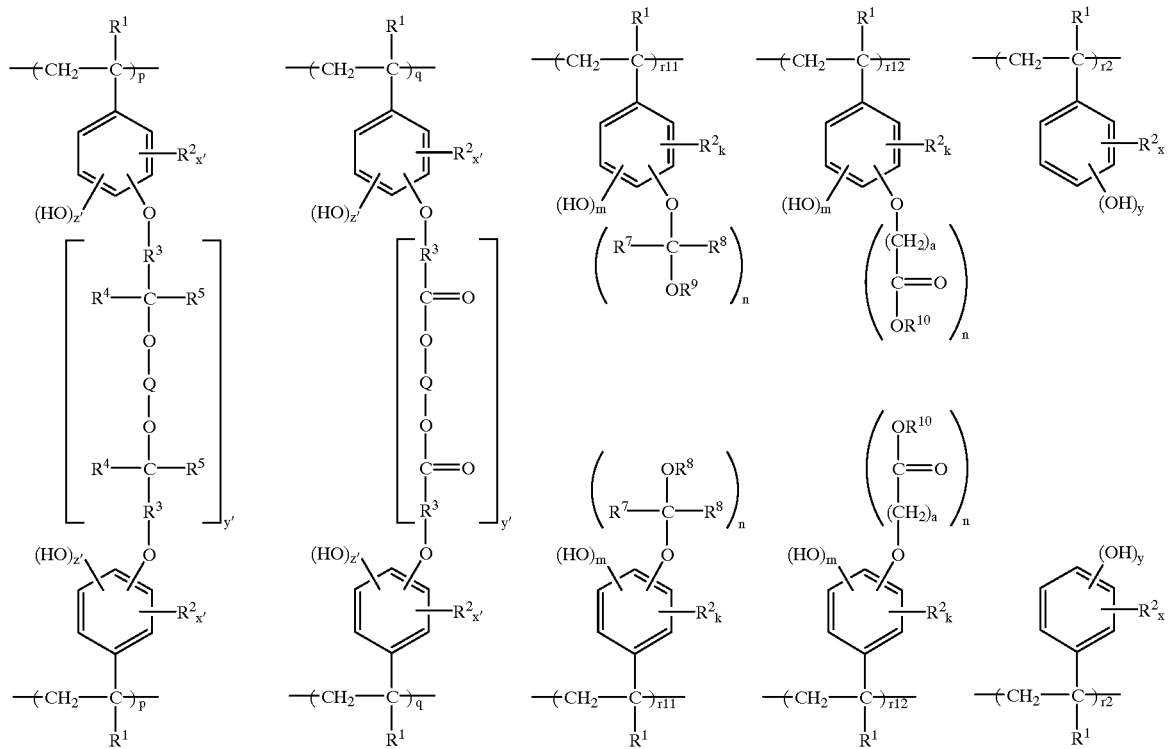
(3a'-6-1)
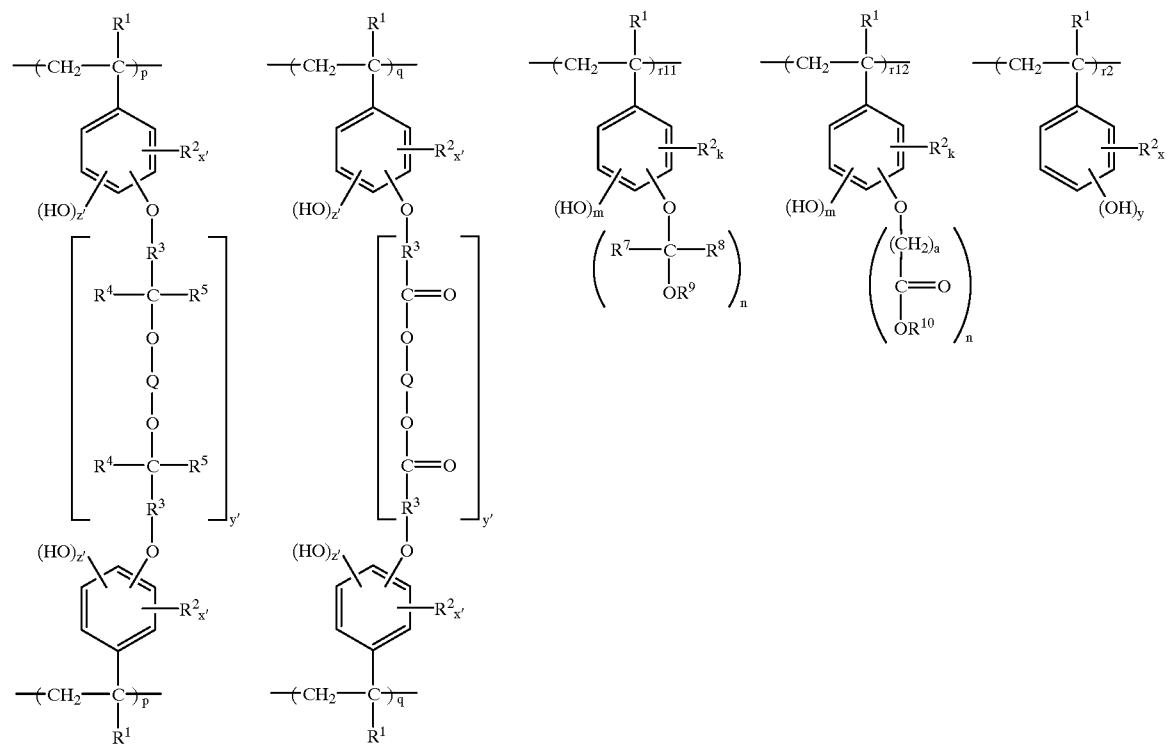
(3a'-6-2)
In the above formulae, $R^1$ to $R^{10}$, Q, x, y, x', y', z', k, m, n, a, p, q, r11, r12, and r2 are as defined above, provided x'=x, y'+z'=y, k=x, and m+n=y.
By taking the above-described procedures, the above-described preparation methods ensures that crosslinking groups are preferentially introduced into alcoholic hydroxyl groups and carboxyl groups in the crosslinking group introducing step (B), and that acid labile groups are preferentially introduced into phenolic hydroxyl groups in the acid labile group introducing step (C).

Resist

The polymer of the invention is useful as a base resin of a chemically amplified positive resist composition. The present invention provides a chemically amplified positive resist composition using the above-defined polymer as a base resin. Illustratively, the resist composition contains (A) an organic solvent,
(B) a base resin in the form of a polymer of formula (1), preferably formula (2), more preferably formula (3), and
(C) a photoacid generator.

In addition to these components, the resist composition of the invention may further contain (D) another base resin, separately from the base resin (B), in the form of a polymer comprising recurring units of the following general formula (1'), some of the hydrogen atoms of phenolic hydroxyl groups and/or alcoholic hydroxyl groups and/or carboxyl groups being replaced by acid labile groups in an average proportion of 0 mol % to 80 mol % of the entirety, the polymer having a weight average molecular weight of 3,000 to 300,000.

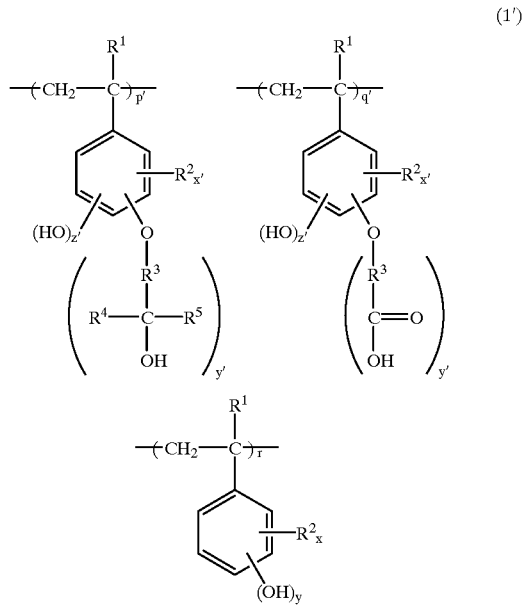

(1')

In formula (1'), $R^1$ to $R^5$, x, y, x', y' and z' are as defined above, p' and q' are 0 or positive numbers, r is a positive number, p' and q' may be equal to 0 at the same time, and p', q' and r satisfy the ranges: $0 \leq p' \leq 0.4$, $0 \leq q' \leq 0.4$, $0 \leq p'+q' \leq 0.8$, and $p'+q'+r=1$.

In addition to these components, the resist composition of the invention may further contain at least one of the following components (E) to (I):

(E) a dissolution regulator,
(F) a basic compound,
(G) an aromatic compound having a group =C—COOH in a molecule,
(H) a UV absorber, and
(I) an acetylene alcohol derivative.

The organic solvent (A) used herein may be any desired one of organic solvents in which the photoacid generator, base resin, and dissolution regulator are soluble. Illustrative, non-limiting examples of the organic solvent include ketones such as cyclohexanone and methyl-2-n-amylketone; alcohols such as 3-methoxybutanol, 3-methyl-3-methoxybutanol, 1-methoxy-2-propanol, and 1-ethoxy-2-propanol; ethers such as propylene glycol monomethyl ether, ethylene glycol monomethyl ether, propylene glycol monoethyl ether, ethylene glycol monoethyl ether, propylene glycol dimethyl ether, and diethylene glycol dimethyl ether; and esters such as propylene glycol monomethyl ether acetate, propylene glycol monoethyl ether acetate, methyl lactate, ethyl pyruvate, butyl acetate, methyl 3-methoxypropionate, ethyl 3-ethoxypropionate, tert-butyl acetate, tert-butyl propionate, and propylene glycol mono-tert-butyl ether acetate alone or in admixture of two or more. The preferred solvents are diethylene glycol dimethyl ether and 1-ethoxy-2-propanol ensuring the maximum solubility of photoacid generators and propylene glycol monomethyl ether acetate ensuring safety. These solvents may be used alone or in admixture of two or more.

The amount of the organic solvent used is preferably about 200 to 1,000 parts, more preferably about 400 to 800 parts by weight per 100 parts by weight of the base resin consisting of components (B) and (D) combined.

The photoacid generator (C) used herein is selected from onium salts of the following general formula (8), diazomethane derivatives of the following general formula (9), glyoxime derivatives of the following general formula (10), β-ketosulfone derivatives, disulfone derivatives, nitrobenzylsulfonate derivatives, sulfonate derivatives, and imidelylsulfonate derivatives, for example.

(8)

$R^{30}$ is a normal, branched or cyclic alkyl group of 1 to 12 carbon atoms, aryl group of 6 to 12 carbon atoms, or aralkyl group of 7 to 12 carbon atoms; $M^+$ is iodonium or sulfonium; $K^-$ is a non-nucleophilic counter ion; and letter b is equal to 2 or 3.

Examples of the alkyl group represented by $R^{30}$ include methyl, ethyl, propyl, butyl, cyclohexyl, 2-oxocyclohexyl, norbornyl, and adamantyl. Exemplary aryl groups are phenyl; alkoxyphenyl groups such as p-methoxyphenyl, m-methoxyphenyl, o-methoxyphenyl, ethoxyphenyl, p-tert-butoxyphenyl, and m-tert-butoxyphenyl; and alkyl phenyl groups such as 2-methylphenyl, 3-methylphenyl, 4-methylphenyl, ethylphenyl, 4-tert-butylphenyl, 4-butylphenyl, and dimethylphenyl. Exemplary aralkyl groups are benzyl and phenethyl. Examples of the non-nucleophilic counter ion represented by $K^-$ include halide ions such as chloride and bromide ions; fluoroalkylsulfonate ions such as triflate, 1,1,1-trifluoroethanesulfonate, and nonafluorobutanesulfonate; arylsulfonate ions such as tosylate, benzenesulfonate, 4-fluorobenzenesulfonate, and 1,2,3,4,5-pentafluorobenzenesulfonate; and alkylsulfonate ions such as mesylate and butanesulfonate.

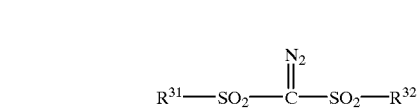

(9)

$R^{31}$ and $R^{32}$ are normal, branched or cyclic alkyl groups of 1 to 12 carbon atoms which may be halogenated, aryl groups of 6 to 12 carbon atoms which may be halogenated, or aralkyl groups of 7 to 12 carbon atoms.

Examples of the alkyl group represented by $R^{31}$ and $R^{32}$ include methyl, ethyl, propyl, butyl, amyl, cyclopentyl, cyclohexyl, norbornyl, and adamantyl. Examples of the halogenated alkyl group include trifluoromethyl, 1,1,1-trifluoroethyl, 1,1,1-trichloroethyl, and nonafluorobutyl. Examples of the aryl group include phenyl; alkoxyphenyl groups such as p-methoxyphenyl, m-methoxyphenyl, o-methoxyphenyl, ethoxyphenyl, p-tert-butoxyphenyl, and m-tert-butoxyphenyl; and alkylphenyl groups such as 2-methylphenyl, 3-methylphenyl, 4-methylphenyl, ethylphenyl, 4-tert-butylphenyl, 4-butylphenyl, and dimethylphenyl. Exemplary halogenated aryl groups are fluorobenzene, chlorobenzene, and 1,2,3,4,5-pentafluorobenzene. Exemplary aralkyl groups are benzyl and phenethyl.

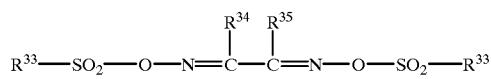

(10)

$R^{33}$, $R^{34}$ and $R^{35}$ are normal, branched or cyclic alkyl groups of 1 to 12 carbon atoms which may be halogenated, aryl groups of 6 to 12 carbon atoms which may be halogenated, or aralkyl groups of 7 to 12 carbon atoms. Alternatively, $R^{34}$ and $R^{35}$, taken together, form a cyclic structure with the proviso that $R^{34}$ and $R^{35}$ each are a normal or branched alkylene group of 1 to 6 carbon atoms when they form a cyclic structure.

Examples of the alkyl, halogenated alkyl, aryl, halogenated aryl, and aralkyl groups represented by $R^{33}$, $R^{34}$ and $R^{35}$ are the same as described for $R^{31}$ and $R^{32}$. Examples of the alkylene group represented by $R^{34}$ and $R^{35}$ include methylene, ethylene, propylene, butylene, and hexylene.

Typical examples of the photoacid generator (C) are:
onium salts such as
diphenyliodonium trifluoromethanesulfonate,
(p-tert-butoxyphenyl)phenyliodonium trifluoromethanesulfonate,
diphenyliodonium p-toluenesulfonate,
(p-tert-butoxyphenyl)phenyliodonium p-toluenesulfonate,
triphenylsulfonium trifluoromethanesulfonate,
(p-tert-butoxyphenyl)diphenylsulfonium trifluoromethanesulfonate,
bis(p-tert-butoxyphenyl)phenylsulfonium trifluoromethanesulfonate,
tris(p-tert-butoxyphenyl)sulfonium trifluoromethanesulfonate,
triphenylsulfonium p-toluenesulfonate,
(p-tert-butoxyphenyl)diphenylsulfonium p-toluenesulfonate,
bis(p-tert-butoxyphenyl)phenylsulfonium p-toluenesulfonate,
tris(p-tert-butoxyphenyl)sulfonium p-toluenesulfonate,
triphenylsulfonium nonafluorobutanesulfonate,
triphenylsulfonium butanesulfonate,
trimethylsulfonium trifluoromethanesulfonate,
trimethylsulfonium p-toluenesulfonate,
cyclohexylmethyl(2-oxocyclohexyl)sulfonium trifluoromethanesulfonate,
cyclohexylmethyl(2-oxocyclohexyl)sulfonium p-toluenesulfonate,
dimethylphenylsulfonium trifluoromethanesulfonate,
dimethylphenylsulfonium p-toluenesulfonate,
dicyclohexylphenylsulfonium trifluoromethanesulfonate, and
dicyclohexylphenylsulfonium p-toluenesulfonate;
diazomethane derivatives such as bis(benzenesulfonyl) diazomethane, bis(p-toluenesulfonyl)diazomethane, bis(xylenesulfonyl)diazomethane, bis(cyclohexylsulfonyl)diazomethane, bis(cyclopentylsulfonyl)diazomethane, bis(n-butylsulfonyl)diazomethane, bis(isobutylsulfonyl) diazomethane, bis(sec-butylsulfonyl)diazomethane, bis(n-propylsulfonyl)diazomethane, bis(isopropylsulfonyl)diazomethane, bis(tert-butylsulfonyl)diazomethane, bis(n-amylsulfonyl) diazomethane, bis(isoamylsulfonyl)diazomethane, bis(sec-amylsulfonyl)diazomethane, bis(tert-amylsulfonyl)diazomethane, 1-cyclohexylsulfonyl-1-(tert-butylsulfonyl)diazomethane, 1-cyclohexylsulfonyl-1-(tert-amylsulfonyl) diazomethane, and 1-tert-amylsulfonyl-1-(tert-butylsulfonyl)diazomethane;

glyoxime derivatives such as bis-o-(p-toluenesulfonyl)-α-dimethylglyoxime, bis-o-(p-toluenesulfonyl)-α-x-diphenylglyoxime, bis-o-(p-toluenesulfonyl)-α-x-dicyclohexylglyoxime, bis-o-(p-toluenesulfonyl)-2,3-pentanedioneglyoxime, bis-o-(p-toluenesulfonyl)-2-methyl-3,4-pentanedioneglyoxime, bis-o-(n-butanesulfonyl)-α-dimethylglyoxime, bis-o-(n-butanesulfonyl)-α-diphenylglyoxime, bis-o-(n-butanesulfonyl)-α-dicyclohexylglyoxime, bis-o-(n-butanesulfonyl)-2,3-pentanedioneglyoxime, bis-o-(n-butanesulfonyl)-2-methyl-3,4-pentanedioneglyoxime, bis-o-(methanesulfonyl)-α-dimethylglyoxime, bis-o-(trifluoromethanesulfonyl)-α-dimethyl-glyoxime, bis-o-(1,1,1-trifluoroethanesulfonyl)-α-dimethylglyoxime, bis-o-(tert-butanesulfonyl)-α-dimethylglyoxime, bis-o-(perfluorooctanesulfonyl)-α-dimethylglyoxime, bis-o-(cyclohexanesulfonyl)-α-dimethylglyoxime, bis-o-(benzenesulfonyl)-α-dimethylglyoxime, bis-o-(p-fluorobenzene-sulfonyl)-α-dimethylglyoxime, bis-o-(p-tert-butylbenzenesulfonyl)-α-dimethylglyoxime, bis-o-(xylenesulfonyl)-αdimethylglyoxime, and bis-o-(camphorsulfonyl)-α-dimethyl-glyoxime;

β-ketosulfone derivatives such as 2-cyclohexylcarbonyl-2-(p-toluenesulfonyl)propane and 2-isopropylcarbonyl-2-(p-toluenesulfonyl)propane;

disulfone derivatives such as diphenyl disulfone and dicyclohexyl disulfone;

nitrobenzyl sulfonate derivatives such as 2,6-dinitrobenzyl p-toluenesulfonate and 2,4-dinitrobenzyl p-toluenesulfonate;

sulfonate ester derivatives such as 1,2,3-tris(methane-sulfonyloxy)benzene, 1,2,3-tris(trifluoromethanesulfonyloxy)benzene, and 1,2,3-tris (p-toluenesulfonyloxy)benzene; and imide-yl sulfonates such as phthalimide-yl triflate, phthalimide-yl tosylate, 5-norbornene-2,3-dicarboxyimide-yl triflate, 5-norbornene-2,3-dicarboxyimide-yl tosylate, and 5-norbornene-2,3-dicarboxyimide-yl n-butylsulfonate.

Preferred among these are onium salts such as triphenyl-sulfonium trifluoromethanesulfonate, (p-tert-butoxyphenyl)diphenylsulfonium trifluoromethanesulfonate, tris(p-tert-butoxyphenyl) sulfonium trifluoromethanesulfonate, triphenylsulfonium p-toluenesulfonate, (p-tert-butoxyphenyl) diphenylsulfonium p-toluenesulfonate, and tris(p-tert-butoxyphenyl)sulfonium p-toluenesulfonate; diazomethane derivatives such as bis(benzenesulfonyl) diazomethane, bis(p-toluenesulfonyl)diazomethane, bis-(cyclohexylsulfonyl)diazomethane, bis(n- butylsulfonyl)diazomethane, bis(isobutylsulfonyl) diazomethane, bis(sec-butylsulfonyl)diazomethane, bis (n-propylsulfonyl)diazomethane, bis (isopropylsulfonyl)diazomethane, and bis(tert-butylsulfonyl)diazomethane; and glyoxime derivatives such as bis-o-(p-toluenesulfonyl)-α-dimethylglyoxime and bis-o-(n-butanesulfonyl)-α-methylglyoxime. It is noted that the photoacid generators mentioned above may be used alone or in admixture of two or more. The onium salts are effective for improving rectangularity while the diazomethane derivatives and glyoxime derivatives are effective for reducing standing wave. A combination of an onium salt with a diazomethane or glyoxime derivative allows for finer profile adjustment.

Desirably, the photoacid generator is added in an amount of about 0.5 to 15 parts, especially about 1 to 8 parts by weight per 100 parts by weight of the base resin. Sensitivity would be low with less than 0.5 part of the photoacid generator. More than 15 parts of the photoacid generator would lower an alkali dissolution rate to detract from resolution. Additionally heat resistance lowers because monomeric components become excessive.

Component (D) is another base resin in the form of a high molecular weight compound or polymer different from the crosslinked polymer defined as component (B). More preferably, component (D) is a polymer comprising recurring units of the following general formula (11) and having a weight average molecular weight of 3,000 to 300,000.

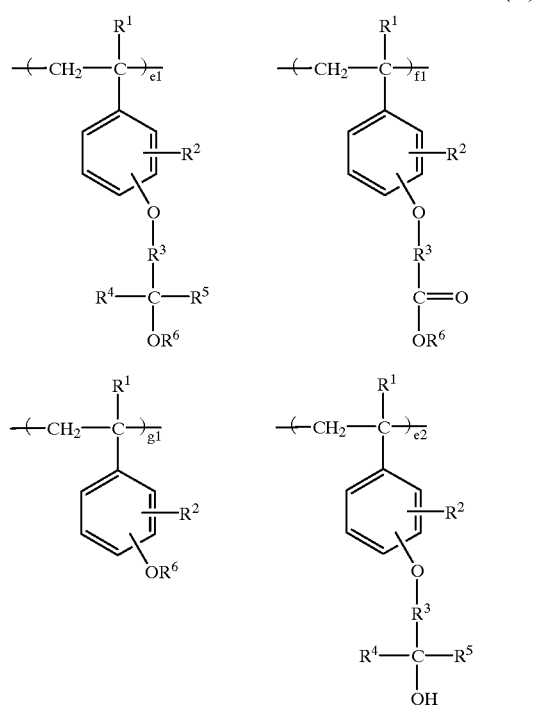

(11)

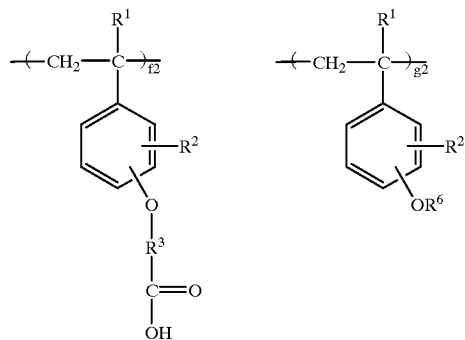

In formula (11), $R^1$ to $R^6$ are as defined above. Letters e1, f1, g1, e2 and f2 each are 0 or a positive number, and g2 is a positive number satisfying e1+f1+g1+e2+f2+g2=1. Their ratios are preferably $0 \leq e1+f1+g1 \leq 0.8$, and more preferably $0.1 \leq e1+f1+g1 \leq 0.6$. If the proportion of (e1+f1+g1) to the total (e1+f1+g1+e2+f2+g2) is more than 0.8 or equal to 0, then the contrast between alkali dissolution rates would lower to detract from resolution. By properly selecting the values of e1, f1, g1, e2, f2 and g2 within the above-defined range, the size and shape of a resist pattern can be controlled as desired.

The polymer has a weight average molecular weight (Mw) of 3,000 to 300,000, preferably 5,000 to 30,000. With Mw<3,000, a resist composition is less resistant to heat. With Mw>300,000, a resist composition becomes low in alkali dissolution and hence, resolution.

In the base resin as component (D), a wide molecular weight dispersity (Mw/Mn) means that there are present low molecular weight polymers and high molecular weight polymers. If low molecular weight polymers are predominant, heat resistance would be poor. If high molecular weight polymers are predominant, which means the presence of less alkali soluble components, a footing phenomenon occurs after pattern formation. As the pattern rule becomes finer, the influence of molecular weight and its dispersity becomes more significant. In order to provide a resist composition suitable for processing to fine pattern dimensions, the base resin is preferably a monodisperse polymer having a dispersity of 1.0 to 2.5, especially 1.0 to 1.5.

Preferably the base resin (D) is blended with the base resin (B) in the form of a crosslinked polymer in a weight ratio of from 0:100 to 90:10, more preferably from 0:100 to 50:50. If the base resin (D) is blended in excess of this weight ratio range relative to the base resin (B), the desired effect of the crosslinked polymer as base resin (B) would be somewhat lost.

In the resist composition of the invention, a dissolution regulator may be added as component (E).

The dissolution regulator (E) is a compound having an average molecular weight of 100 to 1,000, preferably 150 to 800 and at least two phenolic hydroxyl groups in a molecule, the hydrogen atom of the phenolic hydroxyl group being replaced by an acid labile group in an average proportion of 0% to 100% of the entire phenolic hydroxyl groups. The percent average replacement of the hydrogen atom of phenolic hydroxyl group by an acid labile group is 0 to 100 mol %, preferably 30 to 80 mol % of the entire phenolic hydroxyl groups.

The compound having at least two phenolic hydroxyl groups in a molecule as dissolution regulator (E) is exemplified by compounds of the following general formulae (i) to (xi):

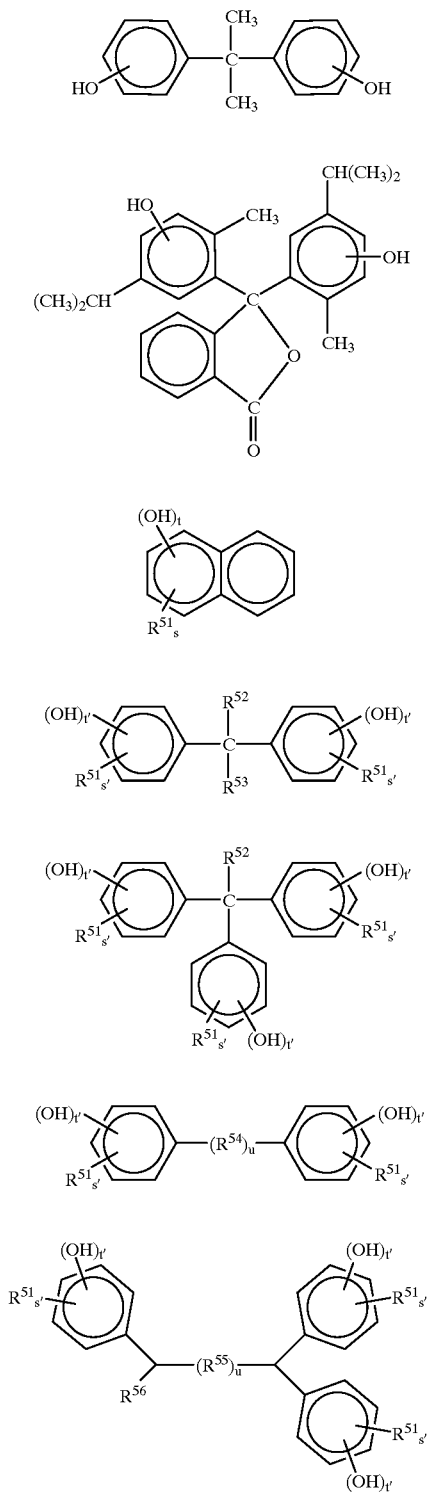

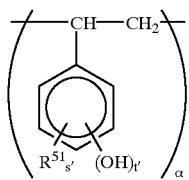

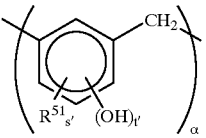

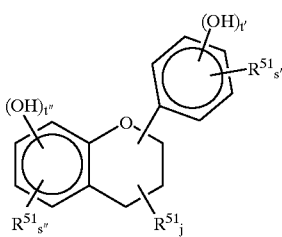

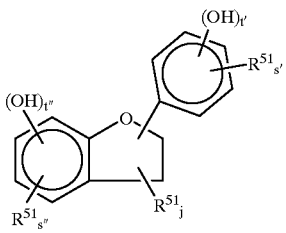

In the formulae, $R^{51}$ and $R^{52}$ are independently a hydrogen atom or normal or branched alkyl or alkenyl group having 1 to 8 carbon atoms. $R^{53}$ is a hydrogen atom, normal or branched alkyl or alkenyl group having 1 to 8 carbon atoms, or $-(R^{57})_h-COOH$. $R^{54}$ is a group $-(CH_2)_i-$ wherein i is 2 to 10, arylene group having 6 to 10 carbon atoms, carbonyl group, sulfonyl group, oxygen atom or sulfur atom. $R^{55}$ is an alkylene group having 1 to 10 carbon atoms, arylene group having 6 to 10 carbon atoms, carbonyl group, sulfonyl group, oxygen atom or sulfur atom. $R^{56}$ is a hydrogen atom, normal or branched alkyl group having 1 to 8 carbon atoms, alkenyl group, hydroxyl-substituted phenyl group or hydroxyl-substituted naphthyl group. $R^{57}$ is a normal or branched alkylene group having 1 to 10 carbon atoms. Letter j is an integer of 0 to 5, u and h each are 0 or 1, and s, t, s', t', s", and t" are numbers satisfying s+t=8, s'+t'=5, and s"+t"=4 such that at least one hydroxyl group is attached to each phenyl skeleton. α is such a number that the compound of formula (viii) or (ix) may have a molecular weight of 100 to 1,000.

Exemplary groups represented by $R^{51}$ and $R^{52}$ are hydrogen, methyl, ethyl, propyl, butyl, ethynyl, and cyclohexyl groups. Exemplary groups represented by $R^{53}$ are as exemplified for $R^{51}$ and $R^{52}$ as well as —COOH and —CH$_2$COOH. Exemplary groups represented by $R^{54}$ are ethylene, phenylene, carbonyl, and sulfonyl groups, oxygen and sulfur atoms. Exemplary groups represented by $R^{55}$ are methylene and as exemplified for $R^{54}$. Exemplary groups represented by $R^{56}$ are hydrogen, methyl, ethyl, propyl, butyl, ethynyl, cyclohexyl, and hydroxyl-substituted phenyl and naphthyl groups.

The acid labile group in the dissolution regulator includes groups of formulae (5) and (6), tert-alkyl groups of 4 to 20 carbon atoms, trialkylsilyl groups whose alkyl groups each have 1 to 6 carbon atoms, and oxoalkyl groups of 4 to 20 carbon atoms.

The dissolution regulator in the form of a compound whose phenolic hydroxyl group is partially replaced by an acid labile group is preferably blended in the resist composition in an amount of 0 to about 50 parts, more preferably about 5 to 50 parts, most preferably 10 to 30 parts by weight per 100 parts by weight of the base resin. At least 5 parts of the dissolution regulator would be necessary to be effective for improving resolution whereas more than 50 parts would induce pattern thinning and detract from resolution.

The dissolution regulator mentioned above can be synthesized by chemically reacting an acid labile group with a compound having a phenolic hydroxyl group as in the preparation of the base resin.

As dissolution regulator (E), a compound having a weight average molecular weight of more than 1,000 to 3,000 and a phenolic hydroxyl group in a molecule wherein the hydrogen atom of the phenolic hydroxyl group being partially replaced by an acid labile group in an average proportion of 0% to 60% may be blended in addition to or instead of the above-mentioned compound. This compound is referred to as second compound or dissolution regulator.

The second compound in which the hydrogen atom of a phenolic hydroxyl group is partially replaced by an acid labile group is preferably selected from compounds comprising recurring units of the following general formula (12) and having a weight average molecular weight of more than 1,000 to 3,000.

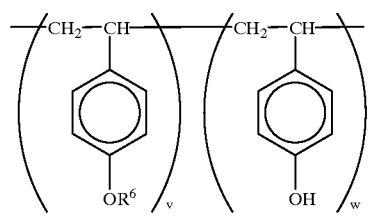

In formula (12), $R^6$ is an acid labile group, letters v and w are numbers satisfying $0 \leq v/(v+w) \leq 0.6$.

The acid labile group in the second dissolution regulator includes groups of formulae (5) and (6), tert-alkyl groups of 4 to 20 carbon atoms, trialkylsilyl groups whose alkyl groups each have 1 to 6 carbon atoms, and oxoalkyl groups of 4 to 20 carbon atoms.

The blending amount of the first and second dissolution regulators combined is preferably 0 to 50 parts, more preferably 0 to 30 parts, especially 1 to 30 parts by weight per 100 parts by weight of the base resin.

The second dissolution regulator can be synthesized by chemically reacting an acid labile group with a compound having a phenolic hydroxyl group as in the preparation of the base resin.

In the resist composition of the invention, a basic compound (F) is blended. The basic compound is preferably a compound which can suppress the diffusion rate at which the acid generated from the photoacid generator diffuses into a resist coating. The blending of such a basic compound suppresses the diffusion rate of acid in a resist coating to improve resolution, suppresses a change of sensitivity after exposure, and mitigates substrate and environment dependency, achieving improvements in exposure latitude and pattern profile.

Included in the basic compound are primary, secondary and tertiary aliphatic amines, hybrid amines, aromatic amines, heterocyclic amines, carboxyl-bearing nitrogenous compounds, sulfonyl-bearing nitrogenous compounds, hydroxyl-bearing nitrogenous compounds, hydroxyphenyl-bearing nitrogenous compounds, alcoholic nitrogenous compounds, amide derivatives, and imide derivatives.

Examples of the primary aliphatic amine include ammonia, methylamine, ethylamine, n-propylamine, isopropylamine, n-butylamine, iso-butylamine, sec-butylamine, tert-butylamine, pentylamine, tert-amylamine, cyclopentylamine, hexylamine, cyclohexylamine, heptylamine, octylamine, nonylamine, decylamine, dodecylamine, cetylamine, methylenediamine, ethylenediamine, and tetraethylenepentamine. Examples of the secondary aliphatic amine include dimethylamine, diethylamine, di-n-propylamine, di-iso-propylamine, di-n-butylamine, di-iso-butylamine, di-sec-butylamine, dipentylamine, dicyclopentylamine, dihexylamine, dicyclohexylamine, diheptylamine, dioctylamine, dinonylamine, didecylamine, didodecylamine, dicetylamine, N,N-dimethylmethylenediamine, N,N-dimethylethylenediamine, and N,N-dimethyltetraethylenepentamine. Examples of the tertiary aliphatic amine include trimethylamine, triethylamine, tri-n-propylamine, tri-iso-propylamine, tri-n-butylamine, tri-iso-butylamine, tri-sec-butylamine, tripentylamine, tricyclopentylamine, trihexylamine, tricyclohexylamine, triheptylamine, trioctylamine, trinonylamine, tridecylamine, tridodecylamine, tricetylamine, N,N,N',N'-tetramethylmethylenediamine, N,N,N',N'-tetramethylethylenediamine, and N,N,N',N'-tetramethyltetraethylenepentamine.

Examples of the hybrid amine include dimethylethylamine, methylethylpropylamine, benzylamine, phenethylamine, and benzyldimethylamine. Examples of the aromatic and heterocyclic amines include aniline derivatives (e.g., aniline, N-methylaniline, N-ethylaniline, N-propylaniline, N,N-dimethylaniline, 2-methylaniline, 3-methylaniline, 4-methylaniline, ethylaniline, propylaniline, trimethylaniline, 2-nitroaniline, 3-nitroaniline, 4-nitroaniline, 2,4-dinitroaniline, 2,6-dinitroaniline, 3,5-dinitroaniline, and N,N-dimethyltoluidine), diphenyl(p-tolyl)amine, methyldiphenylamine, triphenylamine, phenylenediamine, naphthylamine, diaminonaphthalene, pyrrole derivatives (e.g., pyrrole, 2H-pyrrole, 1-methylpyrrole, 2,4-dimethylpyrrole, 2,5-dimethylpyrrole, and N-methylpyrrole), oxazole derivatives (e.g., oxazole and isooxazole), thiazole derivatives (e.g., thiazole and isothiazole), imidazole derivatives (e.g., imidazole, 4-methylimidazole, and 4-methyl-2-phenylimidazole), pyrazole derivatives, furazane derivatives, pyrroline derivatives (e.g., pyrroline and 2-methyl-1-pyrroline), pyrrolidine derivatives (e.g., pyrrolidine, N-methylpyrrolidine, pyrrolidinone, and N-methylpyrrolidone), imidazoline derivatives, imidazolidine derivatives, pyridine derivatives (e.g., pyridine, methylpyridine, ethylpyridine, propylpyridine, butylpyridine, 4-(1-butylpentyl)pyridine, dimethylpyridine, trimethylpyridine, triethylpyridine, phenylpyridine, 3-methyl-2-phenylpyridine, 4-tert-butylpyridine, diphenylpyridine, benzylpyridine, methoxypyridine, butoxypyridine, dimethoxypyridine, 1-methyl-2-pyridone, 4-pyrrolidinylpyridine, 1-methyl-4-phenylpyridine, 2-(1-ethylpropyl)pyridine, aminopyridine, and dimethylaminopyridine), pyridazine derivatives, pyrimidine derivatives, pyrazine derivatives, pyrazoline derivatives, pyrazolidine derivatives, piperidine derivatives, piperazine derivatives, morpholine derivatives, indole derivatives, isoindole derivatives, 1H-indazole derivatives, indoline derivatives, quinoline derivatives (e.g., quinoline and 3-quinolinecarbonitrile), isoquinoline derivatives, cinnoline derivatives, quinazoline derivatives, quinoxaline derivatives, phthalazine derivatives, purine derivatives, pteridine derivatives, carbazole derivatives, phenanthridine derivatives, acridine derivatives, phenazine derivatives, 1,10-phenanthroline derivatives, adenine derivatives, adenosine derivatives, guanine derivatives, guanosine derivatives, uracil derivatives, and uridine derivatives.

Examples of the carboxyl-bearing nitrogenous compound include aminobenzoic acid, indolecarboxylic acid, amino acid derivatives such as nicotinic acid, alanine, alginine, aspartic acid, glutamic acid, glycine, histidine, isoleucine, glycylleucine, leucine, methionine, phenylalanine, threonine, lysine, 3-aminopyrazine-2-carboxylic acid, and methoxyalanine. Examples of the sulfonyl-bearing nitrogenous compound include 3-pyridinesulfonic acid and pyridinium p-toluenesulfonate. Examples of the hydroxyl-bearing nitrogenous compound, hydroxyphenyl-bearing nitrogenous compound, and alcoholic nitrogenous compound include 2-hydroxypyridine, aminocresole, 2,4-quinoline diol, 3-indolemethanol hydrate, monoethanolamine, diethanolamine, triethanolamine, N-ethyldiethanolamine, N,N-diethylethanolamine, triisopropanolamine, 2,2'-iminodiethanol, 2-aminoethanol, 3-amino-1-propanol, 4-amino-1-butanol, 4-(2-hydroxyethyl)morpholine, 2-(2-hydroxyethyl)-pyridine, 1-(2-hydroxyethyl)piperazine, 1-[2-(2-hydroxy-ethoxy)ethyl]piperazine, piperidine ethanol, 1-(2-hydroxy-ethyl)pyrrolidine, 1-(2-hydroxyethyl)-2-pyrrolidinone, 3-piperidino-1,2-propane diol, 3-pyrrolidino-1,2-propane diol, 8-hydroxyjulolidine, 3-quinuclidinol, 3-tropanol, 1-methyl-2-pyrrolidine ethanol, 1-aziridine ethanol, N-(2-hydroxyethyl)phthalimide, and N-(2-hydroxyethyl)isonicotinamide. Examples of the amide derivative include formamide, N-methylformamide, N,N-dimethylformamide, acetamide, N-methylacetamide, N,N-dimethylacetamide, propionamide, and benzamide. Exemplary imide derivatives are phthalimide, succinimide, and maleimide.

Also included are basic compounds of the following general formulae (13) and (14).

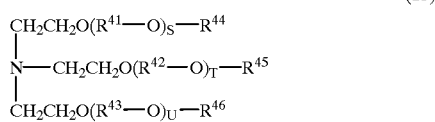

(13)

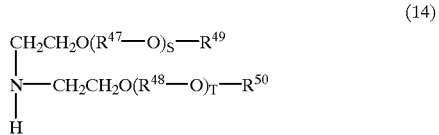

(14)

In formulae (13) and (14), $R^{41}$, $R^{42}$, $R^{43}$, $R^{47}$, and $R^{48}$ are independently normal, branched or cyclic alkylene groups of 1 to 20 carbon atoms. $R^{44}$, $R^{45}$, $R^{46}$, $R^{49}$, and $R^{50}$ are independently hydrogen, alkyl groups of 1 to 20 carbon atoms, or amino groups. Alternatively, $R^{44}$ and $R^{45}$, $R^{45}$ and $R^{46}$, $R^{44}$ and $R^{46}$, or $R^{44}$ and $R^{45}$ and $R^{46}$, and $R^{49}$ and $R^{50}$ taken together, may form a ring. S, T and U are integers of 0 to 20, with the proviso that hydrogen is excluded from $R^{44}$, $R^{45}$, $R^{46}$, $R^{49}$, and $R^{50}$ when S, T and U are equal to 0.

The alkylene groups represented by $R^{41}$, $R^{42}$, $R^{43}$, $R^{47}$, and $R^{48}$ are preferably those of 1 to 20 carbon atoms, more preferably 1 to 10 carbon atoms, most preferably 1 to 8 carbon atoms, such as methylene, ethylene, n-propylene, isopropylene, n-butylene, isobutylene, n-pentylene, isopentylene, hexylene, nonylene, decylene, cyclopentylene, and cyclohexylene. The alkyl groups represented by $R^{44}$, $R^{45}$, $R^{46}$, $R^{49}$, and $R^{50}$ are preferably those of 1 to 20 carbon atoms, more preferably 1 to 8 carbon atoms, most preferably 1 to 6 carbon atoms, while they may be normal, branched or cyclic. Exemplary alkyl groups are methyl, ethyl, n-propyl, isopropyl, n-butyl, isobutyl, tert-butyl, n-pentyl, isopentyl, hexyl, nonyl, decyl, dodecyl, tridecyl, cyclopentyl, and cyclohexyl. Where $R^{44}$ and $R^{45}$, $R^{45}$ and $R^{46}$, $R^{44}$ and $R^{46}$, $R^{44}$ and $R^{45}$ and $R^{46}$, or $R^{49}$ and $R^{50}$ form a ring, the ring preferably has 1 to 20 carbon atoms, more preferably 1 to 8 carbon atoms, most preferably 1 to 6 carbon atoms and may have branched therefrom an alkyl group of 1 to 6 carbon atoms, especially 1 to 4 carbon atoms. Each of S, T and U is an integer of 0 to 20, preferably 1 to 10, more preferably 1 to 8.

Illustrative examples of the compounds of formulae (13) and (14) include tris{2-(methoxymethoxy)ethyl}amine, tris{2-(methoxyethoxy)ethyl}amine, tris[2-{(2-methoxyethoxy)methoxy}ethyl]amine, tris{2-(2-methoxyethoxy)ethyl}amine, tris{2-(1-methoxyethoxy)ethyl}amine, tris{2-(1-ethoxyethoxy)ethyl}amine, tris{2-(1-ethoxypropoxy)ethyl}amine, tris[2-{(2-hydroxyethoxy)ethoxy}ethyl]amine, 4,7,13,16,21,24-hexaoxa-1,10-diazabicyclo[8.8.8]hexacosane, 4,7,13,18-tetraoxa-1,10-diazabicyclo[8.5.5]eicosane, 1,4,10,13-tetraoxa-7,16-diazabicyclooctadecane, 1-aza-12-crown-4,1-aza-15-crown-5, and 1-aza-18-crown-6.

Especially preferred basic compounds are tertiary amines, aniline derivatives, pyrrolidine derivatives, pyridine derivatives, quinoline derivatives, amic acid derivatives, nitrogenous compounds having a hydroxyl group, nitrogenous compounds having a hydroxyphenyl group, alcoholic nitrogenous compounds, amide derivatives, imide derivatives, tris{2-(methoxymethoxy)ethyl}amine, tris{2-(2-methoxyethoxy)ethyl}amine, tris[2-{(2-methoxyethoxy)methyl}-ethyl]amine, and 1-aza-15-crown-5.

The above-mentioned basic compounds may be used alone -1≦or in admixture of two or more. Preferably the basic compound is blended in an amount of 0 to about 2 parts, especially about 0.01 to 1 part by weight per 100 parts by weight of the base resin. More than 2 parts of the basic compound would adversely affect sensitivity.

Optional component (G) blended in the resist composition of the invention is an aromatic compound having a group ≡—C—COOH in a molecule. It may be at least one compound selected from the following classes I and II although the invention is not limited thereto.

Class I

Compounds of the following general formulae (15) to (24) wherein some or all of the hydrogen atoms of phenolic hydroxyl groups are replaced by —$R^{57}$—COOH wherein $R^{57}$ is a normal or branched alkylene group having 1 to 10 carbon atoms and the molar fraction of the phenolic hydroxyl group (C mol) in the molecule to the group ≡—C—COOH (D mol) is C/(C+D)=0.1 to 1.0.

Class II

Compounds of the following general formulae (25) to (26)

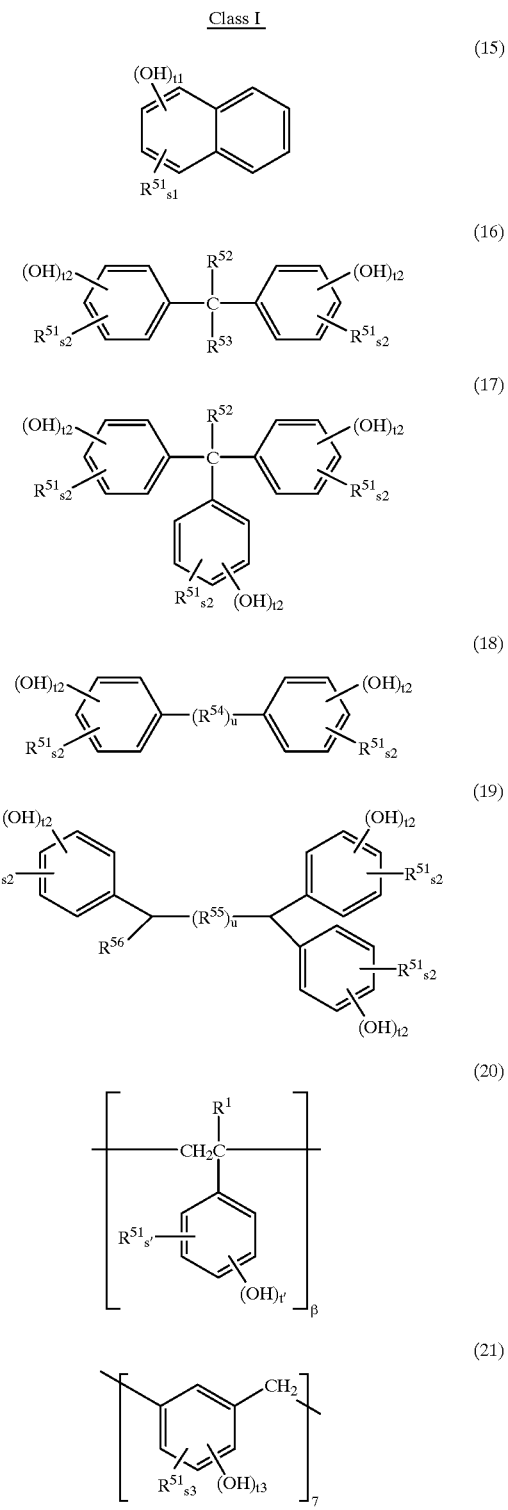

(15) (16) (17) (18) (19) (20) (21)

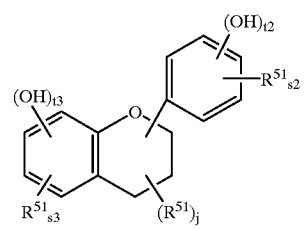

(22)

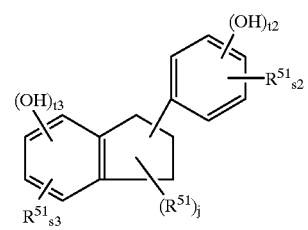

(23)

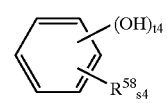

(24)

In the formulae, $R^1$ is a hydrogen atom or methyl group. $R^{51}$ and $R^{52}$ are independently a hydrogen atom or normal or branched alkyl or alkenyl group having 1 to 8 carbon atoms. $R^{53}$ is a hydrogen atom, normal or branched alkyl or alkenyl group having 1 to 8 carbon atoms, or —$(R^{57})_h$—COOR' wherein R' is a hydrogen atom or —$R^{57}$—COOH. $R^{54}$ is a group —$(CH_2)_i$—wherein i is 2 to 10, arylene group having 6 to 10 carbon atoms, carbonyl group, sulfonyl group, oxygen atom or sulfur atom. $R^{55}$ is an alkylene group having 1 to 10 carbon atoms, arylene group having 6 to 10 carbon atoms, carbonyl group, sulfonyl group, oxygen atom or sulfur atom. $R^{56}$ is a hydrogen atom, normal or branched alkyl group having 1 to 8 carbon atoms, alkenyl group, hydroxyl-substituted phenyl group or hydroxyl-substituted naphthyl group. $R^{57}$ is a normal or branched alkylene group having 1 to 10 carbon atoms. $R^{58}$ is a hydrogen atom, normal or branched alkyl or alkenyl group having 1 to 8 carbon atoms, or —$R^{57}$—COOH. Letter j is an integer of 0 to 5, u and h each are 0 or 1, and s1, t1, s2, t2, s3, t3, s4, and t4 are numbers satisfying s1+t1=8, s2+t2=5, s3+t3=4, and s4+t4=6 such that at least one hydroxyl group is attached to each phenyl skeleton. β is such a number that the compound of formula (20) may have a weight average molecular weight of 1,000 to 5,000. γ is such a number that the compound of formula (21) may have a weight average molecular weight of 1,000 to 10,000.

Class II

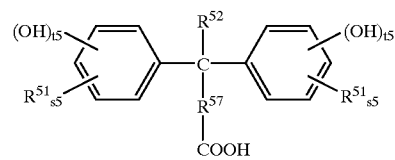

(25)

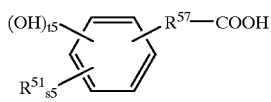
(26)
In the formulae, $R^{51}$, $R^{52}$, and $R^{57}$ are as defined above, and s5 and t5 are numbers satisfying $s5 \geq 0$, $t5 \geq 0$, and $s5+t5=5$.
Exemplary of component (G) are compounds of the following formulae IX-1 to IX-14 and X-1 to X-6.
[IX-1]
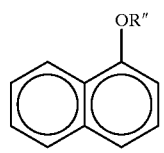
[IX-2]
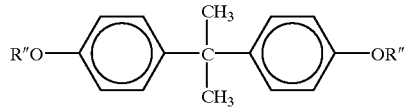
[IX-3]
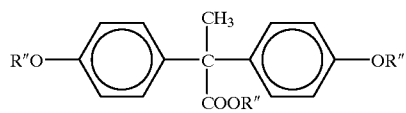
[IX-4]
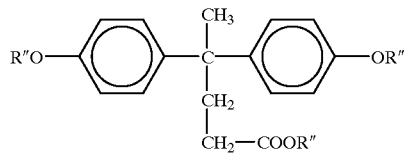
[IX-5]
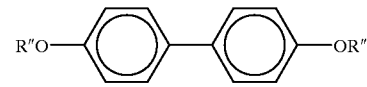
[IX-6]
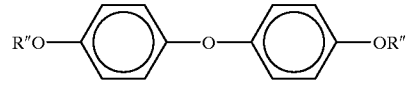
[IX-7]
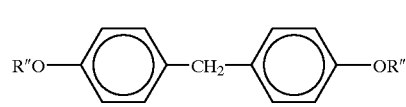
[IX-8]
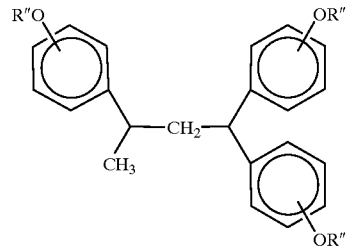
[IX-9]
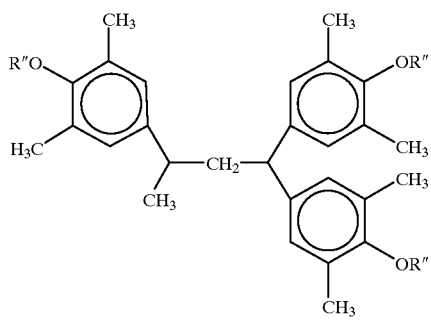
[IX-10]
[IX-11]
[IX-12]
[IX-13]
[IX-14]
R″ is a hydrogen atom or a group $CH_2COOH$. In each compound, 10 to 100 mol % of R″ is $CH_2COOH$. α and β are as defined above.
[X-1]
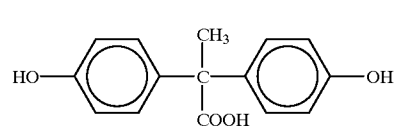

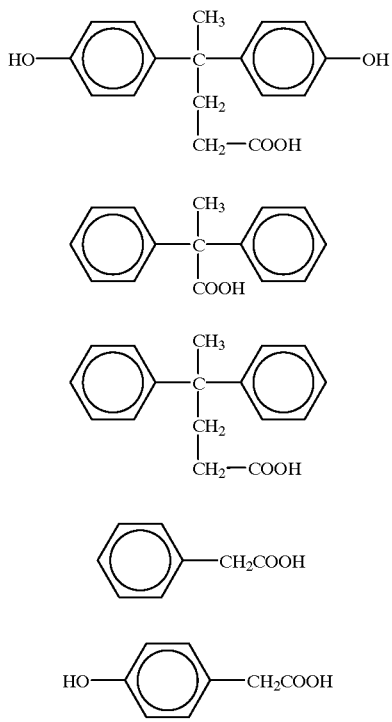

[X-2]

[X-3]

[X-4]

[X-5]

[X-6]

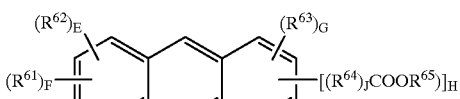

(27)

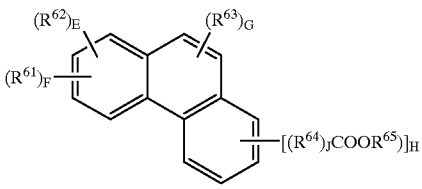

(28)

The aromatic compounds having a group ≡—C—COOH in a molecule may be used alone or in admixture of two or more. It is preferably blended in the resist composition in an amount of 0 to about 5 parts, preferably about 0.1 to 5 parts, more preferably about 1 to 3 parts by weight per 100 parts by weight of the base resin. More than 5 parts of the aromatic compound would adversely affect resolution.

In the resist composition of the invention, a UV absorber may be added as component (H). It is a compound having a molar absorptivity of up to 10,000 at a wavelength of 248 nm.

Exemplary UV absorbers are fused polycyclic hydrocarbon derivatives such as pentalene, indene, naphthalene, azulene, heptalene, biphenylene, indacene, fluorene, phenalene, phenanthrene, anthracene, fluoranthene, acephenanthrylene, aceanthrylene, triphenylene, pyrene, chrysene, naphthalene, pleiadene, picene, perylene, pentaphene, pentacene, benzophenanthrene, anthraquinone, anthrobenzanthrone, 2,7-dimethoxynaphthalene, 2-ethyl-9,10-dimethoxyanthracene, 9,10-dimethylanthracene, 9-ethoxyanthracene, 1,2-naphthoquinone, 9-fluorene, and compounds of the following formulae (27) and (28); fused heterocyclic derivatives such as thioxanthen-9-one, thianthrene, and dibenzothiophene; benzophenone derivatives such as 2,3,4-trihydroxybenzophenone, 2,3,4,4'-tetrahydroxybenzophenone, 2,4-dihydroxybenzophenone, 3,5-dihydroxybenzophenone, 4,4'-dihydroxybenzophenone, and 4,4'-bis(dimethylamino)benzophenone; and squalic acid derivatives such as squalic acid and dimethyl squalate.

In formulae (27) and (28), $R^{61}$ to $R^{63}$ are independently hydrogen or a normal or branched alkyl, normal or branched alkoxy, normal or branched alkoxyalkyl, normal or branched alkenyl or aryl group. $R^{64}$ is a substituted or unsubstituted divalent aliphatic hydrocarbon group which may contain an oxygen atom, a substituted or unsubstituted divalent alicyclic hydrocarbon group which may contain an oxygen atom, a substituted or unsubstituted divalent aromatic hydrocarbon group which may contain an oxygen atom, or an oxygen atom. $R^{65}$ is an acid labile group. Letter J is equal to 0 or 1. Letters E, F and G are 0 or integers of 1 to 9, H is a positive integer of 1 to 10 satisfying E+F+G+H≦10.

More particularly, $R^{61}$ to $R^{63}$ in formulae (27) and (28) are independently hydrogen or a normal or branched alkyl, normal or branched alkoxy, normal or branched alkoxyalkyl, normal or branched alkenyl or aryl group. The normal or branched alkyl groups are preferably those having 1 to 10 carbon atoms, for example, methyl, ethyl, n-propyl, isopropyl, n-butyl, sec-butyl, tert-butyl, hexyl, cyclohexyl and adamantyl groups, with the methyl, ethyl, isopropyl and tert-butyl groups being especially preferred. The normal or branched alkoxy groups are preferably those having 1 to 8 carbon atoms, for example, methoxy, ethoxy, propoxy, isopropoxy, n-butoxy, sec-butoxy, tert-butoxy, hexyloxy, and cyclohexyloxy groups, with the methoxy, ethoxy, isopropoxy, and tert-butoxy groups being especially preferred. The normal or branched alkoxyalkyl groups are preferably those having 2 to 10 carbon atoms, for example, methoxymethyl, 1-ethoxyethyl, 1-ethoxypropyl, 1-propoxyethyl, and 1-tertbutoxyethyl groups, with the methoxymethyl, 1-ethoxyethyl, 1-ethoxypropyl and 1-propoxyethyl groups being especially preferred. The normal or branched alkenyl groups are preferably those having 2 to 4 carbon atoms, for example, vinyl, propenyl, allyl, and butenyl groups. The aryl groups are preferably those having 6 to 14 carbon atoms, for example, phenyl, xylyl, toluyl, and cumenyl groups.

$R^{64}$ is a substituted or unsubstituted divalent aliphatic hydrocarbon group which may contain an oxygen atom, a substituted or unsubstituted divalent alicyclic hydrocarbon group which may contain an oxygen atom, a substituted or unsubstituted divalent aromatic hydrocarbon group which may contain an oxygen atom, or an oxygen atom. Letter J is equal to 0 or 1. Where J=0, the —$R^{64}$—linkage is a valence bond. The substituted or unsubstituted divalent aliphatic hydrocarbon groups which may contain an oxygen atom are preferably those having 1 to 10 carbon atoms, for example, methylene, ethylene, n-propylene, isopropylene, n-butylene, sec-butylene, —$CH_2O$—, —$CH_2CH_2O$—, and —$CH_2OCH_2$— groups, with the methylene, ethylene, —$CH_2O$—, and —$CH_2CH_2O$— being especially preferred.

The substituted or unsubstituted divalent alicyclic hydrocarbon groups which may contain an oxygen atom are preferably those having 5 to 10 carbon atoms, for example, 1,4-cyclohexylene, 2-oxacyclohexan-1,4-ylene, and 2-thiacyclohexan-1,4-ylene. The substituted or unsubstituted divalent aromatic hydrocarbon groups which may contain an oxygen atom include those having 6 to 14 carbon atoms, for example, o-phenylene, p-phenylene, 1,2-xylen-3,6-ylene, toluen-2,5-ylene, and 1-cumen-2,5-ylene groups, and arylalkylene groups having 6 to 14 carbon atoms, for example, —CH$_2$Ph—, —CH$_2$PhCH$_2$—, —OCH$_2$Ph—, and —OCH$_2$PhCH$_2$O— groups wherein Ph is phenylene.

$R^{65}$ is an acid labile group. The term acid labile group used herein is a carboxyl group which is replaced by at least one functional group decomposable in the presence of acid. The acid labile group is not particularly limited as long as it is decomposed in the presence of acid to release a functional group exhibiting alkali solubility. Preferred are groups of the following general formulae (29a), (29b), and (29c).

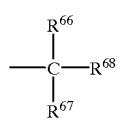

(29a)

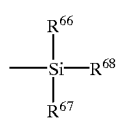

(29b)

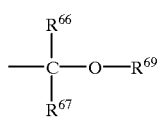

(29c)

In the formulae, $R^{66}$ to $R^{69}$ are independently hydrogen or a normal or branched alkyl, normal or branched alkoxy, normal or branched alkoxyalkyl, normal or branched alkenyl or aryl group, which may contain a carbonyl group in their chain. It is excluded that all of $R^{66}$ to $R^{69}$ are hydrogen. Alternatively, $R^{66}$ and $R^{67}$, taken together, may form a ring. $R^{69}$ is a normal or branched alkyl, normal or branched alkoxyalkyl, normal or branched alkenyl or aryl group, which may contain a carbonyl group in their chain. Alternatively, $R^{69}$ and $R^{66}$, taken together, may form a ring.

Examples of the normal or branched alkyl, normal or branched alkoxy, normal or branched alkoxyalkyl, normal or branched alkenyl, and aryl groups are as exemplified for $R^{61}$ to $R^{63}$.

The ring that $R^{66}$ forms with $R^{67}$ in formula (29a) includes those rings of 4 to 10 carbon atoms, for example, cyclohexylidene, cyclopentylidene, 3-oxycyclohexylidene, 3-oxo-4-oxacyclohexylidene, and 4-methylcyclohexylidene. The ring that $R^{66}$ forms with $R^{67}$ in formula (29b) includes those rings of 3 to 9 carbon atoms, for example, 1-silacyclohexylidene, 1-silacyclopentylidene, 3-oxo-1-silacyclopentylidene, and 4-methyl-1-silacyclopentylidene. The ring that $R^{69}$ forms with $R^{66}$ in formula (29c) includes those rings of 4 to 10 carbon atoms, for example, 2-oxacyclohexylidene, 2-oxacyclopentylidene, and 2-oxa-4-methylcyclohexylidene.

Examples of the group of formula (29a) include tertiary alkyl groups of 4 to 10 carbon atom-s such as tert-amyl, 1,1-dimethylethyl, 1,1-dimethylbutyl, 1-ethyl-1-methylpropyl, and 1,1-diethylpropyl, and 3-oxoalkyl groups such as 1,1-dimethyl-3-oxobutyl, 3-oxocyclohexyl, and 1-methyl-3-oxo-4-oxacyclohexyl groups.

Examples of the group of formula (29b) include trialkylsilyl groups of 3 to 10 carbon atoms, such as trimethylsilyl, ethyldimethylsilyl, dimethylpropylsilyl, diethylmethylsilyl, and triethylsilyl groups.

Examples of the group of formula (29c) include groups of 2 to 8 carbon atoms, such as 1-methoxymethyl, 1-methoxyethyl, 1-ethoxyethyl, 1-ethoxypropyl, 1-ethoxyisobutyl, 1-n-propoxyethyl, 1-tert-butoxyethyl, 1-n-butoxyethyl, 1-isobutoxyethyl, 1-tert-pentoxyethyl, 1-cyclohexyloxyethyl, 1-(2-n-butoxyethoxy)ethyl, 1-(2-ethylhexyl)oxyethyl, 1-{(4-acetoxymethyl)cyclohexylmethyloxy}ethyl, 1-{4-(tert-butoxycarbonyloxymethyl)cyclohexylmethyloxy}ethyl, 1-methoxy-1-methylethyl, 1-ethoxypropyl, dimethoxymethyl, diethoxymethyl, 2-tetrahydrofuranyl, and 2-tetrahydropyranyl groups.

In formulae (27) and (28), E, F and G are 0 or integers of 1 to 9, H is a positive integer of 1 to 10 satisfying E+F+G+H$\leq$10.

Preferred examples of the compounds of formulae (27) and (28) are compounds of the general formulae (30a) to (30j) shown below.

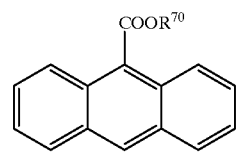

(30a)

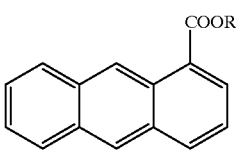

(30b)

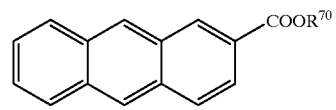

(30c)

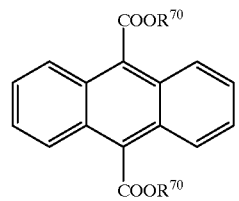

(30d)

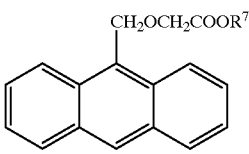

(30e)

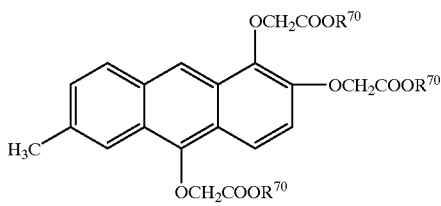
(30f)

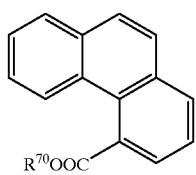
(30g)

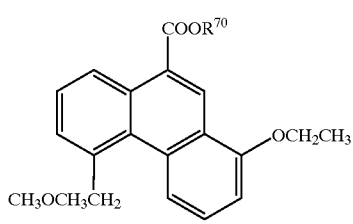
(30h)

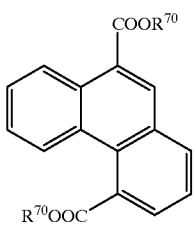
(30i)

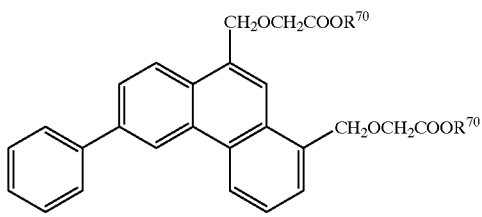
(30j)

In the formulae, $R^{70}$ is an acid labile group.

Other useful UV absorbers are diaryl sulfoxide derivatives such as bis(4-hydroxyphenyl) sulfoxide, bis(4-tert-butoxyphenyl) sulfoxide, bis(4-tert-butoxycarbonyloxyphenyl) sulfoxide, and bis[4-(1-ethoxyethoxy)phenyl] sulfoxide; diarylsulfone derivatives such as bis(4-hydroxyphenyl)sulfone, bis(4-tert-butoxyphenyl)sulfone, bis(4-tert-butoxycarbonyloxyphenyl)sulfone, bis[4-(1-ethoxyethoxy)phenyl]sulfone, and bis[4-(1-ethoxypropoxy)phenyl] sulfone; diazo compounds such as benzoquinonediazide, naphthoquinonediazide, anthraquinonediazide, diazofluorene, diazotetralone, and diazophenanthrone; and quinonediazide group-containing compounds such as complete or partial ester compounds between naphthoquinone-1,2-diazide-5-sulfonic acid chloride and 2,3,4-trihydroxybenzophenone and complete or partial ester compounds between naphthoquinone-1,2-diazide-4-sulfonic acid chloride and 2,4,4'-trihydroxybenzophenone.

Preferred UV absorbers are tert-butyl 9-anthracenecarboxylate, tert-amyl 9-anthracenecarboxylate, tert-methoxymethyl 9-anthracenecarboxylate, tert-ethoxyethyl 9-anthracenecarboxylate, tert-tetrahydropyranyl 9-anthracenecarboxylate, tert-tetrahydrofuranyl 9-anthracenecarboxylate, and partial ester compounds between naphthoquinone-1,2-diazide-5-sulfonic acid chloride and 2,3,4-trihydroxybenzophenone.

The amount of UV absorber (H) blended is preferably 0 to about 10 parts, more preferably about 0.5 to 10 parts, most preferably about 1 to 5 parts by weight per 100 parts by weight of the base resin.

In the resist composition of the invention, an acetylene alcohol derivative may be blended as component (I) for improving shelf stability. The acetylene alcohol derivative used herein is preferably selected from compounds of the following general formulae (31) and (32).

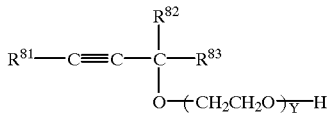
(31)

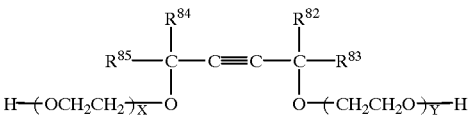
(32)

In formulae (31) and (32), $R^{81}$, $R^{82}$ $R^{83}$ $R^{84}$ and $R^{85}$ each are hydrogen or a normal, branched or cyclic alkyl group having 1 to 8 carbon atoms, X and Y are 0 or positive numbers satisfying $0 \leq X \leq 30$, $0 \leq Y \leq 30$, and $0 \leq X+Y \leq 40$.

Useful acetylene alcohol derivatives are commercially available under the trade name of Surfynol 61, Surfynol 82, Surfynol 104, Surfynol 104E, Surfynol 104H, Surfynol 104A, Surfynol TG, Surfynol PC, Surfynol 440, Surfynol 465, and Surfynol 485 from Air Products and Chemicals Inc. and Surfynol E1004 from Nisshin Chemical Industry K.K.

The acetylene alcohol derivative is preferably added in an amount of 0.01 to 2%, more preferably 0.02 to 1% by weight based on the resist composition. Less than 0.01% by weight of the acetylene alcohol derivative would be ineffective for improving coating and shelf stability whereas more than 2% by weight would result in a resist composition with low resolution.

The resist composition of the invention may further contain various additives, for example, a surface-active agent for facilitating coating. The amounts of such optional additives blended are conventional insofar as the objects of the invention are not impaired. Nonionic surfactants are preferred. Examples of the surfactant include perfluoroalkylpolyoxyethylene ethanols, fluorinated alkyl esters, perfluoroalkylamine oxides, and fluorinated organosiloxane compounds. Useful surfactants are commercially available under the trade name of Florade FC-430 and FC-431 from Sumitomo 3M K.K., Surflon S-141 and S-145 from Asahi Glass K.K., Unidine DS-401, DS-403 and DS-451 from Daikin Industry K.K., Megafac F-8151 from Dai-Nihon Ink Industry K.K., and X-70-092 and X-70-093 from Shin-Etsu Chemical Co., Ltd. Preferred surfactants are Florade FC-430 from Sumitomo 3M K.K. and X-70-093 from Shin-Etsu Chemical Co., Ltd.

Any well-known lithography may be used to form a resist pattern from a positive resist composition of the invention. For example, the resist composition is spin coated onto a silicon wafer and prebaked on a hot plate at a temperature of 60 to 150° C. for about 1 to 10 minutes, preferably 80 to 120° C. for 1 to 5 minutes. The resulting resist film is generally 0.5 to 2.0 µm thick. With a mask having a desired pattern placed above the resist film, the resist film is then exposed to actinic radiation having a wavelength of up to 300 nm such as deep-UV, excimer laser light, and X-ray or electron beam in an exposure dose of about 1 to 200 mJ/cm$^2$, preferably about 10 to 100 mJ/cm$^2$. The film is further baked on a hot plate at 60 to 150° C. for 1 to 5 minutes, preferably 80 to 120° C. for 1 to 3 minutes (post-exposure baking= PEB). Thereafter the resist film is developed with a developer in the form of an aqueous base solution, for example, 0.1 to 5%, preferably 2 to 3% aqueous solution of tetramethylammonium hydroxide (TMAH) for 0.1 to 3 minutes, preferably ½ to 2 minutes by a conventional technique such as dipping, puddling or spraying. In this way, a desired positive resist pattern is formed on the substrate. The chemically amplified positive resist composition of the invention is best suited for fine patterning with actinic radiation, especially radiation having a wavelength of 254 to 193 nm such as deep-UV, excimer laser light, and X-ray and electron beam. Outside the range, a failure to provide the desired pattern can occur.

The chemically amplified positive resist composition using the polymer of the invention as a base resin is sensitive to actinic radiation, has an improved sensitivity, resolution and plasma etching resistance, and produces a heat resistant resist pattern. The pattern is unlikely to overhang and dimensional control is improved. Owing to these advantages, the chemically amplified positive resist composition of the invention provides a resist material having less absorption, especially at the exposure wavelength of a KrF excimer laser. A fine pattern having a wall perpendicular to the substrate is easily formed. Thus the composition is suitable as a fine patterning material for the manufacture of ultra-LSIs.

EXAMPLE

Examples of the present invention are given below by way of illustration and not by way of limitation. The following abbreviations are used. Mw: weight average molecular weight Mn: number average molecular weight PHS: polyhydroxystyrene Synthesis Example 1

Polyhydroxystyrene, 100 g, was dissolved in 300 g of acetone, and 4. 6 g of potassium carbonate was added. With stirring, 3. 1 g of ethyl bromoacetate was added. Reaction was carried out for 4 hours at 60° C. whereupon 2.3 g of potassium carbonate was supplemented and stirring was continued for a further 2 hours. Heating was stopped and the reaction solution was allowed to cool down to room temperature. With stirring, 50 g of 1N sodium hydroxide was added and reaction was carried out for 2 hours at room temperature. With stirring, 30 g of acetic acid was added and reaction was carried out for a further one hour at room temperature. To the reaction mixture were added 500 g of ethyl acetate and 300 g of water, followed by separation. The ethyl acetate layer was washed twice with 300 g of water and then concentrated in vacuum. The residue was dissolved in 300 g of methanol and added dropwise to 20 liters of water whereupon a powdery solid precipitated. The solid was collected by filtration, washed with 20 liters of water, and dried in vacuum at 60° C. for 18 hours. On $^1$H-NMR analysis, it was identified to be a polymer in which 2.0 mol % of the hydrogen atoms of hydroxyl groups in polyhydroxystyrene were replaced by hydroxycarbonylmethyl groups.

The thus obtained partially hydroxycarbonylmethylated polyhydroxystyrene, 90 g, was dissolved in 180 g of N,N-dimethylformamide. With stirring under ice cooling, 49.5 g of triethylamine and then 2. 4 g of triethylene glycol di(1-chloroethyl) ether were added. Reaction was carried out for 30 minutes under ice cooling, 30.0 g of 1-chloroethyl ethyl ether was added, and reaction was carried out for a further 2 hours at room temperature. To the reaction mixture were added 500 g of ethyl acetate and 300 g of water, followed by separation. The ethyl acetate layer was washed twice with 300 g of water and then concentrated in vacuum. The residue was dissolved in 300 g of methanol and added dropwise to 20 liters of water whereupon a powdery solid precipitated. The solid was collected by filtration, washed with 20 liters of water, and dried in vacuum at 40° C. for 24 hours. On $^1$H—N MR analysis, it was identified to be a polymer in which 31.0 mol % of the hydrogen atoms of hydroxyl groups in polyhydroxystyrene were replaced by 1-ethoxyethyl groups, and the carboxyl group moieties which had been introduced in an amount of 2.0 mol % formed ester bonds with alcoholic hydroxyl groups of triethylene glycol di(1-hydroxyethyl) ether to provide crosslinking. This polymer is designated Polym. 1 whose rational formula is shown at the end of Synthesis Examples.

Synthesis Examples 2–4

By following the procedure of Synthesis Example 1, polymers represented by Polym. 2, Polym. 3, and Polym. 4 were obtained from polyhydroxystyrene.

Synthesis Example 5

Polyhydroxystyrene, 100 g, was dissolved in 300 g of acetone, and 4.6 g of potassium carbonate was added. With stirring, 3.4 g of 3-bromopropyl acetate was added. Reaction was carried out for 4 hours at 60° C. whereupon 2.3 g of potassium carbonate was supplemented and stirring was continued for a further 2 hours. Heating was stopped and the reaction solution was allowed to cool down to room temperature. With stirring, 50 g of 1N sodium hydroxide was added and reaction was carried out for 2 hours at room temperature. With stirring, 30 g of acetic acid was added and reaction was carried out for a further one hour at room temperature. To the reaction mixture were added 500 g of ethyl acetate and 300 g of water, followed by separation. The ethyl acetate layer was washed twice with 300 g of water and then concentrated in vacuum. The residue was dissolved in 300 g of methanol and added dropwise to 20 liters of water whereupon a powdery solid precipitated. The solid was collected by filtration, washed with 20 liters of water, and dried in vacuum at 60° C. for 18 hours. On $^1$H-NMR analysis, it was identified to be a polymer in which 2.0 mol % of the hydrogen atoms of hydroxyl groups in polyhydroxystyrene were replaced by hydroxypropyl groups.

The thus obtained partially hydroxypropylated polyhydroxystyrene, 90 g, was dissolved in 180 g of tetrahydrofuran. With stirring under ice cooling, 2.3 g of triethylene glycol divinyl ether and then 1.8 g of pyridinium p-toluenesulfonate were added. Reaction was carried out for 6 hours at room temperature, 46.5 g of triethylamine and then 30.0 g of 1-chloroethyl ethyl ether were added, and reaction was carried out for a further 2 hours at room temperature. To the reaction mixture were added 500 g of ethyl acetate and 300 g of water, followed by separation. The ethyl acetate layer was washed twice with 300 g of water and then concentrated in vacuum. The residue was dissolved in 300 g of methanol and added dropwise to 20 liters of water whereupon a powdery solid precipitated. The solid was collected by filtration, washed with 20 liters of water, and dried in vacuum at 40° C. for 24 hours. On $^1$H-NMR analysis, it was identified to be a polymer (Polym. 5) in which 31.0 mol % of the hydrogen atoms of hydroxyl groups in polyhydroxystyrene were replaced by 1-ethoxyethyl groups, and the alcoholic hydroxyl group moieties which had been introduced in an amount of 2.0 mol % formed ether bonds with alcoholic hydroxyl groups of triethylene glycol di(1-hydroxyethyl) ether to provide crosslinking.

Synthesis Example 6

Polyhydroxystyrene, 100 g, was dissolved in 300 g of acetone, and 4.6 g of potassium carbonate was added. With stirring, 3.1 g of ethyl bromoacetate was added. Reaction was carried out for 4 hours at 60° C. whereupon 2.3 g of potassium carbonate was supplemented and stirring was continued for a further 2 hours. Heating was stopped and the reaction solution was allowed to cool down to room temperature. With stirring, 50 g of 1N sodium hydroxide was added and reaction was carried out for 2 hours at room temperature. With stirring, 30 g of acetic acid was added and reaction was carried out for a further one hour at room temperature. To the reaction mixture were added 500 g of ethyl acetate and 300 g of water, followed by separation. The ethyl acetate layer was washed twice with 300 g of water and then concentrated in vacuum. The residue was dissolved in 300 g of methanol and added dropwise to 20 liters of water whereupon a powdery solid precipitated. The solid was collected by filtration, washed with 20 liters of water, and dried in vacuum at 60° C. for 18 hours. On $^1$H-NMR analysis, it was identified to be a polymer in which 2.0 mol % of the hydrogen atoms of hydroxyl groups in polyhydroxystyrene were replaced by hydroxycarbonylmethyl groups.

The thus obtained partially hydroxycarbonylmethylated polyhydroxystyrene, 90 g, was dissolved in 180 g of N,N-dimethylformamide. With stirring under ice cooling, 30.0 g of triethylamine and then 2.0 g of diethylene glycol di(1-chloroethyl) ether were added. Reaction was carried out for 30 minutes under ice cooling, 35.0 g of tert-butyl dicarbonate was added, and reaction was carried out for a further 2 hours at 40° C. After the reaction mixture was allowed to cool down to room temperature, 500 g of ethyl acetate and 300 g of water were added thereto, followed by separation. The ethyl acetate layer was washed twice with 300 g of water and then concentrated in vacuum. The residue was dissolved in 300 g of methanol and added dropwise to 20 liters of water whereupon a powdery solid precipitated. The solid was collected by filtration, washed with 20 liters of water, and dried in vacuum at 40° C. for 24 hours. On $^1$H-NMR analysis, it was identified to be a polymer (Polym. 6) in which 18.0 mol % of the hydrogen atoms of hydroxyl groups in polyhydroxystyrene were replaced by tert-butoxycarbonyl groups, and the carboxyl group moieties which had been introduced in an amount of 2.0 mol % formed ester bonds with alcoholic hydroxyl groups of diethylene glycol di(1-hydroxyethyl) ether to provide crosslinking.

Synthesis Example 7

By following the procedure of Synthesis Example 6, a polymer represented by Polym. 7 was obtained from polyhydroxystyrene.

Synthesis Example 8

Polyhydroxystyrene, 100 g, was dissolved in 300 g of acetone, and 4.6 g of potassium carbonate was added. With stirring, 1.7 g of 3-bromopropyl acetate and 1.6 g of ethyl bromoacetate were added. Reaction was carried out for 4 hours at 60° C. whereupon 2.3 g of potassium carbonate was supplemented and stirring was continued for a further 2 hours. Heating was stopped and the reaction solution was allowed to cool down to room temperature. With stirring, 50 g of 1N sodium hydroxide was added and reaction was carried out for 2 hours at room temperature. With stirring, 30 g of acetic acid was added and reaction was carried out for a further one hour at room temperature. To the reaction mixture were added 500 g of ethyl acetate and 300 g of water, followed by separation. The ethyl acetate layer was washed twice with 300 g of water and then concentrated in vacuum. The residue was dissolved in 300 g of methanol and added dropwise to 20 liters of water whereupon a powdery solid precipitated. The solid was collected by filtration, washed with 20 liters of water, and dried in vacuum at 60° C. for 18 hours. On $^1$H-NMR analysis, it was identified to be a polymer in which 1.0 mol % of the hydrogen atoms of hydroxyl groups in polyhydroxystyrene were replaced by hydroxypropyl groups and 1.0 mol % replaced by hydroxycarbonylmethyl groups.

The thus obtained partially hydroxypropylated polyhydroxystyrene, 90 g, was dissolved in 180 g of tetrahydrofuran. With stirring under ice cooling, 1.1 g of 1,4-cyclohexane dimethanol divinyl ether and then 1.8 g of pyridinium p-toluenesulfonate were added. Reaction was carried out for 6 hours at room temperature, 30.0 g of triethylamine, then 1.2 g of 1,4-cyclohexane dimethanol di(1-chloroethyl) ether and further 35.0 g of tert-butyl dicarbonate were added, and reaction was carried out for a further 2 hours at 40° C. After the reaction mixture was allowed to cool down to room temperature, 500 g of ethyl acetate and 300 g of water were added thereto, followed by separation. The ethyl acetate layer was washed twice with 300 g of water and then concentrated in vacuum. The residue was dissolved in 300 g of methanol and added dropwise to 20 liters of water whereupon a powdery solid precipitated. The solid was collected by filtration, washed with 20 liters of water, and dried in vacuum at 40° C. for 24 hours. On $^1$H-NMR analysis, it was identified to be a polymer (Polym. 8) in which 18.0 mol % of the hydrogen atoms of hydroxyl groups in polyhydroxystyrene were replaced by tert-butoxycarbonyl groups, and the alcoholic hydroxyl group moieties which had been introduced in an amount of 1.0 mol % and the carboxyl group moieties which had been introduced in an amount of 1.0 mol % respectively formed ether bonds and ester bonds with alcoholic hydroxyl groups of 1,4-cyclohexane dimethanol di(1-hydroxyethyl) ether to provide crosslinking.

Synthesis Example 9

Polyhydroxystyrene, 100 g, was dissolved in 300 g of acetone, and 4.6 g of potassium carbonate was added. With stirring, 3.1 g of ethyl bromoacetate was added. Reaction was carried out for 4 hours at 60° C. whereupon 2.3 g of potassium carbonate was supplemented and stirring was continued for a further 2 hours. Heating was stopped and the reaction solution was allowed to cool down to room temperature. With stirring, 50 g of 1N sodium hydroxide was added and reaction was carried out for 2 hours at room temperature. With stirring, 30 g of acetic acid was added and reaction was carried out for a further one hour at room temperature. To the reaction mixture were added 500 g of ethyl acetate and 300 g of water, followed by separation. The ethyl acetate layer was washed twice with 300 g of water and then concentrated in vacuum. The residue was dissolved in 300 g of methanol and added dropwise to 20 liters of water whereupon a powdery solid precipitated. The solid was collected by filtration, washed with 20 liters of water, and dried in vacuum at 60° C. for 18 hours. On $^1$H-NMR analysis, it was identified to be a polymer in which 2.0 mol % of the hydrogen atoms of hydroxyl groups in polyhydroxystyrene were replaced by hydroxycarbonylmethyl groups.

The thus obtained partially hydroxycarbonylmethylated polyhydroxystyrene, 90 g, was dissolved in 180 g of N,N-dimethylformamide. With stirring under ice cooling, 40.5 g of triethylamine and then 1.7 g of ethylene glycol di(1-chloroethyl) ether were added. Reaction was carried out for 30 minutes under ice cooling, 24.2 g of chlorotrimethylsilane was added, and reaction was carried out for a further 2 hours at room temperature. To the reaction mixture were added 500 g of ethyl acetate and 300 g of water, followed by separation. The ethyl acetate layer was washed twice with 300 g of water and then concentrated in vacuum. The residue was dissolved in 300 g of methanol and added dropwise to 20 liters of water whereupon a powdery solid precipitated. The solid was collected by filtration, washed with 20 liters of water, and dried in vacuum at 40° C. for 24 hours. On $^1$H-NMR analysis, it was identified to be a polymer (Polym. 9) in which 25.0 mol % of the hydrogen atoms of hydroxyl groups in polyhydroxystyrene were replaced by trimethylsilyl groups, and the carboxyl group moieties which had been introduced in an amount of 2.0 mol % formed ester bonds with alcoholic hydroxyl groups of ethylene glycol di(1-hydroxyethyl) ether to provide crosslinking.

Synthesis Example 10

Polyhydroxystyrene, 100 g, was dissolved in 300 g of acetone, and 4.6 g of potassium carbonate was added. With stirring, 3.1 g of ethyl bromoacetate was added. Reaction was carried out for 4 hours at 60° C. whereupon 2.3 g of potassium carbonate was supplemented and stirring was continued for a further 2 hours. Heating was stopped and the reaction solution was allowed to cool down to room temperature. With stirring, 50 g of 1N sodium hydroxide was added and reaction was carried out for 2 hours at room temperature. With stirring, 30 g of acetic acid was added and reaction was carried out for a further one hour at room temperature. To the reaction mixture were added 500 g of ethyl acetate and 300 g of water, followed by separation. The ethyl acetate layer was washed twice with 300 g of water and then concentrated in vacuum. The residue was dissolved in 300 g of methanol and added dropwise to 20 liters of water whereupon a powdery solid precipitated. The solid was collected by filtration, washed with 20 liters of water, and dried in vacuum at 60° C. for 18 hours. On $^1$H-NMR analysis, it was identified to be a polymer in which 2.0 mol % of the hydrogen atoms of hydroxyl groups in polyhydroxystyrene were replaced by hydroxycarbonylmethyl groups.

The thus obtained partially hydroxycarbonylmethylated polyhydroxystyrene, 90 g, was dissolved in 180 g of N,N-dimethylformamide. With stirring under ice cooling, 49.5 g of triethylamine and then 1.9 g of 1,4-butane diol di(1-chloroethyl) ether were added. Reaction was carried out for 30 minutes under ice cooling, 13.6 g of tert-butyl dicarbonate was added, and reaction was carried out for a further 2 hours at 40° C. After the reaction mixture was allowed to cool down, 23.2 g of 1-chloroethyl ethyl ether was added and reaction was carried out for 2 hours at room temperature. To the reaction mixture were added 500 g of ethyl acetate and 300 g of water, followed by separation. The ethyl acetate layer was washed twice with 300 g of water and then concentrated in vacuum. The residue was dissolved in 300 g of methanol and added dropwise to 20 liters of water whereupon a powdery solid precipitated. The solid was collected by filtration, washed with 20 liters of water, and dried in vacuum at 40° C. for 24 hours. On $^1$H-NMR analysis, it was identified to be a polymer (Polym. 10) in which 24.0 mol % of the hydrogen atoms of hydroxyl groups in polyhydroxystyrene were replaced by 1-ethoxyethyl groups, 7.0 mol % were replaced by tert-butoxycarbonyl groups, and the carboxyl group moieties which had been introduced in an amount of 2.0 mol % formed ester bonds with alcoholic hydroxyl groups of 1,4-butane diol di(1-hydroxyethyl) ether to provide crosslinking.

Synthesis Examples 11–12

By following the procedure of Synthesis Example 10, polymers represented by Polym. 11 and Polym. 12 were obtained from polyhydroxystyrene.

Synthesis Example 13

Polyhydroxystyrene, 100 g, was dissolved in 300 g of acetone, and 4.6 g of potassium carbonate was added. With stirring, 3.4 g of 3-bromopropyl acetate was added. Reaction was carried out for 4 hours at 60° C. whereupon 2.3 g of potassium carbonate was supplemented and stirring was continued for a further 2 hours. Heating was stopped and the reaction solution was allowed to cool down to room temperature. With stirring, 50 g of 1N sodium hydroxide was added and reaction was carried out for 2 hours at room temperature. With stirring, 30 g of acetic acid was added and reaction was carried out for a further one hour at room temperature. To the reaction mixture were added 500 g of ethyl acetate and 300 g of water, followed by separation. The ethyl acetate layer was washed twice with 300 g of water and then concentrated in vacuum. The residue was dissolved in 300 g of methanol and added dropwise to 20 liters of water whereupon a powdery solid precipitated. The solid was collected by filtration, washed with 20 liters of water, and dried in vacuum at 60° C. for 18 hours. On $^1$H-NMR analysis, it was identified to be a polymer in which 2.0 mol % of the hydrogen atoms of hydroxyl groups in polyhydroxystyrene were replaced by hydroxypropyl groups.

The thus obtained partially hydroxypropylated polyhydroxystyrene, 90 g, was dissolved in 180 g of tetrahydrofuran. With stirring under ice cooling, 2.2 g of 1,4-cyclohexane dimethanol divinyl ether and then 1.8 g of pyridinium p-toluenesulfonate were added. Reaction was carried out for 6 hours at room temperature, 46.5 g of triethylamine and then 13.6 g of tert-butyl dicarbonate were added, and reaction was carried out for a further 2 hours at 40° C. After the reaction mixture was allowed to cool down to room temperature, 23.2 g of 1-chloroethyl ethyl ether was added and reaction was carried out for 2 hours at room temperature. To the reaction mixture were added 500 g of ethyl acetate and 300 g of water, followed by separation. The ethyl acetate layer was washed twice with 300 g of water and then concentrated in vacuum. The residue was dissolved in 300 g of methanol and added dropwise to 20 liters of water whereupon a powdery solid precipitated. The solid was collected by filtration, washed with 20 liters of water, and dried in vacuum at 40° C. for 24 hours. On $^1$H-NMR analysis, it was identified to be a polymer (Polym. 13) in which 24.0 mol % of the hydrogen atoms of hydroxyl groups in polyhydroxystyrene were replaced by 1-ethoxyethyl groups, 7.0 mol % were replaced by tert-butoxycarbonyl groups, and the alcoholic hydroxyl group moieties which had been introduced in an amount of 2.0 mol % formed ether bonds with alcoholic hydroxyl groups of 1,4-cyclohexane dimethanol di(1-hydroxyethyl) ether to provide crosslinking.

Synthesis Example 14

Polyhydroxystyrene, 100 g, was dissolved in 300 g of acetone, and 4.6 g of potassium carbonate was added. With stirring, 3.1 g of ethyl bromoacetate was added. Reaction was carried out for 4 hours at 60° C. whereupon 2.3 g of potassium carbonate was supplemented and stirring was continued for a further 2 hours. Heating was stopped and the reaction solution was allowed to cool down to room temperature. With stirring, 50 g of 1N sodium hydroxide was added and reaction was carried out for 2 hours at room temperature. With stirring, 30 g of acetic acid was added and reaction was carried out for a further one hour at room temperature. To the reaction mixture were added 500 g of ethyl acetate and 300 g of water, followed by separation. The ethyl acetate layer was washed twice with 300 g of water and then concentrated in vacuum. The residue was dissolved in 300 g of methanol and added dropwise to 20 liters of water whereupon a powdery solid precipitated. The solid was collected by filtration, washed with 20 liters of water, and dried in vacuum at 60° C. for 18 hours. On $^1$H-NMR analysis, it was identified to be a polymer in which 2.0 mol % of the hydrogen atoms of hydroxyl groups in polyhydroxystyrene were replaced by hydroxycarbonylmethyl groups.

The thus obtained partially hydroxycarbonylmethylated polyhydroxystyrene, 90 g, was dissolved in 180 g of N,N-dimethylformamide. With stirring under ice cooling, 39.0 g of triethylamine and then 1.7 g of ethylene glycol di(1-chloroethyl) ether were added. Reaction was carried out for 30 minutes under ice cooling, 23.2 g of 1-chloroethyl ethyl ether was added, and reaction was carried out for a further 2 hours at room temperature. To this, 10.2 g of potassium carbonate and then 6.7 g of tert-butyl chloroacetate were added and reaction was carried out for 6 hours at 60° C. After the reaction mixture was allowed to cool down to room temperature, 500 g of ethyl acetate and 300 g of water were added thereto, followed by separation. The ethyl acetate layer was washed twice with 300 g of water and then concentrated in vacuum. The residue was dissolved in 300 g of methanol and added dropwise to 20 liters of water whereupon a powdery solid precipitated. The solid was collected by filtration, washed with 20 liters of water, and dried in vacuum at 40° C. for 24 hours. On $^1$H-NMR analysis, it was identified to be a polymer (Polym. 14) in which 24.0 mol % of the hydrogen atoms of hydroxyl groups in polyhydroxystyrene were replaced by 1-ethoxyethyl groups, 5.0 mol % were replaced by tert-butoxycarbonylmethyl groups, and the carboxyl group moieties which had been introduced in an amount of 2.0 mol % formed ester bonds with alcoholic hydroxyl groups of ethylene glycol di(1-hydroxyethyl) ether to provide crosslinking.

The thus obtained polymers had structures as shown by the following rational formulae, with percent substitutions shown in Table 1. In the following formulae, R' represents a group providing intermolecular or intramolecular crosslinking of units and (R') represents the attachment of the crosslinking group R'.

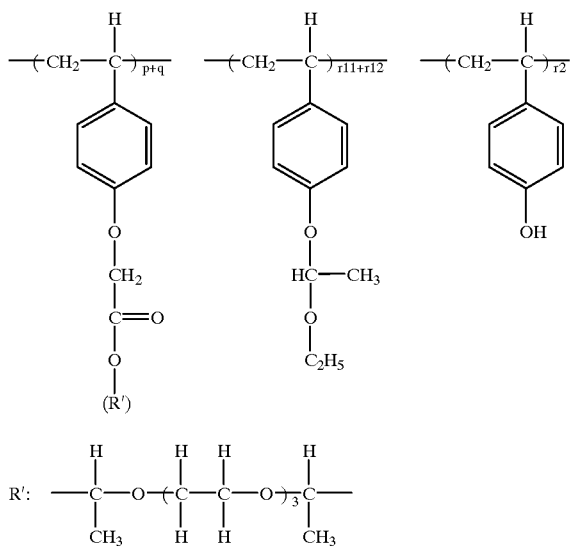

-continued
Polym.2
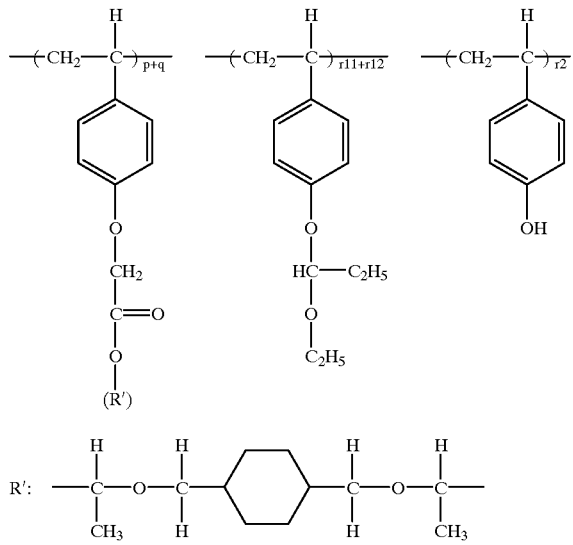
Polym.3
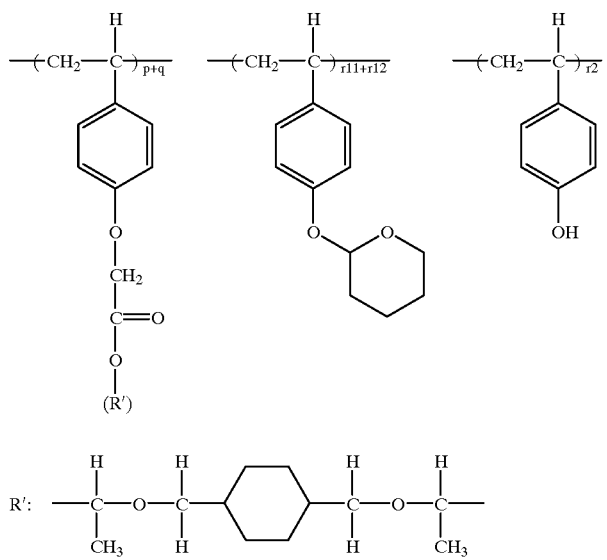
Polym.4
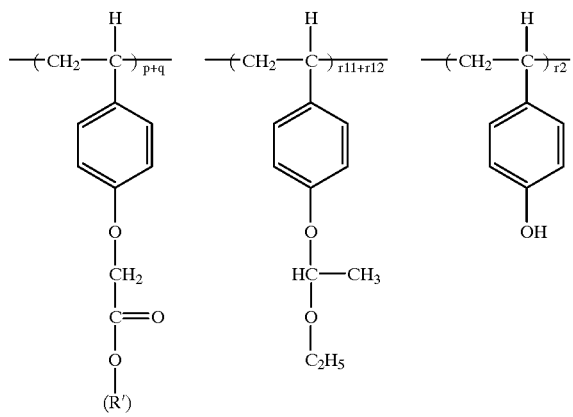

-continued
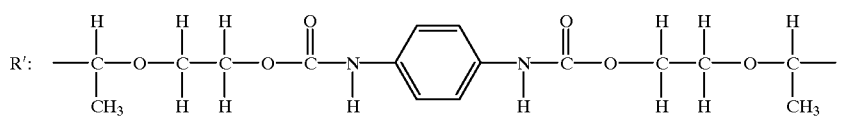
Polym.5
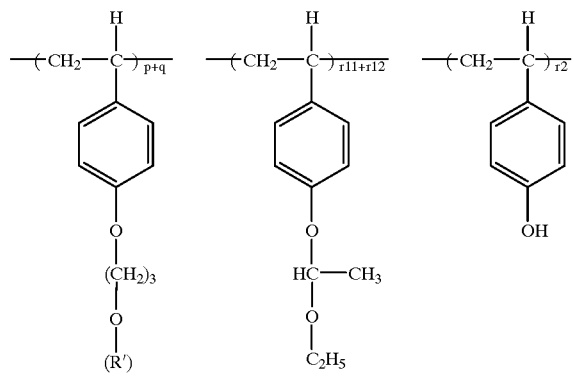
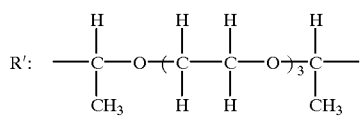
Polym.6
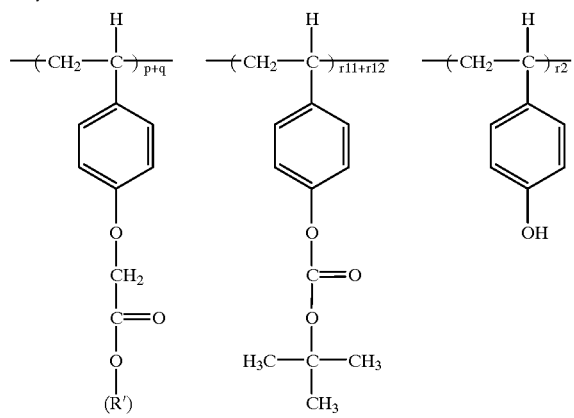
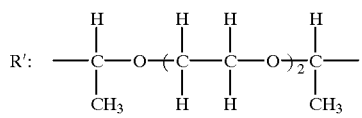
Polym.7
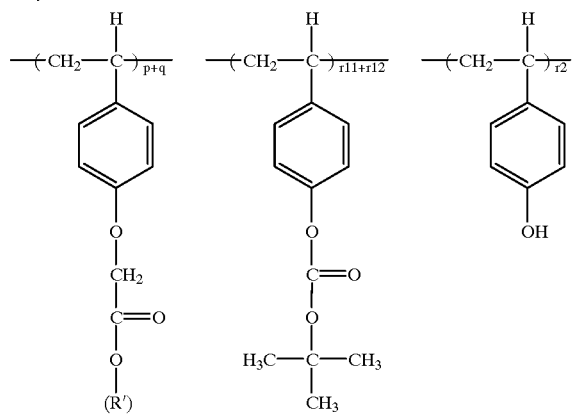

-continued
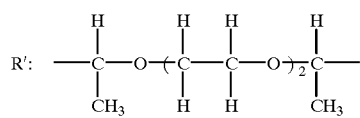
Polym.8
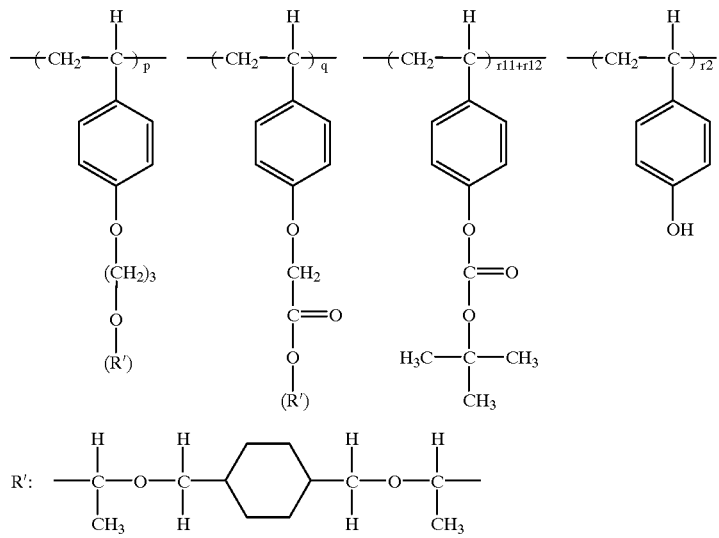
Polym.9
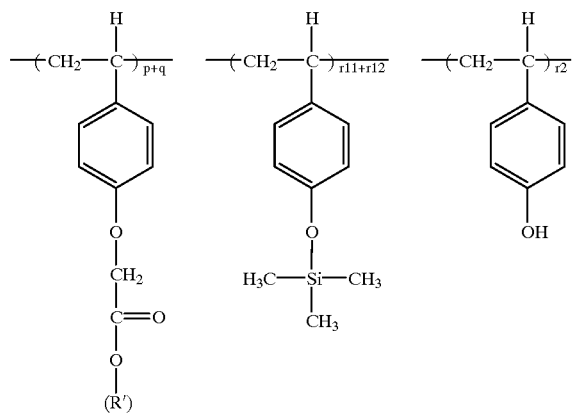
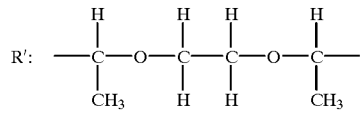
Polym.10
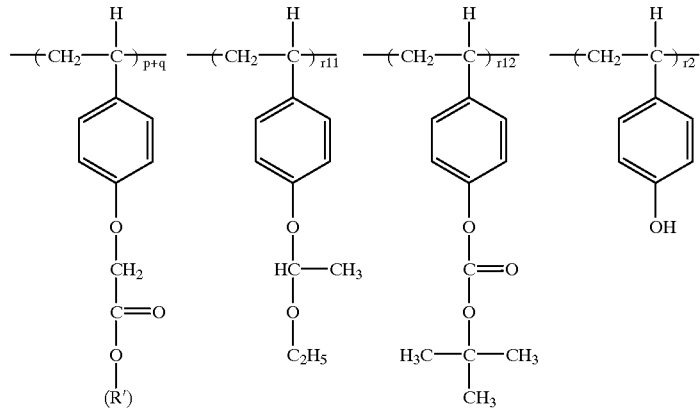

-continued
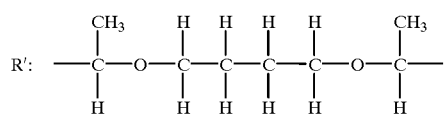
Polym.11
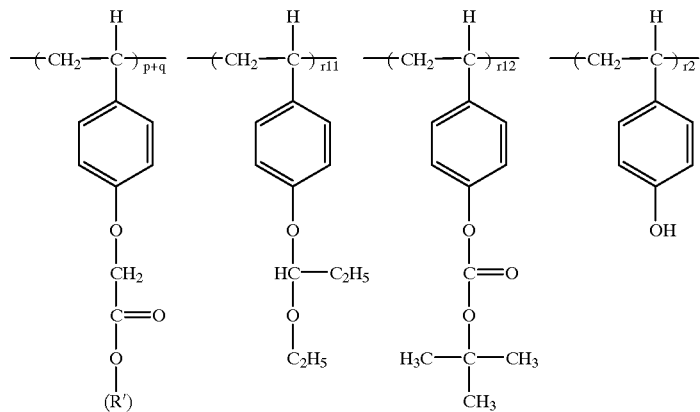
Polym.12
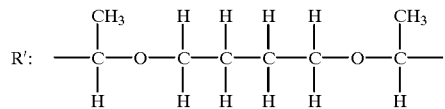
Polym.13
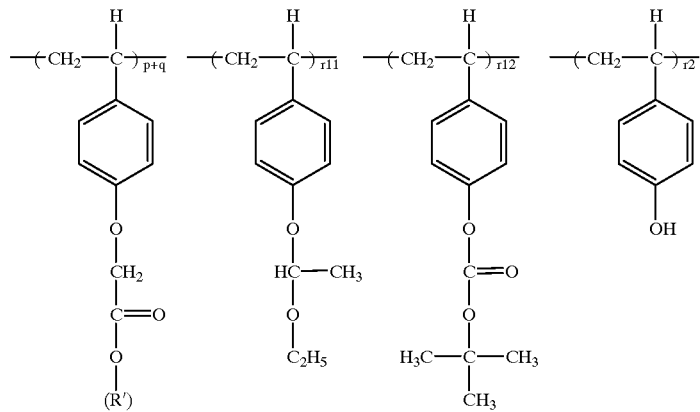

-continued

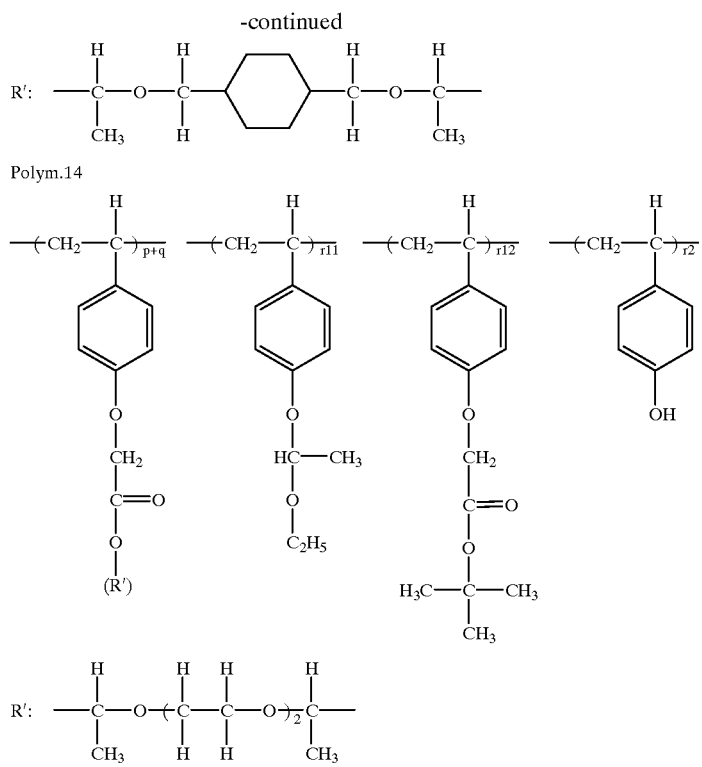

Polym.14

TABLE 1

Inventive polymers

| Synthesis Example | Polymer | Compositional ratio (molar ratio) | | | | Mw of PHS | Mw/Mn of PHS | Mw of polymer |
|---|---|---|---|---|---|---|---|---|
| | | p + q | r11 | r12 | r2 | | | |
| 1 | Polym.1 | 0.02 | | 0.31 | 0.67 | 11,000 | 1.05 | 26,000 |
| 2 | Polym.2 | 0.02 | | 0.26 | 0.72 | 11,000 | 1.05 | 26,000 |
| 3 | Polym.3 | 0.02 | | 0.24 | 0.74 | 11,000 | 1.05 | 25,000 |
| 4 | Polym.4 | 0.02 | | 0.31 | 0.67 | 11,000 | 1.05 | 26,000 |
| 5 | Polym.5 | 0.02 | | 0.31 | 0.67 | 11,000 | 1.05 | 26,000 |
| 6 | Polym.6 | 0.02 | | 0.18 | 0.80 | 11,000 | 1.05 | 25,000 |
| 7 | Polym.7 | 0.02 | | 0.18 | 0.80 | 11,000 | 1.05 | 25,000 |
| 8 | Polym.8 | 0.02 | | 0.18 | 0.80 | 11,000 | 1.05 | 25,000 |
| 9 | Polym.9 | 0.02 | | 0.25 | 0.73 | 11,000 | 1.05 | 25,000 |
| 10 | Polym.10 | 0.02 | 0.24 | 0.07 | 0.67 | 11,000 | 1.05 | 27,000 |
| 11 | Polym.11 | 0.02 | 0.21 | 0.05 | 0.72 | 11,000 | 1.05 | 27,000 |
| 12 | Polym.12 | 0.02 | 0.24 | 0.07 | 0.67 | 11,000 | 1.05 | 27,000 |
| 13 | Polym.13 | 0.02 | 0.24 | 0.07 | 0.67 | 11,000 | 1.05 | 27,000 |
| 14 | Polym.14 | 0.02 | 0.24 | 0.05 | 0.69 | 11,000 | 1.05 | 26,000 |

Examples 1–23 & Comparative Example 1–4

Liquid resist compositions were prepared by dissolving a polymer designated (Polym. 1 to Polym. 14) as a base resin, a photoacid generator designated PAG. 1 to PAG. 15, a dissolution regulator designated DRR. 1 to DRR. 4, a basic compound as shown in Tables 3 and 4, an aromatic compound having a group ≡C—COOH within a molecule designated ACC. 1 or ACC.2, and a UV absorber designated DYE. 1 or DYE. 2 in a solvent in accordance with the formulation shown in Tables 3 and 4. If necessary, 0.1 part of a surfactant Florade FC-430 by Sumitomo 3M K.K. was added for facilitating film formation.

For comparison purposes, liquid resist compositions were similarly prepared in accordance with the formulation shown in Table 5 using as the base resin polymers of rational formulae (Polym. 15) to (Polym. 18) whose composition and molecular weight are shown in Table 2.

Each of the compositions was passed through a 0.1-μm Telflon® filter. The liquid resist composition was then spin coated onto a silicon wafer to a dry thickness of 0.7 μm. With the silicon wafer rested on a hot plate at 100° C., the coating was pre-baked for 90 seconds. The film was exposed to light by means of an excimer laser stepper model NSR-2005EX (manufactured by Nikon K.K., numerical aperture NA=0.5) through a mask having a desired pattern, baked at 110° C. for 90 seconds, and developed with an aqueous solution of 2.38% tetramethylammonium hydroxide, obtaining a positive pattern.

The resulting resist pattern was evaluated as follows. First, a sensitivity (Eth value) was determined. Provided that the exposure dose with which the top and bottom of a 0.24-μm line-and-space pattern were resolved at 1:1 was the optimum exposure dose (sensitivity Eop), the minimum line width of a line-and-space pattern which was recognized separate at this exposure dose was the resolution of a test resist. The resolution was also determined under the same conditions except that the post-exposure delay (PED) time from exposure to heat treatment was 2 hours. The profile of the resist pattern resolved was observed under a scanning electron microscope.

In a heat resistance test, each resist pattern was heated on a hot plate at 130° C. for 10 minutes to observe any change of pattern shape before and after heating. The resist pattern was rated "O" (passed) for no change of pattern shape before and after heating and "X" (rejected) when the pattern was degraded by sagging after heating.

Tables 3 to 5 show the formulation of resist compositions. The test results of Examples and Comparative Examples are shown in Tables 6 and 7, respectively.

(PAG.1)

(PAG.2)

(PAG.3)

(PAG.4)

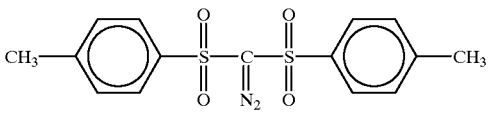

(PAG.5)

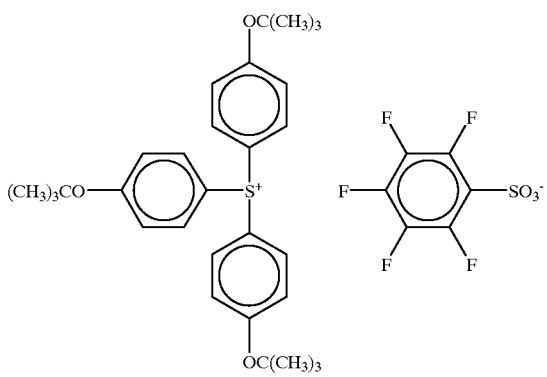

(PAG.6)

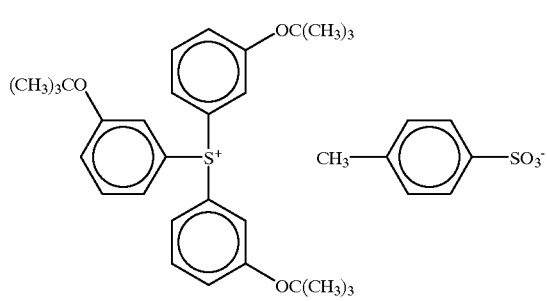

(PAG.7)

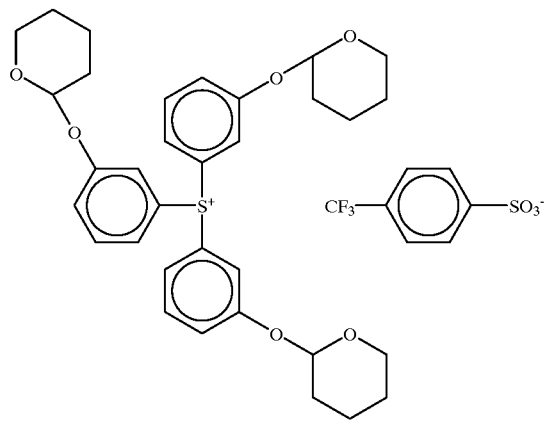

(PAG.8)
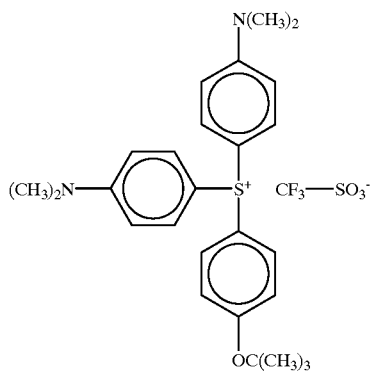
(PAG.9)
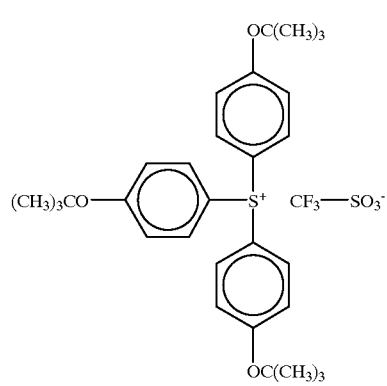
(PAG.10)
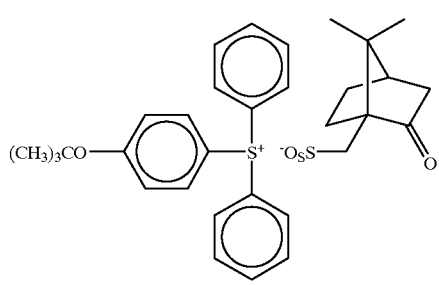
(PAG.11)
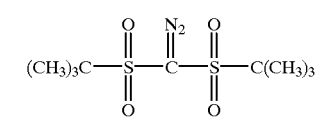
(PAG.12)
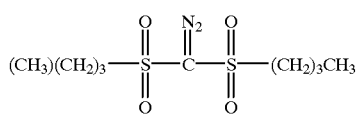
(PAG.13)
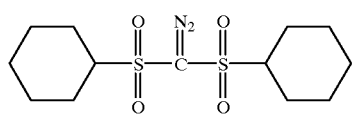
(PAG.14)
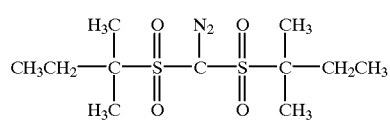
(PAG.15)
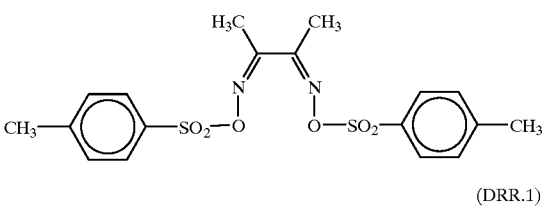
(DRR.1)
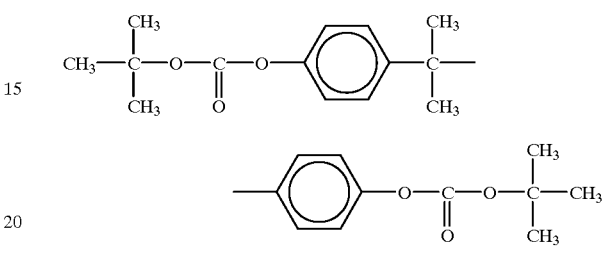
(DRR.2)
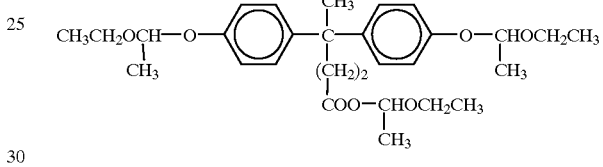
(DRR.3)
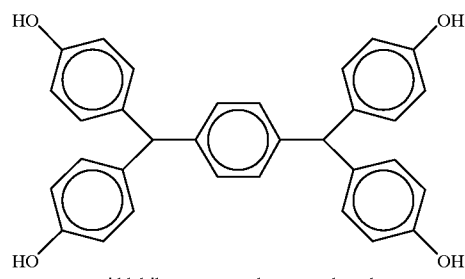
acid labile group: tert-butoxycarbonyl
average substitution: 50%
(DRR.4)
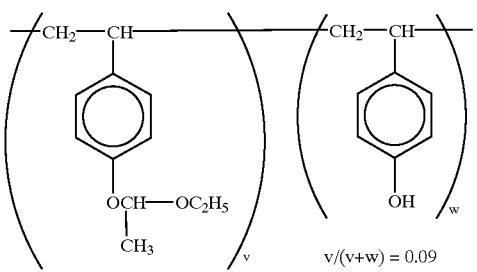
v/(v+w) = 0.09
Mw 3,000
ACC.1
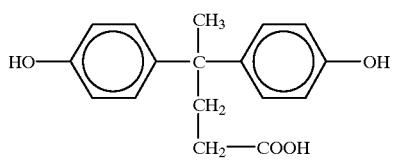

ACC.2
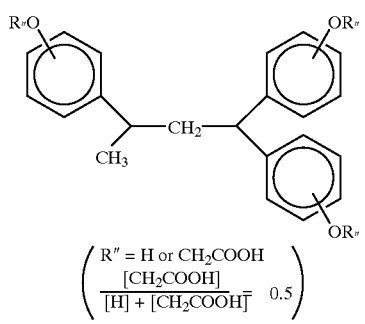
DYE.1
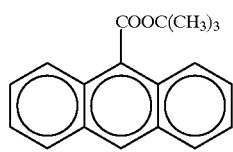
DYE.2
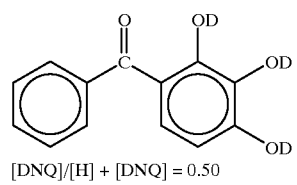
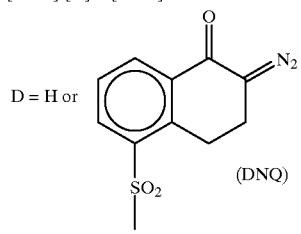
Polym.15
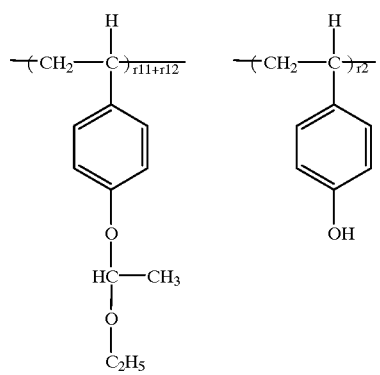
Polym.16
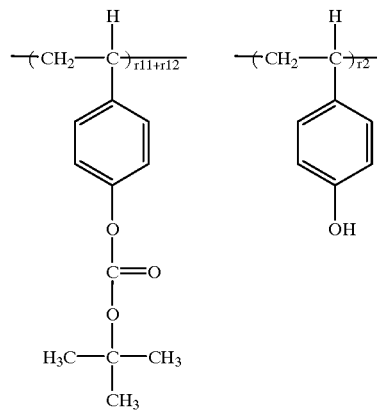
Polym.17
Polym.18
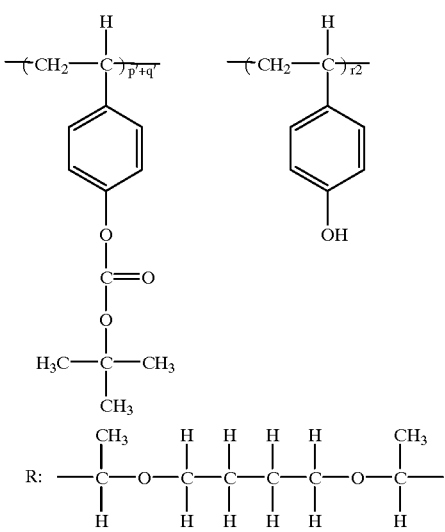

TABLE 2

Comparative polymers

| Polymer | Compositional ratio (molar ratio) | | | | Mw of PHS | Mw/Mn of PHS | Mw of polymer |
|---|---|---|---|---|---|---|---|
| | p' + q' | r11 | r12 | r2 | | | |
| Polym.15 | 0 | | 0.35 | 0.65 | 11,000 | 1.05 | 13,000 |
| Polym.16 | 0 | | 0.20 | 0.80 | 11,000 | 1.05 | 13,000 |
| Polym.17 | 0 | 0.24 | 0.08 | 0.68 | 11,000 | 1.05 | 13,000 |
| Polym.18 | 0.02 | | 0 | 0.98 | 11,000 | 1.05 | 22,000 |

TABLE 3

Resist composition (pbw in parentheses)

| No. | Base resin | Photoacid generator | Dissolution regulator | Basic compound | Other additive | Organic solvent |
|---|---|---|---|---|---|---|
| E1 | Polym.1 (80) | PAG.1 (3) | — | — | — | PGMEA (530) |
| E2 | Polym.1 (80) | PAG.7 (1) PAG.9 (2) | DRR.2 (8) | N-methylpyrrolidone (0.1) | — | EL/BA (510) |
| E3 | Polym.2 (80) | PAG.1 (1) PAG.11 (2) | — | triethanolamine (0.1) piperidine ethanol (0.05) | ACC.1 (0.2) | PGMEA (530) |
| E4 | Polym.3 (80) | PAG.1 (1) PAG.8 (2) | DRR.3 (16) | quinoline (0.06) | — | PGMEA/ EL (580) |
| E5 | Polym.4 (80) | PAG.7 (1) PAG.9 (2) | DRR.2 (8) | N-methylpyrrolidone (0.1) | — | EL/BA (510) |
| E6 | Polym.5 (80) | PAG.7 (1) PAG.9 (2) | DRR.2 (8) | N-methylpyrrolidone (0.1) | — | EL/BA (510) |
| E7 | Polym.6 (80) | PAG.2 (3) | DRR.1 (8) | — | — | PGMEA (530) |
| E8 | Polym.7 (80) | PAG.2 (3) | DRR.1 (8) | — | — | PGMEA (530) |
| E9 | Polym.8 (80) | PAG.2 (3) | DRR.1 (8) | — | — | PGMEA (530) |
| E10 | Polym.9 (80) | PAG.6 (3) | DRR.1 (8) | tetramethylethylene-diamine (0.1) | — | PGMEA (530) |
| E11 | Polym.10 (80) | PAG.8 (3) | — | — | — | PGMEA (530) |
| E12 | Polym.11 (80) | PAG.1 (1) PAG.12 (2) | — | triethanolamine (0.1) 1,8-diazabicyclo-undecene (0.1) | ACC.1 (0.5) | PGMEA (530) |
| E13 | Polym.12 (80) | PAG.8 (3) | — | — | — | PGMEA (530) |

TABLE 4

Resist composition (pbw in parentheses)

| No. | Base resin | Photoacid generator | Dissolution regulator | Basic compound | Other additive | Organic solvent |
|---|---|---|---|---|---|---|
| E14 | Polym.13 (80) | PAG.8 (3) | — | — | — | PGMEA (530) |
| E15 | Polym.14 (80) | PAG.5 (3) | — | triethanolamine (0.1) | ACC.2 (0.2) | PGMEA (530) |
| E16 | Polym.1 (50) Polym.5 (30) | PAG.1 (4) | — | tributylamine (0.03) N,N-dimethylacetamide (5.0) | — | PGMEA (530) |
| E17 | Polym.1 (50) Polym.5 (30) | PAG.10 (4) | DRR.2 (4) | 2-hydroxypyridine (0.11) | ACC.2 (2) | PGMEA (530) |
| E18 | Polym.2 (80) | PAG.1 (1) PAG.12 (2) | — | TMMEA (0.05) | DYE.1 (1.2) | PGMEA (530) |
| E19 | Polym.11 (80) | PAG.1 (1) PAG.13 (2) | — | TMEEA (0.05) | DYE.2 (4) | PGMEA (530) |
| E20 | Polym.1 (80) | PAG.1 (1) PAG.14 (2) | — | TMEMEA (0.05) | DYE.1 (1.2) ACC.1 (0.2) | PGMEA (530) |
| E21 | Polym.10 (80) | PAG.1 (1) PAG.15 (2) | — | TMEMEA (0.05) | DYE.2 (4) ACC.1 (0.2) | PGMEA (530) |
| E22 | Polym.1 (80) | PAG.1 (2) | DRR.1 (4) DRR.3 (4) | N-methylpyrrolidone (0.05) | — | PGMEA/ EL (530) |
| E23 | Polym.1 (80) | PAG.1 (2) | DRR.2 (4) DRR.4 (4) | N-methylpyrrolidone (0.05) | — | PGMEA/ CH (530) |

TABLE 5

Resist composition (pbw in parentheses)

| No. | Base resin | Photoacid generator | Dissolution regulator | Basic compound | Other additive | Organic solvent |
|---|---|---|---|---|---|---|
| CE1 | Polym.15 (80) | PAG.1 (2) | — | N-methylpyrrolidone (0.05) | — | PGMEA (530) |
| CE2 | Polym.16 (80) | PAG.1 (2) | — | N-methylpyrrolidone (0.05) | — | PGMEA (530) |
| CE3 | Polym.17 (80) | PAG.1 (2) | — | N-methylpyrrolidone (0.05) | — | PGMEA (530) |
| CE4 | Polym.18 (80) | PAG.1 (2) | — | N-methylpyrrolidone (0.05) | — | PGMEA (530) |

Note: The abbreviations in these Tables have the following meaning.
PGMEA: propylene glycol monomethyl ether acetate
EL/BA: a 85%/15% by weight mixture of ethyl lactate and butyl acetate
PGMEA/EL: a 70%/30% by weight mixture of propylene glycol monomethyl ether acetate and ethyl lactate
PGMEA/CH: a 90%/10% by weight mixture of propylene glycol monomethyl ether acetate and cyclohexanone
TMMEA: tris{(2-methoxymethoxy)ethyl}amine
TMEEA: tris{2-(2-methoxyethoxy)ethyl}amine
TMEMEA: tris[2-{(2-methoxyethoxy)methoxy}ethyl]amine

TABLE 6

| Example | Sensitivity Eop (mJ/cm²) | Resolution(μm) Instant | Resolution(μm) PED 2 hr. | Profile Instant/PED 2 hr. | Heat resistance |
|---|---|---|---|---|---|
| 1 | 6 | 0.2 | 0.2 | rectangular | ○ |
| 2 | 26 | 0.18 | 0.18 | rectangular | ○ |
| 3 | 31 | 0.18 | 0.18 | rectangular | ○ |
| 4 | 18 | 0.18 | 0.18 | rectangular | ○ |
| 5 | 26 | 0.18 | 0.18 | rectangular | ○ |
| 6 | 26 | 0.18 | 0.18 | rectangular | ○ |
| 7 | 8 | 0.2 | 0.2 | rectangular | ○ |
| 8 | 8 | 0.2 | 0.2 | rectangular | ○ |
| 9 | 8 | 0.2 | 0.2 | rectangular | ○ |
| 10 | 25 | 0.18 | 0.18 | rectangular | ○ |
| 11 | 7 | 0.2 | 0.2 | rectangular | ○ |
| 12 | 30 | 0.18 | 0.18 | rectangular | ○ |
| 13 | 7 | 0.2 | 0.2 | rectangular | ○ |
| 14 | 7 | 0.2 | 0.2 | rectangular | ○ |
| 15 | 30 | 0.18 | 0.18 | rectangular | ○ |
| 16 | 24 | 0.18 | 0.18 | rectangular | ○ |
| 17 | 25 | 0.18 | 0.18 | rectangular | ○ |
| 18 | 23 | 0.2 | 0.2 | sl. forward tapered | ○ |
| 19 | 24 | 0.2 | 0.2 | sl. forward tapered | ○ |
| 20 | 23 | 0.2 | 0.2 | sl. forward tapered | ○ |
| 21 | 24 | 0.2 | 0.2 | sl. forward tapered | ○ |
| 22 | 19 | 0.18 | 0.18 | rectangular | ○ |
| 23 | 20 | 0.18 | 0.18 | rectangular | ○ |

TABLE 7

| Comparative Example | Sensitivity Eop (mJ/cm²) | Resolution(μm) Instant | Resolution(μm) PED 2 hr. | Profile Instant/PED 2 hr. | Heat resistance |
|---|---|---|---|---|---|
| 1 | 20 | 0.22 | 0.2 | rectangular/ reverse tapered | X |
| 2 | 22 | 0.22 | not resolved | rectangular/ not resolved | X |
| 3 | 21 | 0.22 | 0.26 | rectangular/ T-top | X |
| 4 | 15 | 0.24 | 0.2 | rectangular/ reverse tapered | ○ |

Additionally, an acetylene alcohol derivative, Surfynol E1004 (Nisshin Chemical Industry K.K.) of the structural formula shown below was added to the resist compositions of Examples 18, 19, 20 and 21 in an amount of 0.05% by weight of the composition. The Surfynol-containing compositions and Surfynol-free composition were allowed to stand and observed whether or not particles (foreign matter) increased as a rating of storage stability. The test was an accelerated test of storage at 40° C. for 4 months. Using a counter KL-20A (Rion K.K.) for counting the number of particles in liquid, particles having a particle size of more than 0.3 μm were monitored. The results are shown in Table 8.

Surfynol E1004

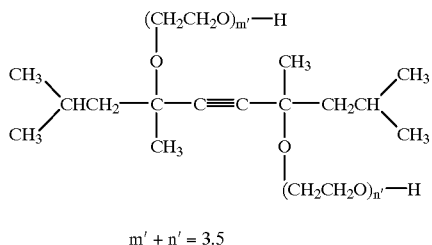

$m' + n' = 3.5$

TABLE 8

| | Count of particles per ml | | |
|---|---|---|---|
| | As filtered | Surfynol-free After 4 months | Surfynol added After 4 months |
| Example 18 | 4 | 18 | 4 |
| Example 19 | 4 | 19 | 5 |
| Example 20 | 8 | 27 | 10 |
| Example 21 | 7 | 29 | 10 |

Although some preferred embodiments have been described, many modifications and variations may be made thereto in the light of the above teachings. It is therefore to be understood that within the scope of the appended claims, the invention may be practiced otherwise than as specifically described.

We claim:

1. A polymer comprising recurring units of the following general formula (1),

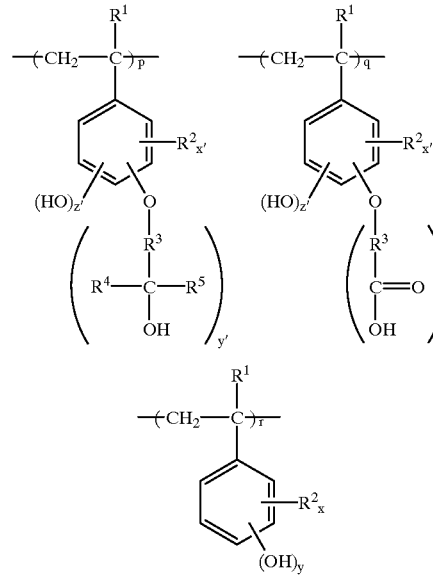

(1)

wherein $R^1$ is hydrogen or methyl, $R^2$ is a normal, branched or cyclic alkyl group of 1 to 8 carbon atoms, $R^3$ is a divalent hydrocarbon group of 1 to 18 carbon atoms which may have a hetero atom, each of $R^4$ and $R^5$ is hydrogen or a monovalent hydrocarbon group of 1 to 18 carbon atoms which may have a hetero atom, letter x is 0 or a positive integer, y is a positive integer, the sum of x+y is up to 5, each of x' and z' is 0 or a positive integer, y' is a positive integer, the sum of x'+y'+z' is up to 5, each of p and q is 0 or a positive number, r is a positive number, p and q are not equal to 0 at the same time, satisfying $0 \leq p \leq 0.4$, $0 \leq q \leq 0.4$, $0.01 \leq p+q \leq 0.8$, and p+q+r=1,

- the hydrogen atoms of some of phenolic hydroxyl groups and/or alcoholic hydroxyl groups and/or carboxyl groups being replaced by acid labile groups,
- the polymer being crosslinked within a molecule and/or between molecules with a crosslinking group having a C—O—C linkage resulting from reaction of some of the remaining alcoholic hydroxyl groups and/or carboxyl groups with an alkenyl ether compound or halogenated alkyl ether compound,
- the amount of the acid labile group and the crosslinking group combined being on the average from more that 0 mol % to 80 mol % of the entirety of the phenolic hydroxyl group, alcoholic hydroxyl group and carboxyl group in formula (1),
- the polymer having a weight average molecular weight of 1,000 to 500,000.

2. The polymer of claim 1 comprising recurring units of the following general formula (2),

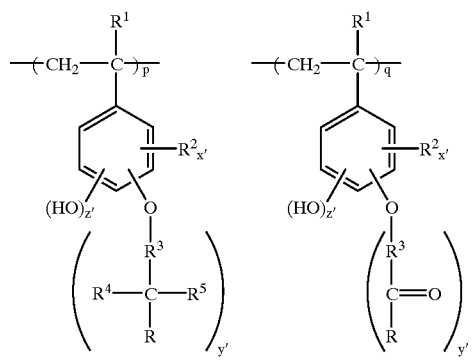
(2)

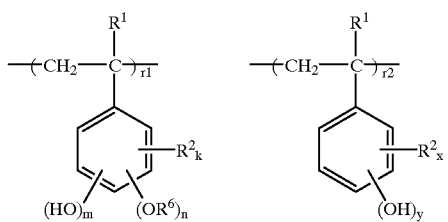

wherein R is hydroxyl group or $OR^6$, at least one of R groups is a hydroxyl group, $R^1$ is hydrogen or methyl, $R^2$ is a normal, branched or cyclic alkyl group of 1 to 8 carbon atoms, $R^3$ is a divalent hydrocarbon group of 1 to 18 carbon atoms which may have a hetero atom, each of $R^4$ and $R^5$ is hydrogen or a monovalent hydrocarbon group of 1 to 18 carbon atoms which may have a hetero atom, $R^6$ is an acid labile group, letter x is 0 or a positive integer, y is a positive integer, the sum of x+y is up to 5, each of x' and z' is 0 or a positive integer, y' is a positive integer, the sum of x'+y'+z' is up to 5, each of k and m is 0 or a positive integer, n is a positive integer the sum of k+m+n is up to 5, each of p and q is 0 or a positive number, r1 and r2 are positive numbers, p and q are not equal to 0 at the same time, satisfying $0 \leq p \leq 0.4$, $0 \leq q \leq 0.4$, $0.01 \leq p+q \leq 0.8$, $0 \leq r1/(r1+r2) \leq 0.8$, and p+q+r1+r2=1.

3. The polymer of claim 2 comprising recurring units of the following general formula (3),

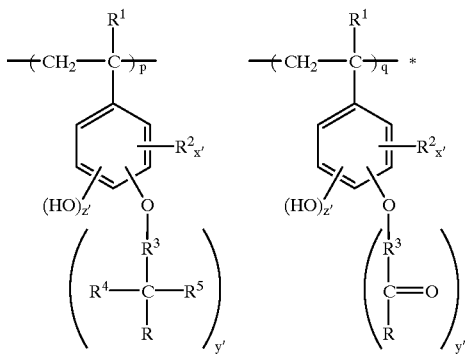
(3)

-continued

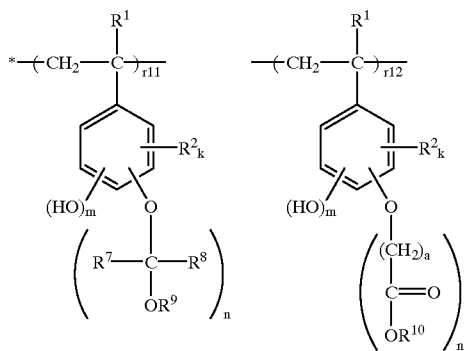

wherein R is hydroxyl group or $OR^6$, at least one of R groups is a hydroxyl group, $R^1$ is hydrogen or methyl, $R^2$ is a normal, branched or cyclic alkyl group of 1 to 8 carbon atoms, $R^3$ is a divalent hydrocarbon group of 1 to 18 carbon atoms which may have a hetero atom, each of $R^4$ and $R^5$ is hydrogen or a monovalent hydrocarbon group of 1 to 18 carbon atoms which may have a hetero atom, $R^6$ is an acid labile group, each of $R^7$ and $R^8$ is a normal or branched alkylene group of 1 to 8 carbon atoms, $R^9$ is a monovalent hydrocarbon group of 1 to 18 carbon atoms which may have a heteroatom, or $R^7$ and $R^8$, $R^7$ and $R^9$, taken together may form a ring, with the proviso that each of $R^7$, $R^8$ and $R^9$ is a normal or branched alkylene group of 1 to 18 carbon atoms when they form a ring, $R^{10}$ is a tertiary alkyl group of 4 to 20 carbon atoms, a trialkylsilyl group whose alkyl groups each have 1 to 6 carbon atoms, an oxoalkyl group of 4 to 20 carbon atoms, a trialkylsilyl group whose alyl groups each have 1 to 6 carbon atoms, an oxoalkyl group of 4 to 20 carbon atoms, or a group $—CR^7R^8OR^9$, letters p, q, r11 and r12 are 0 or positive numbers, r2 is a positive number p and q are not equal to 0 at the same time, r11 and r12 are not equal to 0 at the same time, satisfing $0 \leq p \leq 0.4$, $0 \leq q \leq 0.4$, $0.01 \leq p+q \leq 0.8$, $0 \leq (r11+r12)/(r11+r12+r2) \leq 0.8$, and $p+q+r11r12+r2=1$, a is 0 or an integer of 1 to 6, x, y, x', y', z', k, m and n are as defined above, wherein at least a portion of hydrogen atoms are eliminated from alcoholic hydroxyl groups and/or carboxyl groups represented by R to leave oxygen atoms which are crosslinked with a crosslinking group having a C—O—C linkage of the following general formula (4a) or (4b) within a molecule and/or between molecules, (4a)

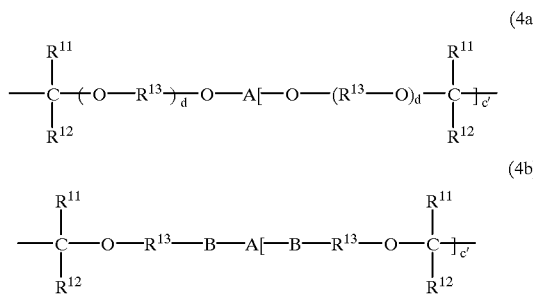

(4b)

wherein each of $R^{11}$ and $R^{12}$ is hydrogen or a normal, branched or cyclic alkyl group of 1 to 8 carbon atoms, or $R^{11}$ and $R^{12}$, taken together, may form a ring, with the proviso that each of $R^{11}$ and $R^{12}$ is a normal or branched alkylene group of 1 to 8 carbon atoms when they form a ring, $R^{13}$ is a normal, branched or cyclic alkylene group of 1 to 10 carbon atoms, letter d is 0 or an integer of 1 to 10, A is a c-valent aliphatic or alicyclic saturated hydrocarbon group, aromatic hydrocarbon group or heterocyclic group of 1 to 50 carbon atoms, which may have an intervening hetero atom and in which the hydrogen atom attached to a carbon atom may be partially replaced by a hydroxyl group, carboxyl group, acyl group or fluorine atom, B is —CO—O—, —NHCO—O— or —NHCONH—, letter c is an integer of 2 to 8, and c' is an integer of 1 to 7.

4. The polymer of claim 3 wherein the crosslinking group having a C—O—C linkage represented by the general formula (4a) or (4b) is represented by the following general formula (4a') or (4b'):

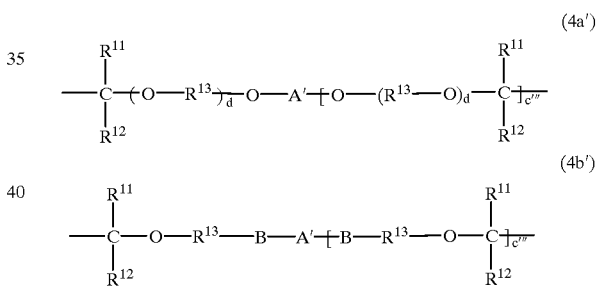

wherein each of $R^{11}$ and $R^{12}$ is hydrogen or a normal, branched or cyclic alkyl group of 1 to 8 carbon atoms, or $R^{11}$ and $R^{12}$, taken together, may form a ring, with the proviso that each of $R^{11}$ and $R^{12}$ is a normal or branched alkylene group of 1 to 8 carbon atoms when they form a ring, $R^{13}$ is a normal, branched or cyclic alkylene group of 1 to 10 carbon atoms, letter d is 0 or an integer of 1 to 5, A' is a c''-valent normal, branched or cyclic alkylene, alkyltriyl or alkyltetrayl group of 1 to 20 carbon atoms or an arylene group of 6 to 30 carbon atoms, which may have an intervening hetero atom and in which the hydrogen atom attached to a carbon atom may be partially replaced by a hydroxyl group, carboxyl group, acyl group or fluorine atom, B is —CO—O—, —NHCO—O— or —NHCONH—, letter c'' is an integer of 2 to 4, and c''' is an integer of 1 to 3.

5. A chemically amplified positive resist composition comprising (A) an organic solvent, (B) a base resin in the form of the polymer of claim 1, and (C) a photoacid generator.

6. The resist composition of claim 5 further comprising (D) an additional base resin in the form of a polymer comprising recurring units of the following general formula (1'),

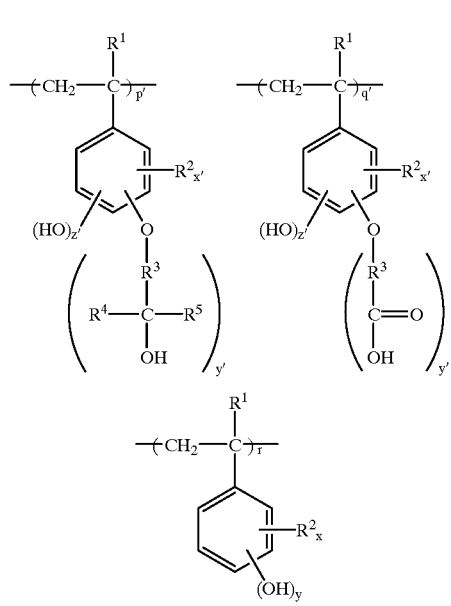

(1')

wherein $R^1$, $R^2$, $R^3$, $R^4$, $R^5$ x, y, x', y' and z' are as defined above, p' and q' are 0 or positive numbers, r is a positive number, p' and q' may be equal to 0 at the same time, satisfying $0 \leq p' \leq 0.4$, $0 \leq q' \leq 0.4$, $0 \leq p'+q' \leq 0.8$, and $p'+q'+r=1$, the hydrogen atoms of some of phenolic hydroxyl group and/or alcoholic hydroxyl groups and/or carboxyl groups being replaced by acid labile groups in an average proportion of 0 mol % to 80 mol % of the entirety, said polymer having a weight average molecular weight of 3,000 to 300,000.

7. The resist composition of claim 5 further comprising (E) a dissolution regulator.

8. The resist composition of claim 5 further comprising (F) a basic compound.

9. The resist composition of claim 5 further comprising (G) an aromatic compound having a group: ≡C—COOH.

10. The resist composition of claim 5 further comprising (H) a UV absorber.

11. The resist composition of claim 5 further comprising (I) an acetylene alcohol derivative.

12. A method for forming a resist pattern comprising the steps of:

(i) applying a chemically amplified positive resist composition according to claims onto a substrate, (ii) heat treating a resultant coated film and then exposing it to actinic radiation having a wavelength of up to 300 nm or electron beams through a photomask, and (iii) optionally heat treating the exposed film and developing it with a developer.

13. The polymer of claim 1, wherein the acid labile group is a $C_{4-20}$-tertalkyl group, a tri-$C_{1-10}$-alkylsilyl group, a $C_{4-20}$-oxoalkyl group, or a group of formula (5) or (6):

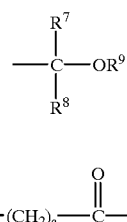

(5)

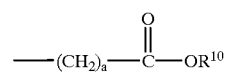

(6)

$R^7$ and $R^8$ each are a hydrogen atom or normal, branched or cyclic alkyl group having 1 to 8 carbon atoms, $R^9$ is a monovalent hydrocarbon group of 1 to 18 carbon atoms, which may have a hetero atom, $R^7$ and $R^8$, $R^7$ and $R^9$, or $R^8$ and $R^9$, taken together, may form a ring, with the proviso that $R^7$, $R^8$, and $R^9$ each are a normal or branched alkylene group having 1 to 18 carbon atoms when they form a ring, $R^{10}$ is a tertiary alkyl group having 4 to 20 carbon atoms, a trialkylsilyl group whose alkyl groups each have 1 to 6 atoms, an oxoalkyl group of 4 to 20 carbon atoms, or a group of formula (5), and a is an integer of 0 to 6.

* * * * *